US012793933B2

(12) United States Patent
Mangnus

(10) Patent No.: US 12,793,933 B2
(45) Date of Patent: Nov. 10, 2026

(54) CHARGED PARTICLE OPTICAL DEVICE, OBJECTIVE LENS ASSEMBLY, DETECTOR, DETECTOR ARRAY, AND METHODS

(71) Applicant: ASML Netherlands B.V., Veldhoven (NL)

(72) Inventor: Albertus Victor Gerardus Mangnus, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 339 days.

(21) Appl. No.: 18/513,481

(22) Filed: Nov. 17, 2023

(65) Prior Publication Data

US 2024/0087844 A1 Mar. 14, 2024

Related U.S. Application Data

(63) Continuation of application No. PCT/EP2022/060460, filed on Apr. 20, 2022.

(51) Int. Cl.
*H01J 37/244* (2006.01)
*H01J 37/147* (2006.01)

(52) U.S. Cl.
CPC ........ *H01J 37/244* (2013.01); *H01J 37/1471* (2013.01)

(58) Field of Classification Search
CPC ............................ H01J 37/244; H01J 37/1471
See application file for complete search history.

(56) References Cited

U.S. PATENT DOCUMENTS

| | | | |
|---|---|---|---|
| 11,054,753 | B1 | 7/2021 | Kaplan et al. |
| 2009/0321634 | A1 | 12/2009 | Khursheed |
| 2019/0259564 | A1 | 8/2019 | Kruit et al. |
| 2019/0259570 | A1 | 8/2019 | Kruit et al. |
| 2019/0362928 | A1 | 11/2019 | Inoue et al. |
| 2020/0321191 | A1 | 10/2020 | Ren et al. |
| 2021/0210309 | A1 | 7/2021 | Wieland |
| 2022/0196581 | A1 | 6/2022 | Wieland et al. |

FOREIGN PATENT DOCUMENTS

| | | | |
|---|---|---|---|
| CN | 103650097 | A | 3/2014 |
| CN | 105161393 | A | 12/2015 |
| TW | 201917767 | A | 5/2019 |
| TW | 202046366 | A | 12/2020 |
| TW | 202117784 | A | 5/2021 |
| WO | WO 2012/165955 | A2 | 12/2012 |
| WO | WO 2020/135963 | A1 | 7/2020 |

OTHER PUBLICATIONS

International Search Report dated Aug. 10, 2022, for corresponding International Application No. PCT/EP2022/060460 (2 pages).

*Primary Examiner* — Georgia Y Epps
*Assistant Examiner* — Hanway Chang
(74) *Attorney, Agent, or Firm* — Finnegan, Henderson, Farabow, Garrett & Dunner LLP

(57) ABSTRACT

The disclosed embodiments provide a various techniques for detecting secondary charged particles and backscatter charged particles, including accelerating charged particle sub-beams along sub-beam paths to a sample, repelling secondary charged particles from detector arrays, using mirror detector arrays, using multiple detector arrays, and providing devices and detectors which can switch between modes for primarily detecting charged particles and modes for primarily detecting secondary particles.

20 Claims, 16 Drawing Sheets

CHARGED PARTICLE OPTICAL DEVICE, OBJECTIVE LENS ASSEMBLY, DETECTOR, DETECTOR ARRAY, AND METHODS

CROSS-REFERENCE TO RELATED APPLICATIONS

This application claims priority of International application PCT/EP2022/060460, filed on 20 Apr. 2022, which claims priority of EP application 21174519.5, filed on 18 May 2021. These applications are incorporated herein by reference in their entireties.

FIELD

The embodiments provided herein generally relate to objective lens assemblies, charged-particle-optical devices, detectors, detector arrays and methods, and particularly to objective lens assemblies, charged-particle-optical devices, a detector, a detector array and methods that use multiple beams (e.g. sub-beams) of charged particles.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain data which may be referred to as an image and which may be rendered into an image. The image representing characteristics of the material structure of the surface of the sample.

Although the images obtained in this way can be useful, there are limitations in the information obtained about the sample from such known electron microscopy techniques. In general, there is a need to obtain additional or alternative information, for example, relating to structures below the surface of the sample and relating to overlay targets.

SUMMARY

It is an object of the present disclosure to provide embodiments that support obtaining information from a sample using charged particles, for example, using backscattered charged particles.

According to some embodiments of the present disclosure, there is provided a charged particle-optical device for a charged particle system, the device being configured to project an array of beams of charged particles along primary beam paths towards a sample, the device comprising: an objective lens array configured to project the beams onto a sample and comprising at least two electrodes along primary beam paths of an array of beams of charged particles; an up-beam array of detectors positioned up-beam of the at least one electrode along the primary beam paths; a down-beam array of detectors positioned down-beam of the at least one electrode along the primary beam paths; at least one voltage supply configured to be electrically connected to one or more of the objective lens array, the up-beam array of detectors and the down-beam array of detectors; and a controller configured to control a potential applied by the at least one voltage supply to the at least one electrode of the objective lens array, the up-beam array of detectors and the down-beam array of detectors, wherein the up-beam array of detectors and the down-beam array of detectors are configured simultaneously to detect signal particles.

According to some embodiments of the present disclosure, there is provided a method of detecting charged particles emitted from a sample using a multi-beam charged particle assessment tool comprising the charged particle-optical device described herein.

BRIEF DESCRIPTION OF FIGURES

The above and other aspects of the present disclosure will become more apparent from the description of exemplary embodiments, taken in conjunction with the accompanying drawings.

Figure 1:
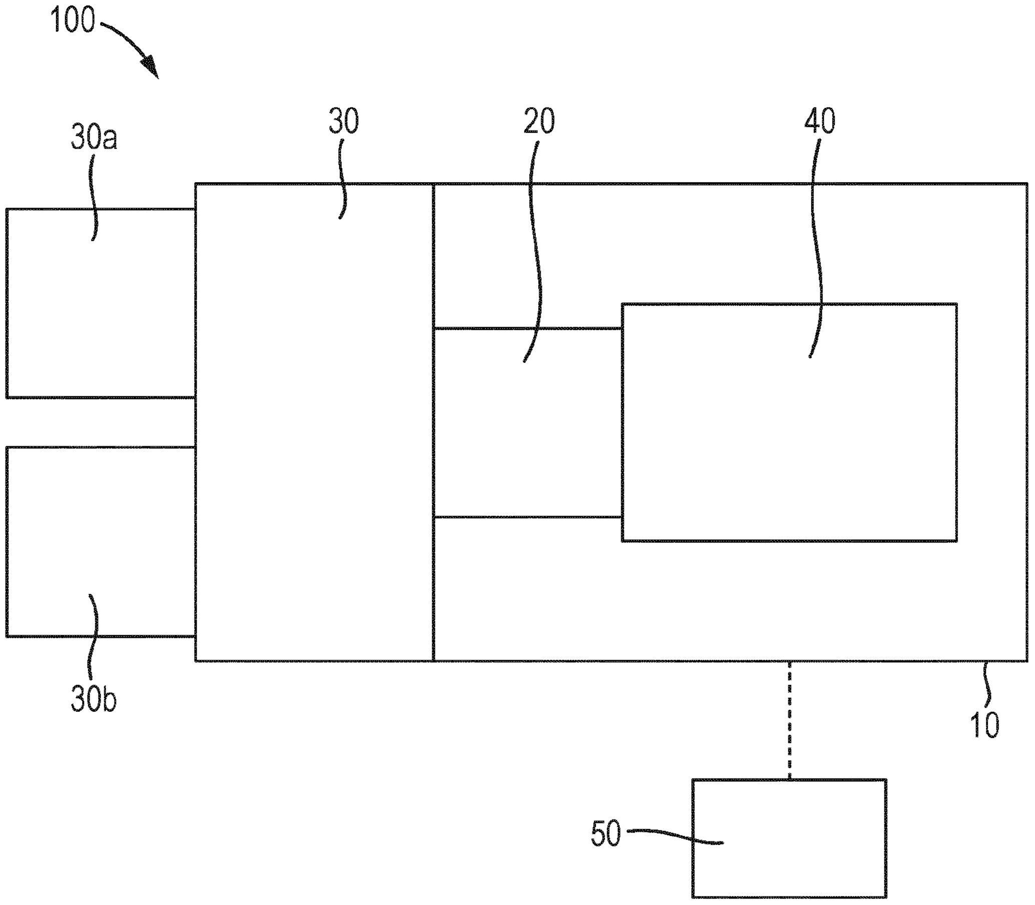
FIG. 1 is a schematic diagram illustrating an exemplary charged particle beam inspection apparatus.

The schematic diagrams and views show the components described below. However, the components depicted in the figures are not to scale.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one “killer defect” can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection tools (such as a Scanning Electron Microscope (‘SEM’)) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical system, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. The electron beam tool 40 is located within the main chamber 10.

The EFEM 30 includes a first loading port 30*a* and a second loading port 30*b*. The EFEM 30 may include additional loading port(s). The first loading port 30*a* and the second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as “samples” hereafter). One or more robot arms (not shown) in the EFEM 30 transport the samples to the load lock chamber 20.

The load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from the load lock chamber 20 to the main chamber 10. The main chamber 10 is connected to a main chamber vacuum pump system (not shown). The main chamber vacuum pump system removes gas particles in the main chamber 10 so that the pressure in around the sample reaches a second pressure lower than the first pressure. After reaching the second pressure, the sample is transported to the electron beam tool 40 by which it may be inspected. An electron beam tool 40 may comprise a multi-beam electron-optical apparatus.

The controller 50 is electronically connected to the electron beam tool 40. The controller 50 may be a processor (such as a computer) configured to control the charged particle beam inspection apparatus 100. The controller 50 may also include a processing circuitry configured to execute various signal and image processing functions. While the controller 50 is shown in FIG. 1 as being outside of the structure that includes the main chamber 10, the load lock chamber 20, and the EFEM 30, it is appreciated that the controller 50 may be part of the structure. The controller 50 may be located in one of the component elements of the charged particle beam inspection apparatus or it can be distributed over at least two of the component elements. While the present disclosure provides examples of the main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
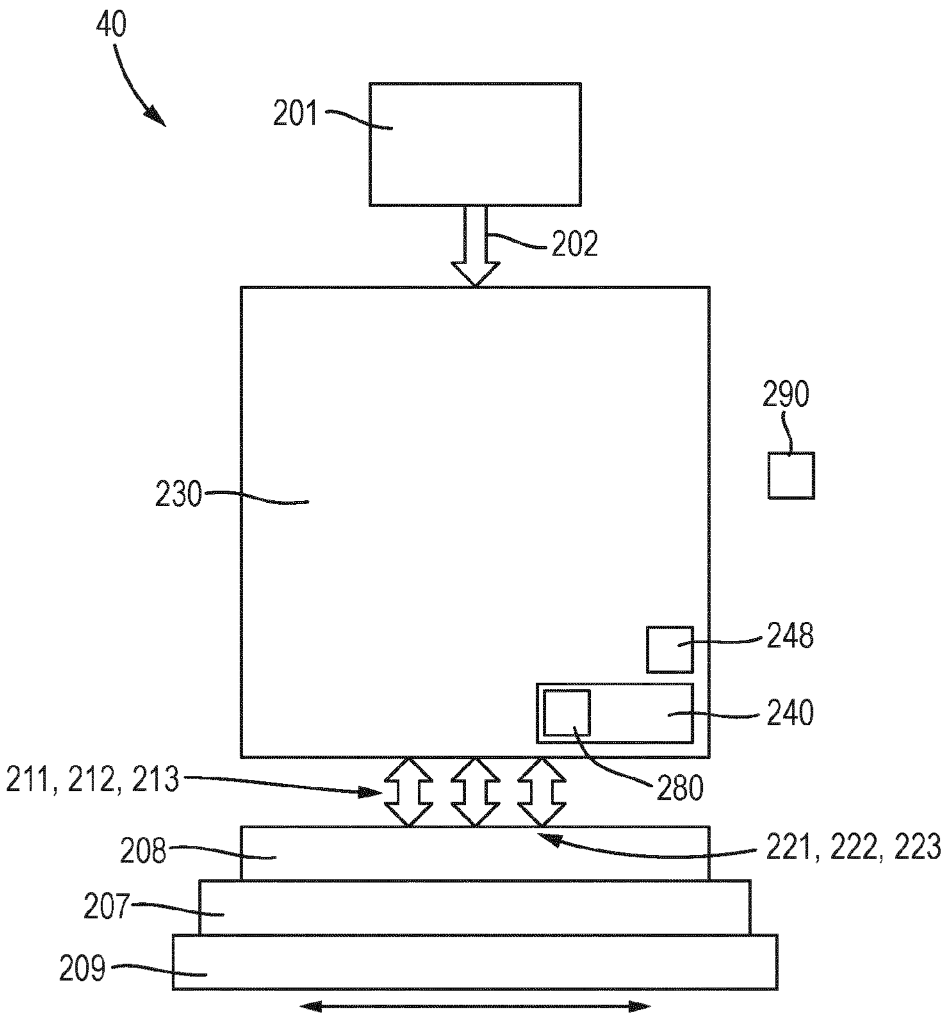
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. The multi-beam electron beam tool 40 (also referred to herein as apparatus 40) comprises an electron source 201, a projection apparatus 230, a motorized stage 209, and a sample holder 207. The electron source 201 and projection apparatus 230 may together be referred to as an illumination apparatus. The sample holder 207 is supported by motorized stage 209 so as to hold a sample 208 (e.g., a substrate or a mask) for inspection. The multi-beam electron beam tool 40 further comprises a detector array 240 (e.g. an electron detection device).

The electron source 201 may comprise a cathode (not shown) and an extractor or anode (not shown). During operation, the electron source 201 is configured to emit electrons as primary electrons from the cathode. The primary electrons are extracted or accelerated by the extractor and/or the anode to form a primary electron beam 202. The electron source 201 may comprise multiple sources, such as described in EP20184161.6, which is hereby incorporated by reference at least with respect to the multiple sources and how they relate to multiple columns and their associated electron-optics.

The projection apparatus 230 is configured to convert the primary electron beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beamlets.

The controller 50 may be connected to various parts of the charged particle beam inspection apparatus 100 of FIG. 1, such as the electron source 201, the detector array 240, the projection apparatus 230, and the motorized stage 209. The controller 50 may perform various image and signal processing functions. The controller 50 may also generate various control signals to govern operations of the charged particle beam inspection apparatus, including the charged particle multi-beam apparatus.

The projection apparatus 230 may be configured to focus sub-beams 211, 212, and 213 onto a sample 208 for inspection and may form three probe spots 221, 222, and 223 on the surface of sample 208. The projection apparatus 230 may be configured to deflect the primary sub-beams 211, 212, and 213 to scan the probe spots 221, 222, and 223 across individual scanning areas in a section of the surface of the sample 208. In response to incidence of the primary sub-beams 211, 212, and 213 on the probe spots 221, 222, and 223 on the sample 208, electrons are generated from the sample 208 which include secondary electrons and backscattered electrons.

The secondary electrons typically have electron energy ≤50 eV. Actual secondary electrons can have an energy of less than 5 eV, but anything beneath 50 eV is generally treated at a secondary electron. Backscattered electrons typically have electron energy between 0 eV and the landing energy of the primary sub-beams 211, 212, and 213. As electrons detected with an energy of less than 50 eV are generally treated as a secondary electron, a proportion of the actual backscatter electrons will be counted as secondary electrons. The secondary electrons may more generally be referred to, and are interchangeable with, secondary charged particles. The backscatter electrons may more generally be referred to, and are interchangeable with, backscatter charged particles. The skilled person would understand that the backscattered charged particles may more generally be described as secondary charged particles. However, for the purposes of the present disclosure, the backscattered charged particles are considered to be different from the secondary charged particles, e.g. having higher energies. In other words, the secondary charged particles will be understood to be particles having kinetic energy ≤50 eV and the backscatter charged particles will be understood to be particles having kinetic energy higher than 50 eV. The secondary charged particles and the backscatter charged particles are emitted from the sample. The charged particles emitted from the sample, e.g. the secondary electrons and backscattered electrons, may otherwise be referred to as signal particles, e.g. secondary signal particles and backscattered signal particles.

The detector array 240 is configured to detect secondary electrons and/or backscattered electrons and to generate corresponding signals which are sent to a signal processing system 280, e.g. to construct images of the corresponding scanned areas of sample 208. The detector array 240 may be incorporated into the projection apparatus 230.

The signal processing system 280 may comprise a circuit (not shown) configured to process signals from the detector array 240 so as to form an image. The signal processing system 280 could otherwise be referred to as an image processing system. The signal processing system may be incorporated into a component of the multi-beam electron beam tool 40 such as the detector array 240 (as shown in FIG. 2). However, the signal processing system 280 may be incorporated into any components of the inspection apparatus 100 or multi-beam electron beam tool 40, such as, as part of the projection apparatus 230 or the controller 50. The signal processing system 280 may include an image acquirer (not shown) and a storage device (not shown). For example, the signal processing system may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to the detector array 240 permitting signal communication, such as an electrical conductor, optical fiber cable, portable storage media, IR, Bluetooth, internet, wireless network, wireless radio, among others, or a combination thereof. The image acquirer may receive a signal from the detector array 240, may process the data comprised in the signal and may construct an image therefrom. The image acquirer may thus acquire images of the sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The signal processing system 280 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of the sample 208. The reconstructed images can thereby be used to reveal any defects that may exist in the sample.

The controller 50 may control the motorized stage 209 to move sample 208 during inspection of the sample 208. The controller 50 may enable the motorized stage 209 to move the sample 208 in a direction, preferably continuously, for example at a constant speed, at least during sample inspection. The controller 50 may control movement of the motorized stage 209 so that it changes the speed of the movement of the sample 208 dependent on various parameters. For example, the controller 50 may control the stage speed (including its direction) depending on the characteristics of the inspection steps of scanning process.

Known multi-beam systems, such as the electron beam tool 40 and charged particle beam inspection apparatus 100 described above, are disclosed in US2020118784, US20200203116, US 2019/0259570 and US2019/0259564 which are hereby incorporated by reference.

In known single-beam systems, different signals (e.g. from secondary electron and/or backscatter electrons) might theoretically be detected. Multi-beam systems are known and are beneficial as the throughput can be much higher than when using single-beam systems, e.g. the throughput of a multi-beam inspection system may be 100 times higher than the throughput in a single-beam inspection system.

In known multi-beam systems, an array of primary electron beams of electrons at a relatively high energy are targeted with a final deceleration step in order to land on a sample at a relatively low landing energy for detection of secondary charged particles as mentioned above. However, in practice, it has not been possible to use multi beam inspection in combination with backscatter detection, or at least by direct backscatter detection, i.e. presently known multi-beam systems rely primarily on detection of secondary electrons.

Backscatter electrons have a large range of energies, typically between 0 eV and the landing energy. The backscatter electrons have a large range in energy (for example up to the landing energy of the primary electron beam) and wide angle of emitted backscattered charged particles. Secondary electrons typically have a more restricted energy range and tend to be distributed around an energy value. The large energy range and wide angle of emitted backscattered charged particles results in cross-talk in a multi-beam system. Cross-talk occurs when backscattered charged particles resulting from one primary sub-beam are detected at a detector assigned to a different sub-beam. Cross-talk generally occurs very close to the sample, i.e. proximate the sample onto which the primary beam is projected. Due to the cross-talk, previously known multi-beam assessment tools have not been able to effectively image backscatter signals. As a consequence, it has not been possible to increase the throughput for backscattered detection by using multi-beam systems.

As mentioned above, there are limitations in the information which can be obtained from secondary electrons. Imaging based on backscattered beams provides information about structures below the surface, such as buried defects. Additionally, backscatter signals can be used to measure overlay targets.

Through various techniques, it has been found that detection of backscattered charged particles is possible for multi-beam systems by controlling certain features. Thus, in the present disclosure, a charged particle optical device is provided which is capable of detecting backscattered charged particles. The backscattered electrons can be detected using a multi-beam array as in the present disclosure due to the detector array 240 being positioned proximate the sample 208. In being proximate to the sample 208, the detector array 240 may be considered to face the sample 208. It has been found that the device can be used to repel secondary charged particles from the detector which reduces the secondary charged particles detected when trying to image backscattered charged particles. Additionally or alternatively, it has been found that the device can be used to accelerate electrons onto the sample to generate an array of sub-beams with high landing energy. This is beneficial because higher landing energy allows the sub-beams to reach deeper into the substrate to inspect buried defects and measure overlay targets.

Components of an assessment tool 40 which may be used in the present disclosure are described below in relation to FIG. 3, which is a schematic diagram of an assessment tool 40. The charged particle assessment tool 40 of FIG. 3 may correspond to the multi-beam electron beam tool (also referred to herein as apparatus 40).

The electron source 201 directs electrodes toward an array of condenser lenses 231 (otherwise referred to as a condenser lens array) forming part of the projection system 230. The electron source 201 is desirably a high brightness thermal field emitter with a good compromise between brightness and total emission current. There may be many tens, many hundreds or many thousands of condenser lenses 231. The condenser lenses 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The array of condenser lenses 231 may take the form of at least two plates, acting as electrodes, with an aperture in each plate aligned with each other and corresponding to the location of a sub-beam.

At least two of the plates are maintained during operation at different potentials to achieve the desired lensing effect.

In an arrangement the array of condenser lenses 231 is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect. More generally, the condenser lens array 231 may have two or more plate electrodes each with an array of apertures that are aligned. Each plate electrode array is mechanically connected to, and electrically isolated from, an adjacent plate electrode array by an isolating element, such as a spacer which may comprise ceramic or glass. The condenser lens array may be connected and/or spaced apart from an adjacent electron-optical element, preferably an electrostatic electron-optical element, by an isolating element such as a spacer as described elsewhere herein.

The condenser lenses are separated from a module containing the objective lenses (such as an objective lens array assembly as discussed elsewhere herein). In a case where the potential applied on a bottom surface of the condenser lenses is different than the potential applied on the top surface of the module containing the objective lenses an isolating spacer is used to space apart the condenser lenses and the module containing the objective lenses. In a case where the potential is equal then a conductive element can be used to space apart the condenser lenses and the module containing the objective lenses.

Each condenser lens 231 in the array directs electrons into a respective sub-beam 211, 212, 213 which is focused at a respective intermediate focus down beam of the condenser lens array. The respective sub-beams are projected along respective sub-beam paths 220. The sub-beams diverge with respect to each other. The sub-beam paths 220 diverge down beam of the condenser lenses 231. In some embodiments, deflectors 235 are provided at the intermediate focuses. The deflectors 235 are positioned in the sub-beam paths at, or at least around, the position of the corresponding intermediate focusses 233 or focus points (i.e. points of focus). The deflectors are positioned in or close to the sub-beam paths at the intermediate image plane of the associated sub-beam. The deflectors 235 are configured to operate on the respective sub-beams 211, 212, 213. The deflectors 235 are configured to bend a respective sub-beam 211, 212, 213 by an amount effective to ensure that the principal ray (which may also be referred to as the beam axis) is incident on the sample 208 substantially normally (i.e. at substantially 90° to the nominal surface of the sample). The deflectors 235 may also be referred to as collimators or collimator deflectors. The deflectors 235 in effect collimate the paths of the sub-beams so that before the deflectors, the sub-beam paths with respect to each other are diverging. Down beam of the deflectors the sub-beam paths are substantially parallel with respect to each other, i.e. substantially collimated. Suitable collimators are deflectors disclosed in EP Application 20156253.5 filed on 7 Feb. 2020 which is hereby incorporated by reference with respect to the application of the deflectors to a multi-beam array. The collimator may comprise a macro collimator 270, instead of, or in addition to the deflectors 235. Thus, the macro-collimator 270 described below in relation to FIG. 16 may be provided with the features of FIG. 3 or FIG. 4. This is generally less preferred than providing the collimator array as deflectors 235.

Below (i.e. down beam or further from source 201) the deflectors 235 there is a control lens array 250. The sub-beams 211, 212, 213 having passed through the deflectors 235 are substantially parallel on entry to the control lens array 250. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams. The control lens array 250 and the objective lens array 241 operate together to provide a combined focal length. Combined operation without an intermediate focus may reduce the risk of aberrations.

In further detail, it is desirable to use the control lens array 250 to determine the landing energy. However, it is possible to use in addition the objective lens array 240 to control the landing energy. In such a case, a potential difference over the objective lens is changed when a different landing energy is selected. One example of a situation where it is desirable to partly change the landing energy by changing the potential difference over the objective lens is to prevent the focus of the sub-beams getting too close to the objective lenses. In such a situation there is a risk of components of the objective lens array 241 having to be too thin to be manufacturable. The same may be said about a detector at this location, for example in, on or otherwise associated with the objective lens. This situation can for example occur in case the landing energy is lowered. This is because the focal length of the objective lens roughly scales with the landing energy used. By lowering the potential difference over the objective lens, and thereby lowering the electric field inside the objective lens, the focal length of the objective lens is made larger again, resulting in a focus position further below the objective lens. Note that use of just an objective lens would limit control of magnification. Such an arrangement could not control demagnification and/or opening angle. Further, using the objective lens to control the landing energy could mean that the objective lens would be operating away from its optimal field strength. That is unless mechanical parameters of the objective lens (such as the spacing between its electrodes) could be adjusted, for example by exchanging the objective lens.

The control lens array 250 comprises a plurality of control lenses. Each control lens comprises at least two electrodes (e.g. two or three electrodes) connected to respective potential sources. The control lens array 250 may comprise two or more (e.g. three) plate electrode arrays connected to respective potential sources. Each plate electrode array is mechanically connected to, and electrically separated from, an adjacent plate electrode array by an isolating element, such as a spacer which may comprise ceramic or glass. The control lens array 250 is associated with the objective lens array 241 (e.g. the two arrays are positioned close to each other and/or mechanically connected to each other and/or controlled together as a unit). Each control lens may be associated with a respective objective lens. The control lens array 250 is positioned up-beam of the objective lens array 241.

The control lens array 250 comprises a control lens for each sub-beam 211, 212, 213. A function of the control lens array 250 is to optimize the beam opening angle with respect to the demagnification of the beam and/or to control the beam energy delivered to the objective lenses 234, each of which directs a respective sub-beam 211, 212, 213 onto the sample 208. The objective lenses may be positioned at or near the base of the electron-optical system. More specifically, the objective lens array may be positioned at or near the base of the projection system 230. The control lens array 250 is optional but is preferred for optimizing a sub-beam upbeam of the objective lens array.

Figure 3:
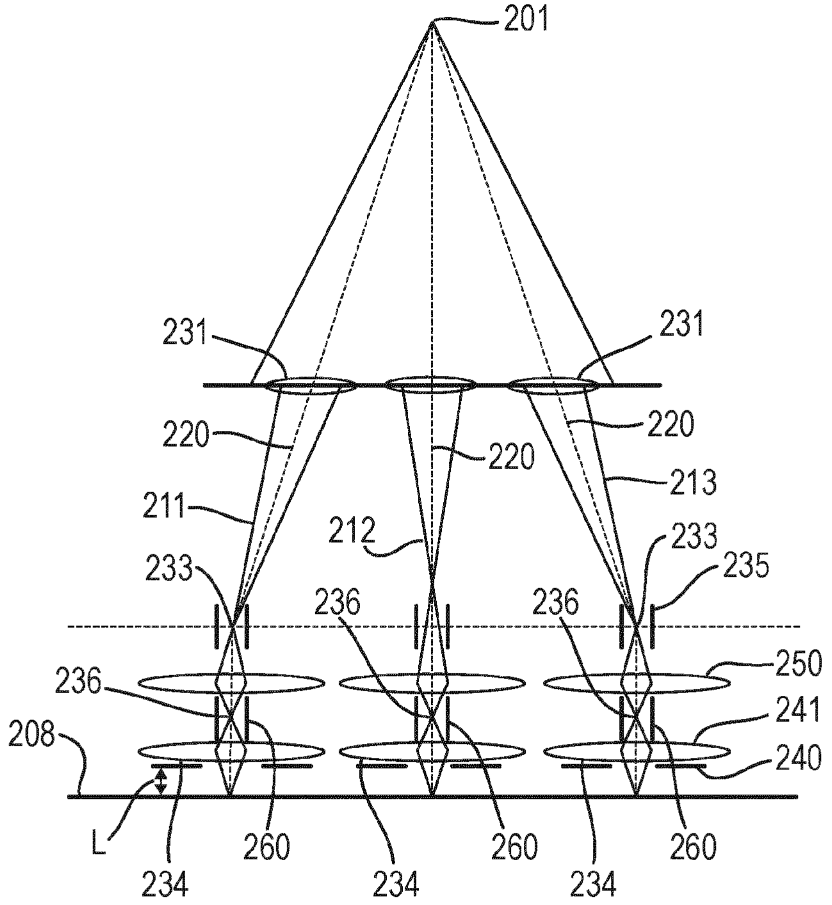
FIG. 3 is a schematic diagram of an exemplary multi-beam apparatus according to some embodiments.

For ease of illustration, lens arrays are depicted schematically herein by arrays of oval shapes (as shown in FIG. 3). Each oval shape represents one of the lenses in the lens array. The oval shape is used by convention to represent a lens, by analogy to the biconvex form often adopted in optical lenses. In the context of charged-particle arrangements such as those discussed herein, it will be understood however that lens arrays will typically operate electrostatically and so may not require any physical elements adopting a biconvex shape. Lens arrays may instead comprise multiple plates with apertures.

Optionally, an array of scan deflectors 260 is provided between the control lens array 250 and the array of objective lenses 234. The array of scan deflectors 260 comprises a scan deflector for each sub-beam 211, 212, 213. Each scan deflector is configured to deflect a respective sub-beam 211, 212, 213 in one or two directions so as to scan the sub beam across the sample 208 in one or two directions.

Figure 5:
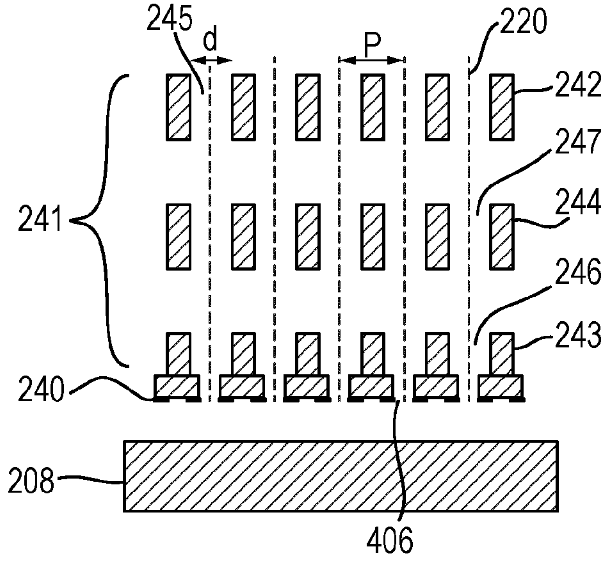
FIG. 5 is a schematic cross-sectional view of an objective lens of an inspection apparatus according to some embodiments.
Figure 6:
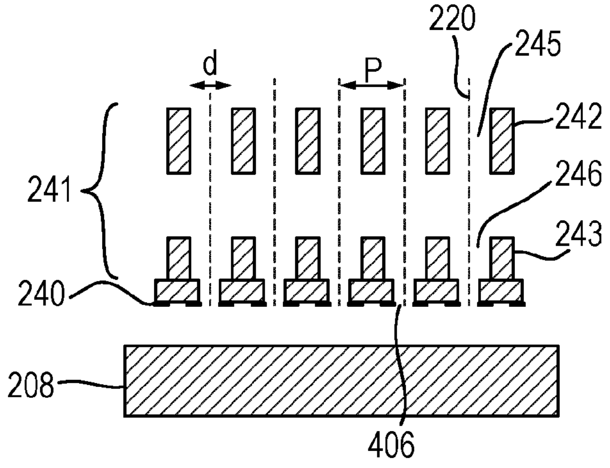
FIG. 6 is a schematic cross-sectional view of an objective lens of an inspection apparatus according to some embodiments.

The objective lens array 241 may comprise at least two electrodes in which are defined aperture arrays. Defined in such an electrode is an aperture array. In other words, the objective lens array comprises at least two electrodes with a plurality of holes or apertures. Although in some embodiments the objective lens array may have a single electrode. FIG. 5 and FIG. 6 show electrodes 242, 243, 244 which are part of an exemplary objective lens array 241 having respective aperture arrays 245, 246, 247. The position of each aperture in an electrode corresponds to the position of a corresponding aperture in another electrode. The corresponding apertures operate in use on the same beam, sub-beam or group of beams in the multi-beam. In other words, corresponding apertures in the at least two electrodes are aligned with and arranged along a sub-beam path, i.e. one of the sub-beam paths 220. Thus, the electrodes are each provided with apertures through which the respective sub-beam 211, 212, 213 propagates.

The objective lens array 241 may comprise two or three electrodes, as shown in FIG. 5 and FIG. 6 respectively, or may have more electrodes (not shown). An objective lens array 241 having only two electrodes can have fewer aberrations, e.g. a lower aberration risk and/or impact, than an objective lens array 241 having more electrodes. A three-electrode objective lens can have greater potential differences between the electrodes and so enable a stronger lens. Additional electrodes (i.e. more than two electrodes) provide additional degrees of freedom for controlling the electron trajectories, e.g. to focus secondary electrons as well as the incident beam. A benefit of two electrode lens over an Einzel lens is that the energy of an in-coming beam is not necessarily the same as an out-going beam. Beneficially the potential differences on such a two electrode lens array enables it to function as either an accelerating or a decelerating lens array.

Adjacent electrodes of the objective lens array 241 are spaced apart from each other along the sub-beam paths. The distance between adjacent electrodes along the beam path, in which an insulating structure might be positioned as described below, is smaller than the size of an objective lens (along the beam path, i.e. between the most upbeam and most down beam electrode of the objective lens array).

Preferably, each of the electrodes provided in the objective lens array 241 is a plate. The electrode may otherwise be described as a flat sheet. Preferably, each of the electrodes is planar. In other words, each of the electrodes will preferably be provided as a thin, flat plate, in the form of a plane. Of course, the electrodes are not required to be planar. For example, the electrode may bow due to the force due to the high electrostatic field. It is preferable to provide a planar electrode because this makes manufacturing of the electrodes easier as known fabrication methods can be used. Planar electrodes may also be preferable as they may provide more accurate alignment of apertures between different electrodes.

The objective lens array 241 can be configured to demagnify the charged particle beam by a factor greater than 10, desirably in the range of 50 to 100 or more.

A detector array 240 is provided to detect secondary and/or backscattered charged particles emitted from the sample 208. The detector array 240 is positioned between the objective lenses 234 and the sample 208. The detector array may otherwise be referred to as a sensor array, and the terms "detector" and "sensor" are used interchangeably throughout the application.

Figure 4:
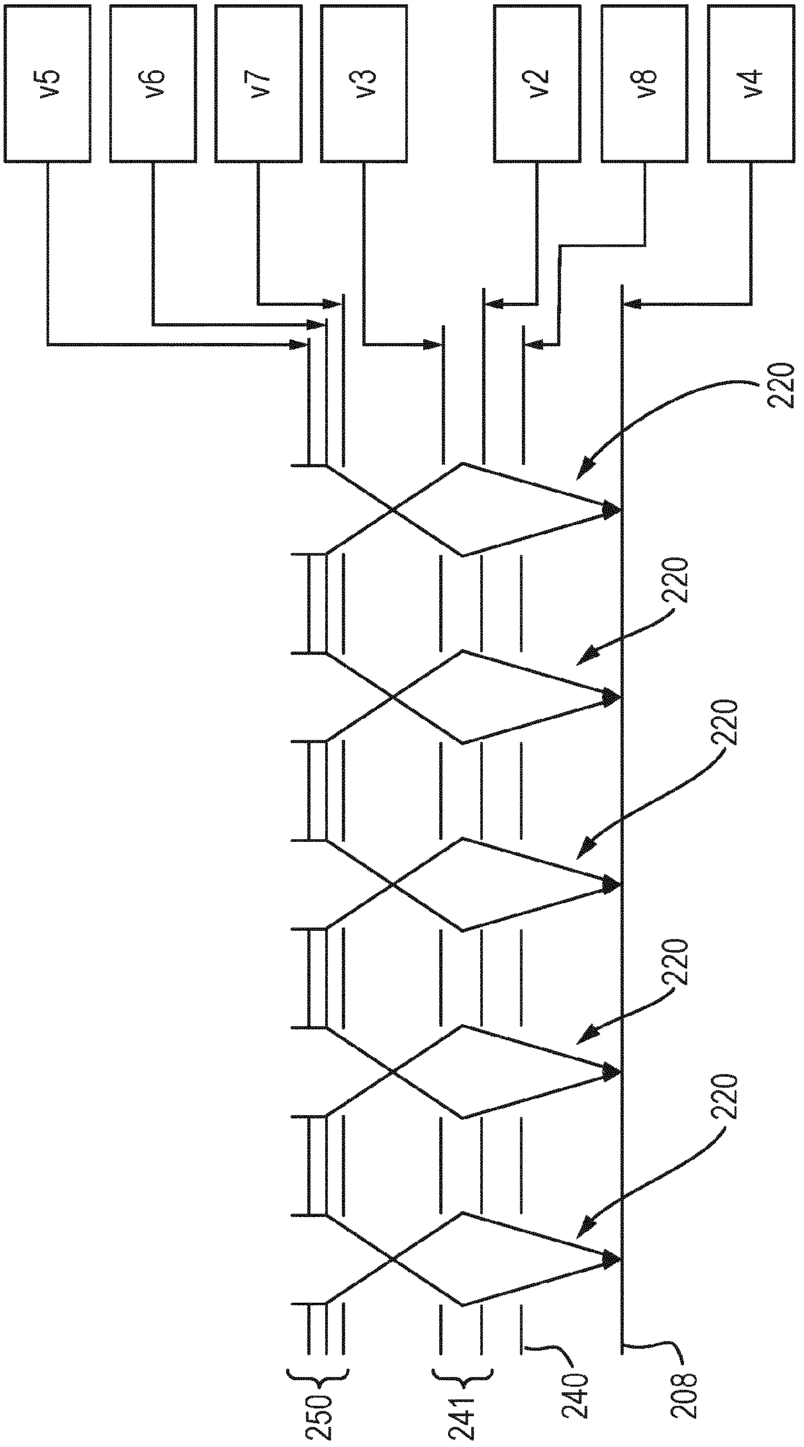
FIG. 4 is a schematic diagram of an exemplary charged particle optical device according to some embodiments.

In a first aspect, a charged particle-optical device is provided. The charged particle optical device is configured to detect backscattered charged particles. The charged particle optical device is suitable for any charged particle system e.g. a charged particle assessment tool as shown in FIG. 3. The charged particle assessment tool may be an example of a charged particle system, and any reference to the charged particle assessment tool may be interchangeable with the charged particle system. Thus, the charged particle optical device may be used as part of such a charged particle assessment tool. The charged particle-optical device may include at least one, some, or all of the features of the charged particle assessment tool 40. An example of the charged particle-optical device is shown in FIG. 4. As depicted, the charged particle device may comprise a controller array 250, an objective lens array 241 and a detector array 240. In FIG. 4, multiple lenses of each array are depicted, for example, with any of sub-beams 211, 212, 213 passing through the lenses as shown. Although FIG. 4 depicts five lenses, any appropriate number may be provided; for example, in the plane of the lenses, there may be 100, 1000 or of the order of 10,000 lenses. Features that are the same as those described above are given the same reference numerals. For conciseness, the description of these features provided above applies to the features shown in FIG. 4. The charged particle optical device may comprise one, some or all of the components shown in FIG. 4. Note that this figure is schematic and may not be to scale. For example, in a non-limited list: the sub-beams may be narrower at the controller array 250 than at the objective lens array 241; the detector array 240 may be closer to the electrodes of the objective lens array 241 than the electrodes of the objective lens array 241 are to each other; and a focus point of each sub-beam between the controller lens array 250 may be closer to the objective lens array 241 than depicted.

FIG. 4 is an enlarged schematic view of multiple objective lenses of the objective lens array 241 and multiple control lenses of the control lens array 250. As described in further detail below, the lens arrays can be provided by electrodes with a selected potential applied to the electrode. Spacing between electrodes of the control lens array 250 may be larger than spacing between electrodes of the objective lens array 241 as shown in FIG. 4, but this is not a necessity. Voltage sources V3 and V2 (which may be provided by individual electric power sources or may all be supplied by electric power source 290) are configured to apply potentials to the upper and lower electrodes of the objective lens array 241 respectively. Voltage sources V5, V6, V7 (which may be provided by individual electric power sources or may all be supplied by electric power source 290) are configured to apply potentials to the first, second and third electrodes of the control lens array 250 respectively. A further voltage source V4 is connected to the sample to apply a sample potential. A further voltage source V8 is connected to the detector array to apply a detector array potential. Although the control lens array 250 is shown with three electrodes, the control lens array 250 may be provided with two electrodes (or more than three electrodes). Although the objective lens array 240 is shown with two electrodes, the objective lens array 240 may be provided with three electrodes (or more than three electrodes). For example, a middle electrode may be provided in the objective lens array 241 between the electrodes shown in FIG. 4 with a corresponding voltage source.

Figure 16:
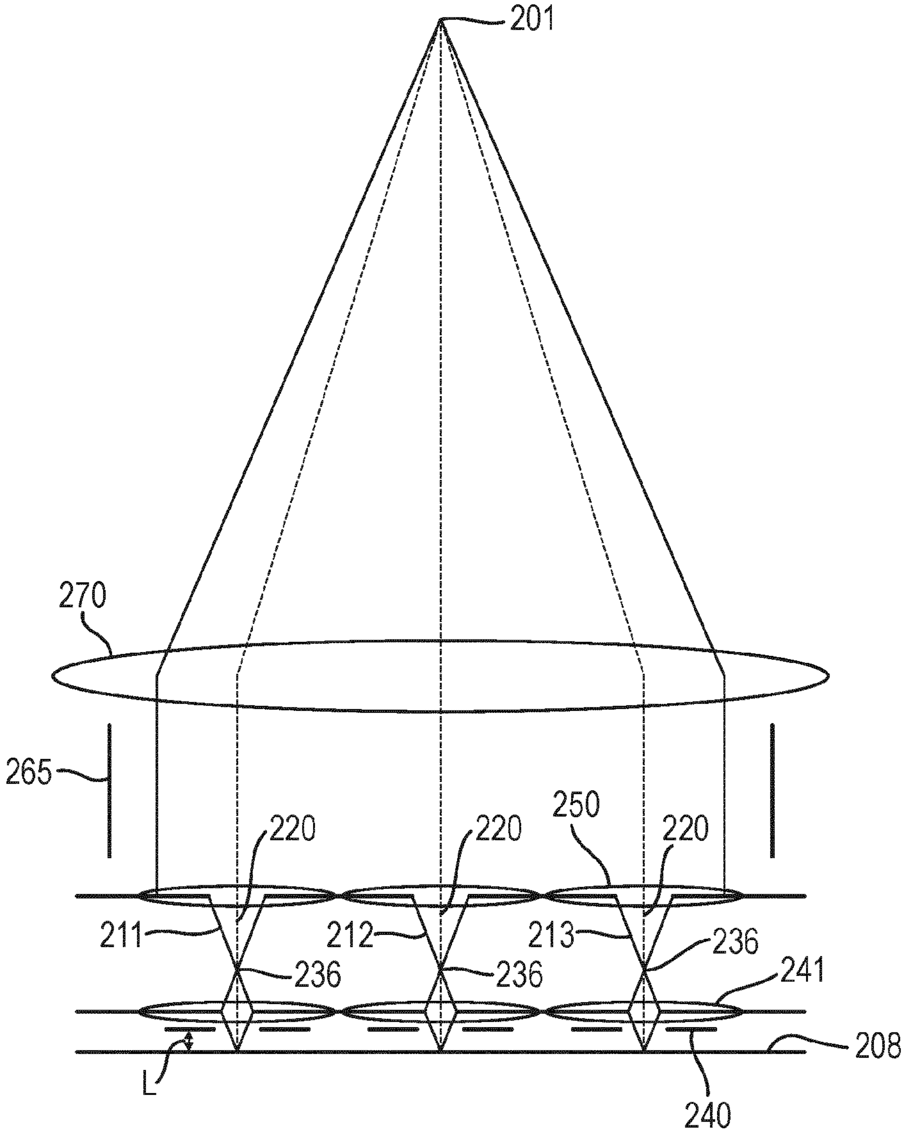
FIG. 16 is a schematic diagram of an exemplary electron-optical system comprising a macro collimator and macro scan deflector.

As shown in FIG. 4, the sub-beams may be parallel on entry into the control lens array 250, as shown in FIG. 3. However, the same components of FIG. 4 may be used in a configuration as shown in FIG. 16, in which case, the sub-beams may be separated on entry into the control lens array 250 as shown in FIG. 16.

The control lens array electrodes may be spaced a few millimeters (e.g. 3 mm) apart. The spacing between the control lens array 241 and the objective lens array 250 (i.e. the gap between lower electrode of the control lens array 250 and the upper electrode of the objective lens 241) can be selected from a wide range, e.g. from 2 mm to 200 mm or more. A small separation makes alignment easier whereas a larger separation allows a weaker lens to be used, reducing aberrations.

Desirably, the potential V5 of the uppermost electrode of the control lens array 250 is maintained the same as the potential of the next electron-optic element up-beam of the control lens (e.g. deflectors 235). The potential V7 applied to the lower electrode of the control lens array 250 can be varied to determine the beam energy. The potential V6 applied to the middle electrode of the control lens array 250 can be varied to determine the lens strength of the control lens and hence control the opening angle and demagnification of the beam. It should be noted that even if the landing energy does not need to be changed, or is changed by other means, the control lens can be used to control the beam opening angle. The position of the focus of a sub-beam is determined by the combination of the actions of the respective control lens array 250 and the respective objective lens 240.

In the first aspect, a charged particle optical device for the charged particle assessment tool 40 is provided, or more generally, a charged particle-optical device for a charged particle system. The charged particle optical device is referred to below as the device. The device is configured to project a multi-beam of charged particles along sub-beam paths 220 towards the sample 208. The multi-beam comprises sub-beams, such as sub-beams 211, 212, 213. The sub-beams may otherwise be referred to as beams, for example, an array of primary beams. In other words, the device is configured to project an array of beams of charged particles towards a sample. The device comprises the objective lens array 241, which comprises a plurality of objective lenses 234 and can otherwise be referred to as an array of objective lenses. The objective lens array 241 is configured to project an array of charged particle sub-beams 211, 212, 213 onto the sample 208. The array of objective lenses (i.e. the objective lens array 241) may correspond with the array of detectors (i.e. the detector array 240) and/or any of the sub-beams Each element in the objective lens array 240 may be a micro-lens operating a different beam or group of beams in the multi-beam. The objective lens array 241 may be configured to accelerate the charged particles towards the sample 208. In other words, the objective lenses 234 may be configured to accelerate the charged particle sub-beams 211, 212, 213 along the sub-beam paths 220.

The device comprises the detector array 240, otherwise referred to as an array of detectors. The detector array 240 is configured to capture charged particles emitted from the sample 208. The detector array is configured to detect backscatter particles from the sample 208. The detector array 240 may be configured to detect primarily backscattered charged particles. In other words, the detector array 240 may be configured to detect mostly backscattered charged particles. The detector array 240 may be configured to detect more backscattered charged particles than secondary charged particles. As described further below, the device is beneficial in that it provides a multi-beam tool which can be used to detect directly backscattered charged particles emitted from the sample 208. Thus, the backscatter charged particles may be detected directly from the surface of the sample 208. The backscatter charged particles may be detected without having to be converted, for example, into another type of signal particle such a secondary charged particle which may be easier to detect. Thus, the backscatter charged particles may be detected by the detector array 241 without encountering, e.g. hitting, any other components or surfaces between the sample 208 and the detector array 241.

The detector array 240 comprises a plurality of detectors. Each detector is associated with a corresponding sub-beam (which may otherwise be referred to as a beam or primary beam). In other words, the arrays of detectors (i.e. the detector array 240) and sub-beams correspond. Each detector may be assigned to a sub-beam. The array of detectors may correspond with the array of objective lenses. In other words, the array of detectors may be associated with the corresponding array of objective lenses. The embodiments of the present disclosure enable the risk of cross-talk of detection of backscatter charged particles derived from a sub-beam detected by a detector of the detector array associated with a different sub-beam of the array of sub-beams can be reduced if not avoided. A detector array 240 is described below. However, any reference to detector array 240 could be replaced with a single detector (i.e. at least one detector) or multiple detectors as appropriate. The detectors may otherwise be referred to as of detector elements 405 (e.g. sensor elements such as capture electrodes). The detectors may be any appropriate type of detector. For example, capture electrodes for example to detect directly electron charge, scintillators or PIN elements can be used; it should be noted that PIN elements and scintillator elements typically detect signal particles above an energy threshold, such that a detector down-beam of an objective lens with such elements typically detects only backscatter charged particles. The detector may be a direct current detector or an indirect current detector. The detector may be a detector as described below in relation to FIG. 7, FIG. 8, FIG. 9, FIG. 13A, FIG. 13B, FIG. 14, and FIG. 15.

As noted, scintillators and PIN elements typically detect signal particles above an energy threshold. Since secondary electrons have a low energy of close to 0 eV, e.g. 50 eV, it would be understood by a person skilled in the art for such scintillators and PIN elements could not to detect secondary electrons of such an energy. For these types of detector element to detect such electrons such a detector element should be positioned at a location in the electron-optical column at which such secondary electrons have sufficient energy for their detection, for example above the electrodes furthest down beam in a decelerating objective lens, or at least the down-beam most of the electrodes defining a decelerating objective lens arrangement, see for example EP Application number 20198201.4 which is hereby incorporated by reference at least so far as the disclosure of in lens sensor units and detectors, The detector array 240 is positioned between the control lens array 250 and the sample 208. The detector array is positioned between the objective lens array 241 and the sample 208. The detector array 240 is configured to be proximate the sample. The detector array 240 may be proximate the sample so as to detect backscatter particles from the sample 208. The detector being proximate the sample enables the risk of cross-talk in detection of backscatter charged particles generated by sub-beams which correspond to another detector in the detector array to be reduced if not avoided. In other words, the detector array 240 is very close to the sample 208. The detector array 240 may be within a certain distance of the sample 208, as described below. The detector array 240 may be adjacent to the sample 208. The at least one detector may be positioned in the device so as to face the sample. That is the detector may provide a base to the device. The detector as part of the base may face a surface of the sample. This may be beneficial in positioning the at least one detector in a location in which the at least one detector is more likely to detect backscattered particles than secondary particles. For example, the at least one detector array may be provided on an output side of the objective lens array 241. The output side of the objective lens array 241 is the side on which the sub-beams are output from the objective lens array 241, i.e. the bottom or downbeam side of the objective lens array in the configuration shown in FIG. 4, FIG. 5 and FIG. 6. In other words, the detector array 240 may be provided downbeam of the objective lens array 241. The detector array may be positioned on, or adjacent to, the objective lens array. The detector array 241 may be an integral component of the objective lens array 241. The detector and objective lens may be part of the same structure. The detector may be connected to the lens by an isolating element or directly to an electrode of the objective lens. Thus, the at least one detector may be part of an objective lens assembly comprising at least the objective lens array and the detector array. If the detector array is an integral component of the objective lens array 241, the detector array 240 may be provided at the base of the objective lens array 241. In an arrangement the detector array 240 may be integral to the most-down-beam positioned electrode of the objective lens array 241.

Ideally, the detector array is as close as possible to the sample. The detector array 240 is preferably very close to the sample 208 such that there is a proximity focus of backscattered charged particles at the detector array. As previously described, the energy and angular spread of the backscattered charged particles is generally so large that it is difficult (or impossible in known prior art systems) to keep the signals from neighboring beams separated. However, the proximity focus means that backscattered charged particles can be detected at a relevant one of the detectors without cross-talk (i.e. interference from neighboring beams) in the first aspect. Of course, there is a minimum distance between the sample 208 and the detector array 240. However, it is preferable to reduce this distance as much as possible. Certain configurations may benefit from reducing the distance even more than others.

Preferably, a distance 'L' as shown in FIG. 3, between the detector array 240 and the sample 208 is less than or equal to approximately 50 μm, i.e. the detector array 240 is positioned within approximately 50 μm from the sample 208. The distance L is determined as the distance from a surface of the sample 208 facing the detector array 240 and a surface of the detector array 241 facing the sample 208. Preferably, the detector array 240 is positioned within approximately 40 μm of the sample 208, i.e. the distance L between the detector array 240 and the sample 208 is less than or equal to approximately 40 μm. Preferably, the detector array 240 is positioned within approximately 30 μm of the sample 208, i.e. the distance L between the detector array 240 and the sample 208 is less than or equal to approximately 30 μm. Preferably, the detector array 240 is positioned within approximately 20 μm of the sample 208, i.e. the distance L between the detector array 240 and the sample 208 is less than or equal to approximately 20 μm. Preferably, the detector array 240 is positioned within approximately 10 μm of the sample 208, i.e. the distance L between the detector array 240 and the sample 208 is approximately less than or equal to 10 μm.

Providing a distance of approximately 50 μm or less is beneficial in that cross-talk between backscattered electrons can be avoided or minimized Therefore, the distance L is preferably kept low, i.e. approximately 50 μm or less. Theoretically, there may be a lower limit of how close the sample 208 and the detector array 240 can be whilst allowing these components to move relative to each other and this may mean that the distance L might be more than approximately 5 μm or 10 μm.

For example, a distance L of approximately 50 μm or less may be used whilst still allowing relatively reliable control of the device as shown as part of the tool in FIG. 3. A distance L of approximately 30 μm or less may be preferable for other configurations, such as those shown and described in relation to FIG. 16 below.

A preferred range of the distance L between the detector array 240 and the sample 208 may be between approximately 5 μm to 50 μm, or preferably between approximately 10 μm to 50 μm, or preferably between approximately 30 μm to 50 μm. In an arrangement the detector array 240 may be actuatable relative to the objective lens array 241, i.e. to vary the distance L, for example to substantially maintain a distance between the sample and the detector array L.

The detector array 240 may be part of the objective lens assembly. An example of detector array 240 integrated into an objective lens array is shown in FIG. 5 which illustrates a portion of the objective lens array 240 in schematic cross section. In this example, the detector array 240 comprises a plurality of detector elements 405 (e.g. sensor elements such as capture electrodes). As discussed above, the device may be configured to repel secondary charged particles emitted from the sample 208 towards the detector array 240. More specifically, the detector array 240 may be configured to repel secondary charged particles emitted from the sample 208. The detector array 240 may be configured to repel charged particles by controlling a potential of the detector array 240. This is beneficial as it reduces the number of secondary charged particles emitted from the sample 208 which travel back towards the detector array 240.

The detector array 240 may be configured in use to have a potential, referred to herein as a detector array potential. The sample 208 may be configured in use to have a potential, referred to herein as a sample potential. The sample potential may be more positive than the detector array potential. The difference in potential between the detector array 240 and the sample 208 repels charged particles emitted from the sample 208 from heading towards the detector array 240. Preferably, the detector array potential may be the same as the second electrode potential (i.e. the potential of the downbeam electrode of the objective lens array).

The potential difference between the sample potential and the detector array potential is preferably relatively small so that charged particle sub-beams are projected through or past the detector array 240 to the sample 208 without being significantly affected. The potential difference between the sample potential and the detector array potential is preferably greater than a secondary electron threshold. The secondary electron threshold may determine the minimum initial energy of secondary electrons that can still reach the detector. Preferably, the secondary electron threshold is the potential difference equivalent to the likely electron energy of a secondary electron emanating from the sample 208. That is the relatively small potential difference between the sample and detector array potentials is sufficient to repel the secondary electrons from the detector array. For example, the potential difference between the sample potential and the detector array potential may be approximately 20 V, 50 V, 100 V, 150 V or 200 V.

Preferably, the potential difference between the detector array potential and the sample potential is small. This means that, advantageously, the potential difference will have a negligible effect on the path of a backscattered charged particle (which generally has a greater energy up to the landing energy), meaning that the backscattered electrons can still be detected whilst reducing or avoiding detection of secondary charged particles. Thus, the small difference between the detector array potential and the sample potential is effectively an energy barrier which allows backscatter charged particles to be detected whilst also making sure that detection of secondary charged particles is reduced or avoided.

For example, the detector array potential may be greater than approximately +10 kV up to approximately +100 kV, or preferably between approximately +20 kV to +100 kV relative to a source of the charged particle beam. Preferably, the detector array potential is between approximately +20 kV to +70 kV relative to a source of the charged particle beam.

Although it is described elsewhere that part of the device may be configured to repel the secondary charged particles, this will generally be done by the detector array 240. The detector array and the lowermost electrode of the objective lens array 241 may both theoretically have a repellant effect on the secondary charged particles emitted from the sample returning towards the detector array 240. However, as the detector array 240 is closer to the sample 208 than the objective lens array 241, it is the detector array 240 which will generally provide the repelling force on the secondary charged particles.

The aperture arrays 245, 246, 247 of the objective lens array 241 may consist of a plurality of apertures, preferably with substantially uniform diameters, d. However there may be some variation for optimizing aberration correction as described in EP Application 20207178.3 filed on 12 Nov. 2020 which is herein incorporated by reference at least with respect to corrections achieved by varying aperture diameter. The diameter, d, of the apertures in at least one electrode may be less than approximately 400 μm. Preferably, the diameter, d, of the apertures in at least one electrode is between approximately 30 to 300 μm. Smaller aperture diameters may provide larger detectors for a given aperture pitch, improving the chance of capturing backscatter charged particles. Thus the signal for the backscattered charged particles may improve. However, having apertures that are too small risk inducing aberrations in the primary sub-beams.

The plurality of apertures in an electrode may be spaced apart from each other by a pitch, p. The pitch is defined as the distance from the middle of one aperture to the middle of an adjacent aperture. The pitch between adjacent apertures in at least one electrode may be less than approximately 600 μm. Preferably, the pitch between adjacent apertures in at least one electrode is between approximately 50 μm and 500 μm. Preferably, the pitch between adjacent apertures on each electrode is substantially uniform.

The backscatter electrons are emitted from the sample 208 with a very large energy spread, and typically with an angular spread following a cosine distribution which may take the appearance of a cone. The further the distance from sample 208 to the detector array 240, the larger the cone of the emitted beam becomes. It will be understood that the backscatter electrons can have all angles. The cone of the emitted beam is the solid angle assignable to the detector associated with a respective beam, so that this solid angle is larger with greater proximity of the sample and the detector. Because of the very large energy spread it may not be possible to image the backscattered charged particles coming from the different beams onto a detector without introducing significant cross talk. The solution is to place the detector in close proximity to the substrate and choose the pitch of the beams such that the backscatter charged particle signals of the neighbouring beams to not overlay.

Thus, the pitch size may be selected depending on the distance between the detector array 240 and the sample 208 (or vice versa). For example only, for a distance L between the sample 208 and the detector array 240 of approximately 50 micron, the beam pitch p may be equal to or larger than approximately 300 micron. For example only, for a distance L between the sample 208 and the detector array 240 of approximately 10 micron, the beam pitch p may be equal to or larger than approximately 60 micron. Providing a closer detector array allows use of a smaller beam pitch p. This may be beneficial in using certain configurations in which the beam pitch is beneficially smaller, such as the configuration described in relation to, and shown in, FIG. 16 below.

The values for the diameter and/or pitch described above can be provided in at least one electrode, multiple electrodes, or all electrodes in an objective lens array. Preferably, the dimensions referred to and described apply to all electrodes provided in an array of objective lenses.

The objective lens array 241 may comprise the first electrode 242 with the first aperture array 245 and the second electrode 243 with the second aperture array 246. The first electrode 242 may be up-beam of a second electrode 243, as shown in FIG. 5 and FIG. 6. Up-beam may be defined as being closer to the source 201. Up-beam may otherwise be defined as further from the sample 208. The first electrode 242 may be referred to as the upper electrode. The second electrode 243 may be referred to as the lower electrode.

Additional electrodes may be included as part of the objective lens array. The additional electrodes may be positioned between the first electrode and the second electrode. In other words, the first electrode 242 and the second electrode 243 may be outer electrodes. The first electrode 242 may be positioned up-beam of any other electrode included in the objective lens array 241. The second electrode 243 may be positioned down-beam of any other electrodes included in the objective lens array 241. As shown in FIG. 5, a third electrode 244 may be provided with a third aperture array 247. The third electrode 244 may be a middle electrode.

As described above, a voltage source may be provided to the electrodes of the objective lens array such that the electrodes each have a potential. The first electrode 242 may be configured in use to have a first electrode potential and/or the second electrode 243 may be configured in use to have a second electrode potential. Additionally or alternatively, the sample 208 may be configured in use to have the sample potential.

As described above, accelerating the sub-beams 211, 212, 213 projected onto the sample 208 is beneficial in that it can be used to generate an array of sub-beams with high landing energy. The potentials of the electrodes of the objective lens array can be selected to provide acceleration through the objective lens array 241.

The potentials and the values of the potentials defined herein are defined with respect to the source; hence the potential of a charged particle at the surface of the sample may be referred to as a landing energy because the energy of a charged particle correlates to the potential of the charged particle and the potential of the charged particle at the sample is defined with respect to the source. However, as the potentials are relative values, the potentials could be defined relative to other components, such as the sample. In this instance, the difference in potential applied to different components would preferably be as discussed below with respect to the source. The potentials are applied to the relevant components, such as the electrodes and the samples during use, i.e. when the device is being operated.

Preferably, the potential of the second electrode 243 (i.e. the second electrode potential) is more positive than the potential of the first electrode 242 (i.e. the first electrode potential). This is beneficial in accelerating the charged particle from the first electrode 242 towards the second electrode 243. In other words, the difference in potential of the electrodes can be used to accelerate the charged particle in the objective lens array 241.

Preferably, the second electrode potential is substantially the same as the detector array potential.

Preferably, the sample potential is more positive than potential of the first electrode (i.e. the first electrode potential). This is beneficial in accelerating the charged particle from the first electrode 242 towards the sample 208.

Preferably, the sample potential is more positive than the potential of the second electrode (i.e. the second electrode potential). This is beneficial in accelerating the charged particle from the second electrode towards the sample. Additionally, this is beneficial in that the charged particles are more attracted to the sample 208 than the second electrode 243 of the objective lens array 241. This has the effect of repelling charged particles emitted from the sample 208 away from a path towards the second electrode 243, i.e. towards the detector array 240 as described above.

The device may be configured to repel secondary charged particles from a downbeam electrode of the objective lens array 241. The downbeam electrode of the objective lens array 241 may be the part of the objective lens array 241 which is positioned furthest along the beam, i.e. downbeam/furthest from the source 201 when in use. In this instance, the device may be configured to repel secondary electrons from the detector array 241 (using the objective lens array 240) so that the detector array 240 can more effectively detect the backscatter charged particles over the secondary electrons, i.e. by reducing or preventing secondary charged particles being detected.

As discussed above, it is preferable for at least the second electrode potential to be more positive than the first electrode potential as this accelerates the charged particle projected in the objective lens assembly 241. When the first electrode potential is lower, then a bigger difference in potential can be provided between the first electrode and the second electrode. A greater difference between the first and second electrode potential will result in a larger acceleration. Therefore, the first electrode potential is preferably relatively low. However, if the first electrode potential is too small, for example, less than +2 kV or less than +3 kV, then it has been found that focus of the charged particle sub-beams may be formed inside the objective lens array 241. Therefore, the value of the first electrode is selected to be small, without resulting in the formation of the focus within the objective lens array. For example, the potential of the first electrode may be between approximately +1 kV to +10 kV relative to a source of the charged particle beam. For example, the potential of the first electrode may be between approximately +3 kV to +8 kV relative to a source of the charged particle beam. Preferably, the potential of the first electrode is approximately +5 kV relative to a source of the charged particle beam.

The potential of the second electrode may be more positive than the first electrode potential to accelerate the charged particle. Therefore, it is preferable for the second electrode potential value to be relatively large. The second electrode potential value may be greater than approximately +10 kV up to approximately +100 kV, or preferably between approximately +20 kV to +100 kV relative to a source of the charged particle beam. Preferably, the potential of the second electrode is between approximately +20 kV to +70 kV relative to a source of the charged particle beam.

As mentioned above, the sample potential is preferably more positive than the second electrode potential because this repels secondary charged particles from the objective lens array 241. However, as the particles are being accelerated from the first electrode and through the second electrode to the sample, it is beneficial in keeping the value of the sample potential similar to the value of the second electrode potential so that the charged particles are accelerated to the surface of the sample 208. That is the difference in potential between the second and sample potential is relatively small, but sufficient for the charged particles to be accelerated towards the sample. The sample potential may be greater than approximately +10 kV up to approximately +100 kV, or preferably may be between approximately +20 kV to +100 kV relative to a source of the charged particle beam. Preferably, the potential of the sample is approximately +20 kV to +70 kV relative to a source of the charged particle beam. Preferably, the sample potential is approximately 10V, 20 V, 50 V, 100 V, 150 V or 200 V more positive than the second electrode potential.

The potential difference between the sample potential and the second electrode potential preferably greater than a secondary electron threshold. The secondary electron threshold is the potential difference equivalent to the likely electron energy of a secondary electron emanating from the sample. That is the relatively small potential difference between the sample potential and second electrode potential is sufficient to repel the secondary electrons from the detector array. For example, the potential difference between the sample potential and the bottom electrode potential may be approximately 10V, 20 V, 50 V, 100 V, 150 V or 200 V.

For example, the device being configured to accelerate the charged particle sub-beams and repel the secondary charged particles as described above may have potentials as shown in the context of FIG. 4 with the values in Table 1 below. As mentioned above, the objective lens array as shown in FIG. 4 may comprise an additional electrode, e.g. a middle electrode positioned between the upper electrode (first electrode) and lower electrode (second electrode) of the objective lens array 241 as shown in FIG. 4. A voltage source V1 (not shown) may be configured to apply a potential to the middle electrode. This middle electrode is optional and may not be included with the electrodes having the other potentials listed in Table 1. The middle electrode of the objective lens array may have the same potential as the upper electrode of the objective lens array (i.e. V3).

Exemplary ranges are shown in the left hand column of Table 1 as described above. The middle and right hand columns show more specific example values for each of V1 to V8 within the example ranges. The middle column may be provided for a smaller resolution than the right hand column. If the resolution is larger (as in the right hand column), the current per sub-beam is larger and therefore, the number of beams may be lower. The advantage of using a larger resolution is that the time needed to scan a "continuous area" is shorter (which can be a practical constraint). So the overall throughput may be lower, but the time needed to scan the beam area is shorter (because the beam area is smaller).

TABLE 1

| | | | |
|---|---|---|---|
| Landing Energy | >10-100 keV | 30 keV | 30 keV |
| V1 (or omitted) | 1-10 keV | 5 keV | 5 keV |
| V2 | >10-100 keV | 29.95 keV | 29.95 keV |
| V3 | 1-10 keV | 5 keV | 5 keV |
| V4 | >10-100 keV | 30 keV | 30 keV |
| V5 | >10-100 keV | 30 keV | 30 keV |
| V6 | 1-30 keV | 4.4 keV | 10 keV |
| V7 | 1-10 keV | 5 keV | 5 keV |
| V8 | >10-100 keV | 29.95 keV | 29.95 keV |

The device may comprise the control lens array 250 as described above. The control lens array 250 may be configured to decelerate the charged particle sub-beams along the sub-beam paths. This may be done by controlling potentials of electrodes within the control lens array 250. A main reason to use the control lens to decelerate the charged particle sub-beams is that this improves the performance of the objective lens array 241. The objective lens array comprises a positive elementary lens and a negative elementary lens which partly cancel out each other, but the aberrations add up. Generally, the larger the difference in beam energy between the two electrodes, the lower the aberration coefficients are.

The charge particle-optical device of the present disclosure may comprise the electric power source 290 configured to apply respective potentials to at least one electrodes of the control lenses of the control lens array 250 and/or the objective lenses of the objective lens array 241 in use. More specifically, the electric power source may be configured to provide a potential to the first electrode 242 and/or the second electrode 243. The electric power source 290 may be configured to apply any potential to any other additional electrodes provided as part of the array of objective lenses, including the third electrode 244 described above if present. The electric power source may additionally or alternatively be configured to apply a potential to the sample 208 in use. The electric power source may additionally or alternatively be configured to apply a potential to the detector array 240 in use. The electric power source may comprise multiple electric power sources which are each configured to provide potentials to any of the above-described components.

Figure 7:
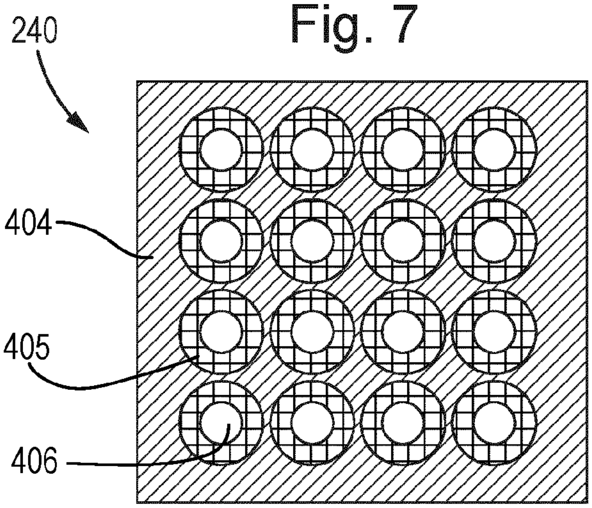
FIG. 7 is bottom view of the objective lens of FIG. 5 or FIG. 6.
Figure 8:
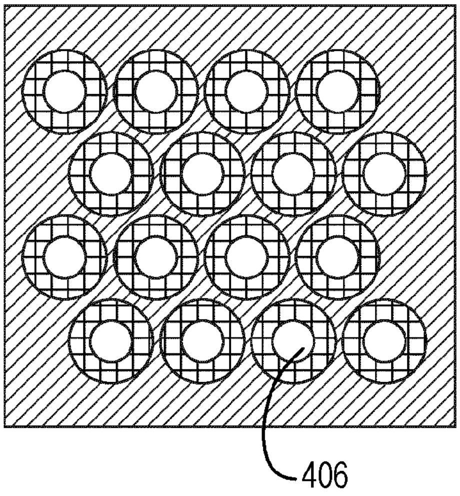
FIG. 8 is a bottom view of a modification of the objective lens of FIG. 5 or FIG. 6.

FIG. 7 is a bottom view of the detector array 240 which comprises a substrate 404 on which are provided a plurality of detector elements 405 each surrounding a beam aperture (or aperture) 406. The beam apertures 406 may be formed by etching through the substrate 404. In the arrangement shown in FIG. 7, the beam apertures 406 are shown in a rectangular array. The beam apertures 406 can also be differently arranged, e.g. in a hexagonal close packed array as depicted in FIG. 8. The beam arrangement of the hexagonal arrangement in FIG. 8 may be more densely packed than the square beam arrangement as shown in FIG. 7. As depicted, the detector elements 405 may be arranged in rectangular array or a hexagonal array.

Figure 9:
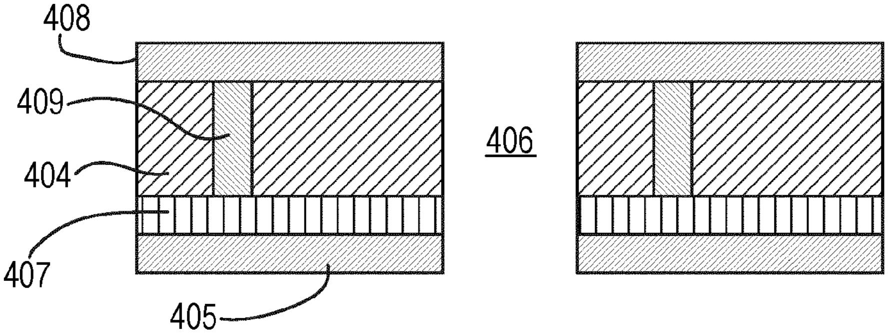
FIG. 9 is an enlarged schematic cross-sectional view of a detector incorporated in the objective lens of FIG. 5 or FIG. 6.

FIG. 9 depicts at a larger scale a part of the detector array 240 in cross section. The detector elements 405 form the bottommost, i.e. most close to the sample 208, surface of the detector array 240. Between the detector elements 405 and the main body of the substrate 404 a logic layer 407 may be provided. At least part of the signal processing system may be incorporated into the logic layer 407.

A wiring layer 408 is provided on the backside of, or within, the substrate 404 and connected to the logic layer 407 by through-substrate vias 409. The number of through-substrate vias 409 need not be the same as the number of beam apertures 406. In particular if the electrode signals are digitized in the logic layer 407 only a small number of through-silicon vias may be required to provide a data bus. The wiring layer 408 can include control lines, data lines and power lines. It will be noted that in spite of the beam apertures 406 there is ample space for all necessary connections. The detection module 402 can also be fabricated using bipolar or other manufacturing techniques. A printed circuit board and/or other semiconductor chips may be provided on the backside of detector array 240.

The integrated detector array described above is particularly advantageous when used with a tool having tunable landing energy as secondary electron capture can be optimized for a range of landing energies.

The detector array 240 may be implemented by integrating a CMOS chip detector into a bottom electrode of the objective lens array. Integration of a detector array 240 into the objective lens array 241 or other component of the charged particle-optical device allows for the detection of charged particles emitted in relation to multiple respective sub-beams. The CMOS chip is preferably orientated to face the sample (because of the small distance (e.g. 50 μm or less, 40 μm or less, 30 μm or less, 20 μm or less, or 10 μm) between the sample and a bottom of the charged particle-optical device and/or electron-optical system). In some embodiments, detector elements 405 to capture the secondary charged particles are formed in the surface metal layer of the CMOS device. The detector elements 405 can be formed in other layers. Power and control signals of the CMOS may be connected to the CMOS by through-silicon vias. For robustness, preferably a passive silicon substrate with holes shields the CMOS chip from high E-fields.

In order to maximize the detection efficiency it is desirable to make the surface of the detector elements 405 as large as possible, so that substantially all the area of the objective lens array 240 (excepting the apertures) is occupied by detector elements 405. Additionally or alternatively, each detector element 405 has a diameter substantially equal to the array pitch (i.e. the aperture array pitch described above in relation to the electrodes of the objective lens assembly 241). Therefore, the diameter of each detector element may be less than approximately 600 μm, and preferably between approximately 50 μm and 500 μm. As described above, the pitch may be selected depending on the intended distance L between the sample and the detector array 240. In some embodiments, the outer shape of the detector element 405 is a circle, but this can be made a square to maximize the detection area. Also the diameter of the through-substrate via 409 can be minimized A typical size of the electron beam is in the order of 5 to 15 micron.

Figure 13A:
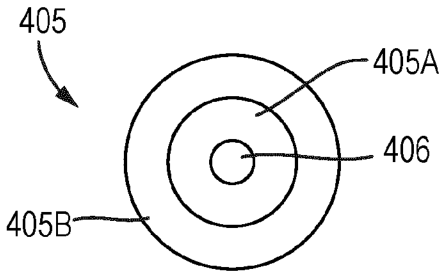
FIG. 13A and FIG. 13B show a bottom view of variations of a modified detector.
Figure 13B:
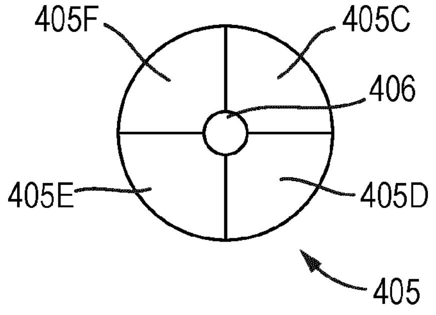

The detectors of the detector array are around respective apertures. In some embodiments, a single detector element 405 surrounds each beam aperture 406. In some embodiments, a plurality of detector elements 405 are provided around each beam aperture 406. The electrons captured by the detector elements 405 surrounding one beam aperture 406 may be combined into a single signal or used to generate independent signals. The detector elements 405 may be divided radially. The detector elements 405 may form a plurality of concentric annuluses or rings, for example as shown in FIG. 13A. The detector elements 405 may be divided angularly. The detector elements 405 may form a plurality of sector-like pieces or segments. The segments may be of similar angular size and/or similar area, for example as shown in FIG. 13B. The electrode elements may be separated both radially and angularly or in any other convenient manner.

However a larger surface for the detector elements 405 leads to a larger parasitic capacitance, so a lower bandwidth. For this reason it may be desirable to limit the outer diameter of the detector elements 405. Especially in case a larger detector element 405 gives only a slightly larger detection efficiency, but a significantly larger capacitance. A circular (annular) detector element 405 may provide a good compromise between collection efficiency and parasitic capacitance.

A larger outer diameter of the detector element 405 may also lead to a larger crosstalk (sensitivity to the signal of a neighboring hole). This can also be a reason to make the outer diameter of the detector element 405 smaller Especially in case a larger detector element 405 gives only a slightly larger detection efficiency, but a significantly larger crosstalk.

The charged particle current collected by detector element 405 is amplified, for example by an amplifier such as a TIA.

The detector used in the detector array of the charged particle-optical device may optionally be the detector described below in relation to FIG. 10, FIG. 11, and FIG. 12.

The charged particle-optical device may comprise the control lens array 250 as described above. As described, the control lens array can be positioned up-beam of the objective lens array 241 and each control lens can be associated with a respective objective lens 234. The charged particle optical device may be configured to form an intermediate focus between the control lens array 250 and the objective lens array 241. More specifically, the control lens array 250 may be configured to provide an intermediate focus between respective control lenses and corresponding objective lenses. As described above, the electron-optical device may be configured to control the objective lens assembly (e.g. by controlling potentials applied to electrodes of the control lens array 250) to control a focal length of the control lenses to form the intermediate foci between the control lens array 250 and objective lens array 241.

As mentioned previously, the provision of a control lens array 250 in addition to an objective lens array 241 provides additional degrees of freedom for controlling properties of the sub-beams. The additional freedom is provided even when the control lens array 250 and objective lens array 241 are provided relatively close together, for example such that no intermediate focus is formed between the control lens array 250 and the objective lens array 241. The control lens array 250 may be used to optimize a beam opening angle with respect to the demagnification of the beam and/or to control the beam energy delivered to the objective lens array 241. The control lens may comprise 2 or 3 or more electrodes. If there are two electrodes, then the demagnification and landing energy are controlled together. If there are three or more electrodes the demagnification and landing energy can be controlled independently. The control lenses may thus be configured to adjust the demagnification and/or beam opening angle of respective sub-beams (e.g. using the electric power source to apply suitable respective potentials to the electrodes of the control lenses and the objective lenses). This optimization can be achieved without having an excessively negative impact on the number of objective lenses and without excessively deteriorating aberrations of the objective lenses (e.g. without increasing the strength of the objective lenses).

The control lens array 250 can be used to deliver a low beam energy to objective lens array 241. This may be similar to the potential applied to the first electrode of the objective lens array 241 as discussed above, i.e. between approximately +3 kV to +8 kV, or preferably approximately +5 kV. The lower the entrance beam energy of the objective lenses, the shorter the focal length of the objective lenses. Therefore, as described above, an incoming beam energy below 5 kV typically leads to a focus inside the objective lens array 241. Generally, to provide the charged particle beam at the relevant energy into the objective lens array 241, the control lens array 250 is used to decelerate the charged particle beam, e.g. from approximately +30 kV to +5 kV. This will generate a cross over because of the large beam energy difference.

Preferably, the intermediate focusses 236 (interchangeably referred to as the intermediate foci) between respective control lenses and corresponding objective lenses are in a common plane as depicted in FIG. 3. Thus, preferably, the intermediate focusses 236 are positioned in a plane, and specifically, a plane between the control lens array and the objective lens array. Preferably the plane of the intermediate foci is positioned in a plane which is parallel to the control lens array and/or the objective lens array. Preferably, the intermediate focusses 236 are in an array of intermediate foci.

The charged particle-optical device may comprise an insulating structure, which may otherwise be referred to as a spacer. The insulating structure may be provided in the objective lens array. The insulating structure may be provided to separate, i.e. space apart, adjacent electrodes. The shape of the insulating structure may be selected specifically for the objective lens array and how it is to be used. The insulating structure may be provided to separate any adjacent electrodes provided, such as in the objective lens array 240, the condenser lens array (as depicted in FIG. 3) and/or control lens array 250.

The insulating structure could be provided between any adjacent electrodes in the objective lens array. For example, the insulating structure may be positioned between the first and second electrodes, e.g. if two electrodes are provided (as shown in FIG. 5). For example, the insulating structure may be positioned between a first and third electrode and/or between a second and third electrode if three electrodes are provided (as shown in FIG. 6).

Figure 10:
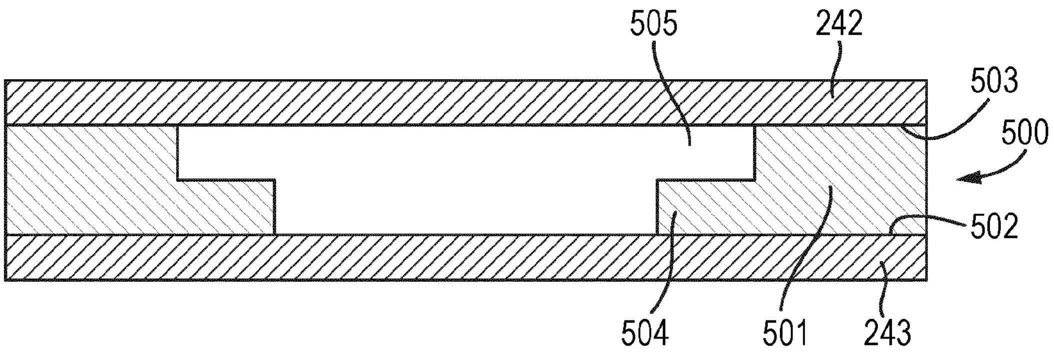
FIG. 10, FIG. 11.
Figure 11:
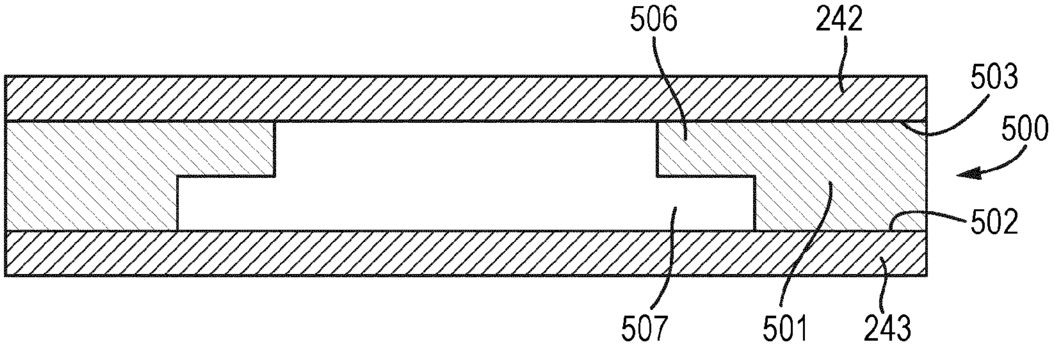
Figure 12:
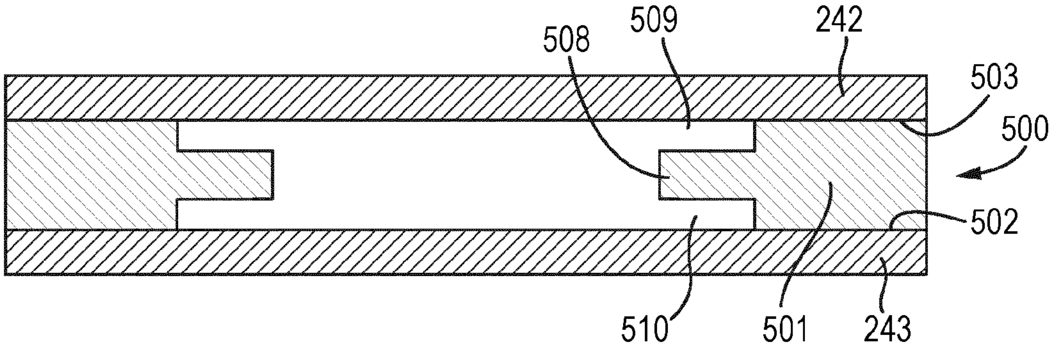
FIG. 12 are schematic cross-sectional views of an insulating structure used in some embodiments.

Exemplary shapes of the insulating structure 500 are shown in cross section in FIG. 10, FIG. 11, FIG. 12. The insulating structure 500 may comprise a main body 501 and a protrusion radially inwards of the main body 501. The main body 501 and the protrusion may be integral, i.e. may be formed of one single piece. The protrusion may provide a stepped surface The insulating structure 500, and more particularly the main body, may comprise a first side 502 and a second side 503. The second side 503 may oppose the first side 502. For example, the first side 502 may be a bottom surface of the insulating structure 500 and the second side 503 may be a top surface of the insulating structure 500. The main body may surround the multi-beam path. The main body may be a ring. The inner surface of the ring may provide the protrusion and the stepped surface.

The insulating structure 500 may be configured to optimise the projection of the charged particle beam through array of lenses, such as the objective lens array. Specifically, the shape of the insulating structure 500 may be beneficial in helping the objective lenses withstand the high electrostatic fields, such as in the accelerating direction and to reduce the risk of discharge. The insulating structure may be non-symmetrical when viewed in cross-section, as shown in FIG. 10 and FIG. 11. That is in cross-section the surface of the insulating structure facing the beam path may be stepped. The stepped surface may extend a path length over the surface of the insulating structure. The shortest path length over the stepped surface may exceed a creep length. At or below the creep length for the intended operating potential difference between the electrodes at the first side and second side of the insulating structure there is an elevated risk of discharge between the electrodes. The shape and/or geometry, especially the stepped surface and the protrusion may reduce the fields radially inwards of the insulating structure and the risk of discharge between the electrodes. Specifically, the gap and geometry of the spacer is selected to lower the field at the triple point (vacuum, electrode, spacer) at the more negative of the electrodes either side of the spacer. The use of an insulating structure as shown in FIG. 11 is described in US 2011/0216299, the contents of which are hereby incorporated by reference at least so far as the geometry of the described insulated structure and its function.

In the example in which the charged particles are accelerated towards the sample 208 by the array of objective lenses 241, the insulating structure 500 may be positioned between adjacent electrodes of the objective lens array 241 to optimise acceleration of the charged particles through the objective lens array.

When in place between the adjacent electrodes of the objective lens array, one of the electrodes contacts the main body and the protrusion on the first side of the insulating structure, and the main body contacts an other of the electrodes on the second side of the insulating structure and a gap is defined between the protrusion and the other of the electrodes. In other words, the main body and protrusion contacts one of the electrodes, but only the main body contacts the other electrode. Thus, the insulating structure provides a gap between the protrusion and at least one of the electrodes.

Such an insulating structure 500 is shown in FIG. 11 wherein the first electrode 242 contacts the main body and the protrusion 506 on the first side 503 of the insulating structure 500. The main body 501 contacts the second electrode 243 on the second side of the insulating structure 500. A gap 507 is provided between the protrusion 506 and the second electrode 243 (down-beam of the first electrode 242).

In some embodiments, the objective lens array 241 is an exchangeable module, either on its own or in combination with other elements such as the control lens array and/or detector array. The exchangeable module may be field replaceable, i.e. the module can be swapped for a new module by a field engineer. In some embodiments, multiple exchangeable modules are contained within the tool and can be swapped between operable and non-operable positions without opening the tool.

In some embodiments, the exchangeable module comprises an electron-optical component, and specifically may be the charged particle-optical device, which is on a stage permitting actuation for positioning of the component. In some embodiments, the exchangeable module comprises a stage. In an arrangement the stage and the exchangeable module may be an integral part of the tool 40. In an arrangement the exchangeable module is limited to the stage and the device, such as the charged particle-optical device, it supports. In an arrangement the stage is removable. In an alternative design the exchangeable module comprising the stage is removable. The part of the tool 40 for the exchangeable module is isolatable, that is the part of the tool 40 is defined by a valve up-beam and a valve down-beam of the exchangeable module. The valves can be operated to isolate the environment between the valves from the vacuum up-beam and down-beam of the valves respectively enabling the exchangeable module to be removed from the tool 40 whilst maintaining the vacuum up-beam and down-beam of the part of the tool 40 associated with the exchangeable module. In some embodiments, the exchangeable module comprises a stage. The stage is configured to support a device, such as the charged particle-optical device, relative to the beam path. In some embodiments, the module comprises one or more actuators. The actuators are associated with the stage. The actuators are configured to move the device relative to the beam path. Such actuation may be used to align the device and the beam path with respect to each other.

In some embodiments, the exchangeable module is a microelectromechanical systems (MEMS) module. MEMS are miniaturized mechanical and electromechanical elements that are made using microfabrication techniques. In some embodiments, the exchangeable module is configured to be replaceable within the electron-optical tool 40. In some embodiments, the exchangeable module is configured to be field replaceable. Field replaceable is intended to mean that the module may be removed and replaced with the same or different module while maintaining the vacuum in which the electron-optical tool 40 is located. Only a section of the tool 40 is vented corresponding to the module is vented for the module to be removed and returned or replaced.

The control lens array 250 may be in the same module as an objective lens array 241, i.e. forming an objective lens array assembly or objective lens arrangement, or it may be in a separate module.

In some embodiments, one or more aberration correctors are provided that reduce one or more aberrations in the sub-beams. The one or more aberration correctors may be provided in any of the embodiments, e.g. as part of the charged particle-optical device, and/or as part of an optical lens array assembly, and/or as part of an assessment tool. In some embodiments, each of at least a subset of the aberration correctors is positioned in, or directly adjacent to, a respective one of the intermediate foci (e.g. in or adjacent to the intermediate image plane). The sub-beams have the smallest cross-sectional area in or near a focal plane such as the intermediate plane. This provides more space for aberration correctors than is available elsewhere, i.e. upbeam or downbeam of the intermediate plane (or than would be available in alternative arrangements that do not have an intermediate image plane).

In some embodiments, aberration correctors positioned in, or directly adjacent to, the intermediate foci (or intermediate image plane) comprise deflectors to correct for the source 201 appearing to be at different positions for different beams Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses 231 (e.g. with each such aberration corrector being integrated with, or directly adjacent to, one or more of the condenser lenses 231). This is desirable because at or near the condenser lenses 231 aberrations will not yet have led to a shift of corresponding sub-beams because the condenser lenses are vertically close or coincident with the beam apertures. A challenge with positioning correctors at or near the condenser lenses, however, is that the sub-beams each have relatively large sectional areas and relatively small pitch at this location, relative to locations further downstream (or down-beam). The condenser lenses and correctors may be part of the same structure. For example they may be connected to each other, for example with an electrically isolating element. The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In some embodiments, each of at least a subset of the aberration correctors is integrated with, or directly adjacent to, one or more of the objective lenses 234. In some embodiments, these aberration correctors reduce one or more of the following: field curvature; focus error; and astigmatism. The objective lenses and/or control lenses and correctors may be part of the same structure. For example they may be connected to each other, for example with an electrically isolating element. Additionally or alternatively, one or more scanning deflectors (not shown) may be integrated with, or directly adjacent to, one or more of the objective lenses 234 for scanning the sub-beams 211, 212, 213 over the sample 208. In some embodiments, the scanning deflectors described in US 2010/0276606, which document is hereby incorporated by reference in its entirety, may be used.

The charged particle-optical device described above may comprise at least the objective lens array 241. Thus, in certain embodiments, the charged particle optical device may be an objective lens array assembly and may have components as described above in relation to the objective lens array assembly.

In a second aspect for example, the objective lens assembly is for projecting a multi-beam of charged particles towards a sample surface. The objective lens assembly comprises an objective lens array 241 and a detector array 240. The objective lens array 241 may comprise any or all of the features described in relation to the objective lens array 241 above. The detector array 240 may comprise any or all of the features described in relation to the detector array 240 above. The objective lens assembly is configured to detect backscattered charged particles.

The objective lens array 241 comprises at least two electrodes arranged along the path of the multi-beam, and in which are defined a plurality of apertures. For example, the objective lens array 241 comprises at least the first electrode 242 and the second electrode 243. The detector array 240 is configured to detect charged particles emanating from the sample in response to the multi-beam. The detector array 240 is positioned down-beam of the objective lens array 241.

The detector array 240 is configured to be positionable proximate to the sample 208 and may have a distance L between the sample 208 and the detector array as described in the first aspect.

The detector array potential, sample potential, first electrode potential and/or second electrode potential may be set as described above in relation to the first aspect.

The objective lens assembly of the second aspect, for example, may have any or all features of the charged particle-optical device described above. In particular, the objective lens array assembly may comprise a control lens array 250, and/or the scan-deflector array 260.

In a third aspect, a charged particle optical device is provided in which the charged particle optical device is configured to switch between two operation states. The two operation states vary between primarily detecting backscatter charged particles and primarily detecting secondary charged particles. The charged particle optical device of the third aspect, for example, may include any or all of the features described in relation to the above aspects and embodiments. Features that are the same as those described above are given the same reference numerals. For conciseness, such features are not described in detail below.

As described, detection of secondary charged particles and backscatter charged particles are both useful, but different information can be obtained through detection of secondary charged particles and backscatter charged particles. Thus, there is a clear benefit in providing a device which supports detection of both secondary charged particles and backscatter charged particles. Particularly, there is a benefit of providing a device which can easily support switching between detection of secondary charged particles and backscatter charged particles, and vice versa.

As above, the charged particle optical device is suitable for any charged particle system, e.g. a charged particle assessment tool, i.e. assessment tool 40. The device is configured to project an array of beams of charged particles towards a sample; i.e., device is configured to project a multi-beam of charge particles along sub-beam paths towards a sample 208. The multi-beam comprising sub-beams. The device comprises an objective lens array 241 configured to project an array of charged particle sub-beams onto the sample 208. In other words, the device comprises an objective lens array 241 configured to project the beams onto the sample 208. The device further comprises a detector array configured to capture charged particles emitted from the sample 208. In other words, the device comprises an array of detectors (i.e. detector array 240) configured to detect backscatter particles from the sample. As described above, the detector array 240 may be positioned so to face the sample 208. Preferably, the objective lens array 241 comprises the detector array 240 and/or the detector array 240 is positioned on or adjacent to the objective lens array 241 as described above.

The device is configured to switch between two operation states. In a first operation state, the detectors are configured to detect more secondary charge particles than backscatter charged particles. In other words, in the first operation state, the detectors are configured to detect primarily secondary charged particles. In a second operation state, the detectors are configured to detect more backscatter charge particles than secondary charge particles. In other words, in the second operation state, the detectors are configured to detect primarily backscatter charged particles.

Various different features of the device may be switched between the first operation state and the second operation state. It will be understood that in the first operation state, the device is configured to optimise detection of secondary charge particles and in the second operation state, the device is configured to optimise detection of backscatter charge particles. Thus, in the first operation state, primarily secondary charged particles may be detected. In the second operation state, primarily backscatter charged particles may be detected.

In the second operation state, the device is configured to accelerate the charged particle beam onto the sample 208, and preferably, the objective lenses are configured to accelerate the charged particle beam onto the sample 208. Thus, in the second operation state, the device, and more specifically the objective lens array 241 may operate as described above in order to accelerate the charged particle beam onto the sample 208. In the second operation state, the objective lens array 241 may be configured to repel the secondary charged particles as above.

In the first operation state, the objective lenses are configured to decelerate the charged particle beam onto the sample 208. Multi-beam systems, such as the electron beam tool 40 and charged particle beam inspection apparatus 100 which are operated to decelerate the charged particle beam onto the sample are known and could be used in the first operation state. As discussed, these known systems are useful for detecting secondary charged particles. Thus, the device can be operated in line with such systems when obtaining information from secondary charged particles.

For example, the deceleration may be carried out by selecting which potential are applied to the electrodes of the objective lens array 240. FIG. 4. was described above in relation to the system to show how potentials can be applied to the control lens array 250, the objective lens array 240 and the sample 208. The values of the potentials provided for the accelerating lens might be swapped and adjusted to provide a deceleration.

For example only, the electrons may be decelerated from 30 kV to 2.5 kV in the objective lens. In an example, to obtain landing energies in the range of 1.5 kV to 5 kV, potentials shown in FIG. 4, such as V2, V3, V4, V5, V6 and V7, can be set as indicated in Table 2 below. The potentials and landing energies shown in Table 2 are examples only and other landing energies could be obtained, for example, the landing energy could be lower than 1.5 kV (e.g. approximately 0.3 kV or 0.5 kV) or higher than 5 kV. The potentials in this table are given as values of beam energy in keV, which is equivalent to the electrode potential relative to the cathode of the beam source 201. It will be understood that in designing an electron-optical system there is considerable design freedom as to which point in the system is set to a ground potential and the operation of the system is determined by potential differences rather than absolute potentials.

TABLE 2

| Landing Energy | 1.5 keV | 2.5 keV | 3.5 keV | 5 keV |
|---|---|---|---|---|
| V1 (or omitted) | 29 keV | 30 keV | 31 keV | 30 keV |
| V2 | 1.55 keV | 2.55 keV | 3.55 keV | 5.05 keV |
| V3 | 29 keV | 30 keV | 31 keV | 30 keV |
| V4 | 1.5 keV | 2.5 keV | 3.5 keV | 5 keV |
| V5 | 30 keV | 30 keV | 30 keV | 30 keV |
| V6 | 19.3 keV | 20.1 keV | 20.9 keV | 30 keV |
| V7 | 29 keV | 30 keV | 31 keV | 30 keV |
| V8 | 1.55 keV | 2.55 keV | 3.55 keV | 5.05 keV |

As mentioned above, the objective lens array as shown in FIG. 4 may comprise an additional electrode, e.g. a middle electrode positioned between the upper and lower electrodes of the objective lens array as shown in FIG. 4. A voltage source V1 may be configured to apply a potential to the middle electrode. This middle electrode is optional and may not be included with the electrodes having the other potentials listed in Table 2.

It will be seen that the beam energy at V1, V3 and V7 is the same. In embodiments the beam energy at these points may be between 10 keV and 50 keV. If a lower potential is selected, the electrode spacings may be reduced, especially in the objective lens, to limit reduction of the electric fields.

Although the control lens array 250 and the objective lens array 240 are shown in FIG. 4 with three electrodes, the control lens array 250 and/or the objective lens array 240 may be provided with two lenses.

As described above, the objective lens array comprises at least the first electrode 242 configured to have first electrode potential and the second electrode 243 configured to have the second electrode potential. The first electrode 242 being up-beam of the second electrode 243. An electric power source 290 may be provided for providing potentials as described above. Thus, the electric power source 290 is configured to apply the first electrode potential to the first electrode 242 and the second electrode potential to the second electrode 243. The electric power source 290 is configured to apply a potential as relevant depending on the operation state. Thus, the potential applied to the first electrode and the second electrode may be changed depending on the relevant operation state of the device.

In the first operation state, the first electrode potential may be more positive than the second electrode potential. Additionally or alternatively, in the second operation state, the second electrode potential may be more positive than the first electrode potential. Controlling the potentials and altering them between the first and second operation state will alter how the charged particle beam travels through the objective lens array and thus, will affect whether or not the charged particles are accelerating or decelerating. Varying the electrodes in this way will affect the landing energy of the charged particle sub-beams Thus, the device may be configured to project the charged-particle sub-beams onto the sample at a lower landing energy in the first operation state and a higher landing energy in the second operation state.

The potentials applied to the first and second electrode may be as described above and may be swapped around. Additionally, the sample may be at the sample potential as described above such that the secondary charged particles are repelled from the objective lens array.

Additional or alternative adjustments may also be made when switching between the first operation state and the second operation state.

For example, the device may be configured to maintain a focus of the charged-particle sub-beams on the sample in the first and second operation states. More specifically, the objective lens array 241 may be configured to maintain a focus of the charged-particle sub-beams on the sample in the first and second operation states. For example, when switching between the first operation state and the second operation state and vice-versa, the first electrode potential (i.e. the potential of the upper electrode) of the objective lens array 241 may be adjusted to maintain the focus of the primary beam on the sample 208 in the first and second operation states. If the first electrode potential is adjusted to maintain the focus of the charged-particle sub-beams on the sample 208, the distance between the objective lens array 241 and the sample 208 may be maintained.

For example, when switching between the first operation state and the second operation state and vice-versa, the device may be configured to alter a distance between the objective lens array 241 and sample 208. The distance between the objective lens array 241 and sample 208 may be adjusted to account for a difference in the landing energy between the first operation state and the second operation state. The distance may be changed by the order of a few millimetres, or less than a millimetre, or by the order of a few hundred microns, or less.

For example, the device may be configured to reduce a distance between the objective lens array 241 and the sample 208 so as to switch from a first operation state to a second operation state. Additionally or alternatively, the device may be configured to increase a distance between the objective lens array 241 and the sample 208 so as to switch from a second operation state to the first operation state.

Preferably, the distance between the detector array 240 and sample 208 is beneficially maintained in the above examples, i.e. when the first electrode potential and/or the distance between the objective lens array 241 and the sample 208 are changed. The detector array 240 may be moved relative to the objective lens array 241 to maintain the distance between the detector array 240 and the sample 208. The movement of the detector array 240 may be made either whilst the objective lens array 241 is moved relative to the sample 208 or whilst altering the position of the sample relative to the objective lens array 241 along the beam path (i.e. then the detector array 240 tracks the sample along the beam path.

Alternatively, it may be beneficial to alter the distance between the detector array 240 and the sample 208 to focus charged particles emitted from the sample 208 onto the detector array 240. In particular, the distance between the detector array 240 and the sample 208 may be altered between the first operation state and the second operation state so that the secondary charged particles are focused on the detector array 240 when in the first operation state and the backscattered charged particles are focused on the detector array 240 when in the second operation state.

If the detector array 240 is to be moved relative to the sample 208, this could be done by controlling the position of the detector array 240 relative to the objective lens array 241 or by controlling the position of the detector array 240 relative to the sample 208. Any appropriate actuator could be used to move the detector array 240, i.e. relative to the objective lens array 241 and/or relative to the sample 208.

One way that the device may switch between the first and second operation states involves providing a charged particle-optical device which comprises, or is provided in the form of, a switchable module. The switchable module may comprise an objective lens array and a detector array, and optionally a control lens array. Thus, the switchable module may be a switchable objective lens array assembly A switchable module may be provided for each operating state. Thus, different insulating structures may be provided for different switchable modules depending on which operating state it is to be used for. The switchable module may provide the objective lens array 241 at a different position so that the objective lens array is provided in a different position with respect to the sample 208. In other words, different switchable modules may have the detector array at different distances from the sample along the sub-beam path 220. The detectors used in the detector arrays may be different for different switchable modules depending on which operating state it is to be used for. The detector array 240 in the different modules may be kept at the same distance with respect to the sample 208, or the distance between the detector and the sample might be different between modules to account for the charged particles emitted from the sample 208 which will be detected by the detector array 241.

In the device, insulating structures may be provided between adjacent electrodes as described above. The insulating structures may be different depending on which operation state is preferable. For example, for a second operation state, the insulating structure may be as described in relation to FIG. 11. For a first operation state, the insulating structure may be provided as shown in FIG. 10. This is similar to the insulating structure of FIG. 11, expect that the gap 505 is provided between the up-beam electrode (i.e. the first electrode 242) and the radially inwards protrusion 504. This insulating structure may be particularly beneficial for optimizing passage of the charged particle beam through the objective lens array 241 when the beam is being decelerated for example for the reasons set out here. In the arrangement shown in FIG. 11 the first electrode 242 has a potential less positive than the second electrode 243. In the arrangement the protrusion is in contact with the first electrode 242. Whereas in the arrangement of FIG. 10, the first electrode 242 has a potential more positive than the second electrode 243, so the direction of the potential difference between the electrodes is different, i.e. opposing, to the arrangement depicted in FIG. 11. That is why in this example the protrusion is in contact with the second electrode 243. By selecting the location of the protrusion, i.e. in contact with the first or second electrode, the risk of undesired discharge may be reduced.

The switchable modules may be controlled and adapted as described above in relation to the first aspect.

Another way that the device may switch between the first and second operation states involves providing a charged particle-optical device which can be adjusted to operate in both operation states, i.e. a hybrid charged particle-optical device (referred to as a hybrid device) which can be used in both the first operation state and the second operation state. In this instance, the distance between the objective lens array 241 and the sample 208 may be adapted when switching states. In this instance, the potentials applied to the electrodes may be adapted when switching states. In this instance, an insulating structure may be provided which is suitable for both operation states. In this instance, an array of detectors which are suitable for both modes of operation may be provided (as described below in the fourth aspect).

In the hybrid device, adjacent electrodes are separated by an insulating structure which is configured for use in the first operation and the second operation, preferably wherein the objective lens array comprises the insulating structure. Such an insulating structure may be provided as shown in FIG. 12 and may be referred to as a hybrid insulating structure. The hybrid insulating structure is similar to the insulating structures shown in FIG. 10 and FIG. 11, expect that a gap 509, 510 is provided on either side of the radially inward protrusion 508. Thus, the electrodes either side of the hybrid insulating structure are in contact with the main body 501. However, the radially inward protrusion 508 does not contact either of the first electrode 242 or the second electrode 243.

In further detail, the insulating structure 500 is formed of the main body 501 and the protrusion 508 radially inwards of the main body 501. The main body 501 features a first and second side, the first side 503 opposing the second side 502. On the first side 503 of the insulating structure the main body 501 contacts one of the electrodes (e.g. the first electrode 242) and a first gap 509 is formed between the protrusion 508 and the one of the electrodes 242. On the second side 502 of the insulating structure, the main body 501 contacts an other one of the electrodes (e.g. the second electrode 243) and a second gap is formed between the protrusion 508 and the other of the electrodes (e.g. the second electrode 243).

The hybrid device may be configured to move the objective lens array and/or the sample with respect to each other along the sub-beam paths 220 so as to switch between the first and second operation states. For example, the device may comprise an actuator 248 configured to move the objective lens array so as to alter the distance between the objective lens array and the sample. The actuator 248 may be part of the objective lens array assembly. Disclosure of a device featuring an actuator to displace the detector along the multi-beam path is European Patent Application 20198201.4 filed on 24 Sep. 2020 which is hereby incorporated by reference with respect to the design and use of an actuator to actuate a detector array relative to an objective lens array.

Additionally or alternatively, the hybrid device is configured to move the sample so as to alter the distance between the objective lens array 241 and the sample 208. For example, the device may comprise the motorized stage 209 (and optionally the sample holder 207) which can be used to alter the position of the sample.

As described above in relation to the third aspect, for example, it is beneficial to provide a device which can switch between detection of secondary charged particles and backscatter charged particles. A fourth aspect provides a detector that may be provided to operate in two operating states. The detector can be provided as part of the charged particle optical device of the any of the previous aspects and embodiments and may include any or all of the features described in relation to the detector and/or detector arrays of the above aspects and embodiments. Features that are the same as those described above are given the same reference numerals. For conciseness, such features are not described in detail below.

In the fourth aspect is provided a detector for a charged particle assessment tool, wherein the detector is configured to capture charged particles emitted from a sample. In other words, the detector is configured to detect charged particles emitted from the sample.

The detector is configured to switch between two operation states. In a first operation state, the at least one detector is configured to detect more secondary charged particles than backscatter charged particles, and in a second operation state, the at least one detector is configured to detect more backscattered charged particles than secondary charged particles.

The detector is configured to switch between two operation states. The detector may comprise an inner detecting portion surrounding the aperture and an outer detecting portion, radially outwards of the inner detecting portion (as shown and described in relation to FIG. 13A). The detecting portions are described in further detail below. The two states may use a different configuration of the detector (i.e. a different configuration of detecting portions).

The difference in energy between the secondary charged particles and the backscattered charged particles results in the charged particles being affected different amounts by the potentials discussed above. Backscattered charged particles may be more likely to be detected over the whole area of the detector. However, secondary charged particles tend to be detected more towards the middle of the detector. This is because the secondary charged particle generally have small average energies (i.e. less than the backscattered charged particles and typically close to 0V). Thus, the trajectories of the secondary charged particles are more significantly changed (i.e. collimated) by the field, for example compared to backscatter charged particles which, on average, have larger energies. The more the secondary charged particles are accelerated, the more their angle becomes parallel to the optical axis (i.e. the sub-beam paths). As a result, the secondary charged particles do not spread out that much, i.e. the trajectory of secondary charged particles tends to be more collimated with the sub-beam path than the trajectory of backscatter charged particles. It is beneficial to provide a detector which can support detection of secondary charged particles and backscatter charged particles separately from each other. In particular, as the charged particles can be used to determine different information, it is beneficial to control the detection to detect either secondary charged particles or backscatter charged particles.

Thus, the detector of the fourth aspect is particularly useful in that it can allow switching between two different detection states. Thus, the detector is configured to be operated to detect primarily backscattered charged particles in one state and to detect primarily secondary charged particles in another state. As described in further detail below, the detector is divided radially (i.e. to form a plurality of concentric annuluses).

Although the detector of the fourth aspect is described above in the context of switching between two operation states, the detector may be more generally provided as described here. The detector as described here may be used for continuous or substantially continuous detection.

In the fourth aspect a detector for a charged particle assessment tool is provided: the detector comprises multiple portions. Thus, the detector may be provided with multiple portions, and more specifically, multiple detecting portions. The different portions may be referred to as different zones. Thus the detector may be described to have multiple zones or detection zones. Such a detector may be referred to as a zoned detector.

Figure 22:
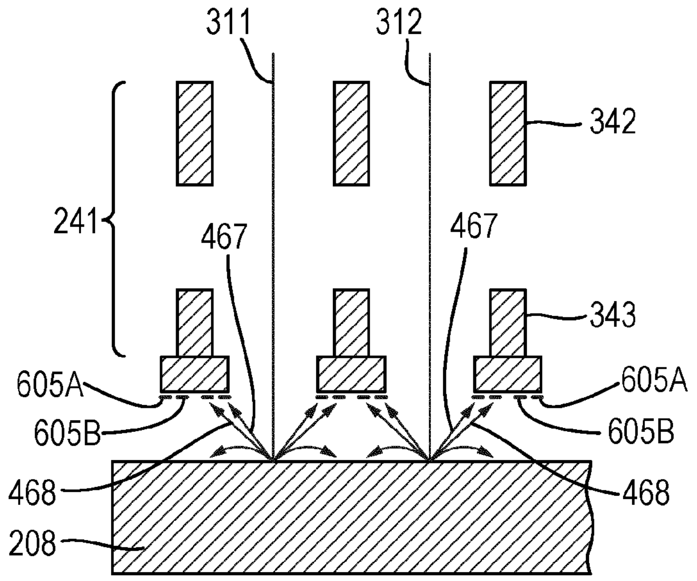
FIG. 22 is a schematic cross-sectional view of an objective lens according to some embodiments using the detector of FIG. 13A.

The detector comprising multiple portions (e.g. as described below) may be provided in any of the detector arrays described herein. In particular, the detector comprising multiple portions may be used for at least one of the array of mirror detectors 350, upper array of detectors 370, above-lens array of detectors 380, down-beam array of detectors 360, and/or any additional array of detectors. An example of this is shown in FIG. 22, which uses the detector shown in FIG. 13A.

The zoned detector may be associated with one of the sub-beams 211, 212, 213. Thus, the multiple portions of one detector may be configured to detect signal particles emitted from the sample 208 in relation to one of the sub-beams 211, 212, 213. The detector comprising multiple portions may be associated with one of the apertures in at least one of the electrodes of the objective lens assembly. More specifically, the detector 405 comprising multiple portions may be arranged around a single aperture 406 as shown in FIG. 13A and FIG. 13B, which provide examples of such a detector.

The portions of the zoned detector may be separated in a variety of different ways, e.g. radially, annular, or any other appropriate way. Preferably the portions are substantially the same size and/or shape. The separated portions may be provided as a plurality of segments, a plurality of annular portions (e.g. a plurality of concentric annuli), a plurality of sector portions (i.e. radial portions or sectors). For example, the at least one detector 405 may be provided as annular portions comprising 2, 3, 4, or more portions. More specifically, as shown in FIG. 13A, the detector 405 may comprise an inner annular portion 405A surrounding aperture 406 and an outer annular portion 405B, radially outwards of the inner annular portion 405A. Alternatively, the detector may be provided as sector portions comprising 2, 3, 4, or more portions. If the detector is provided as two sectors, each sector portion may be a semi-circle. If the detector is provided as four sectors, each sector portion may be a quadrant. This is shown in FIG. 13B in which the 405 is divided into quadrants, i.e. four sector portions is shown in FIG. 13B, as described below. Alternatively, the detector may be provided with at least one segment portion.

Each portion may have a separate signal read-out. The detector being separated into portions, e.g. annular portions or sector portions, is beneficial in that it allows more information to be obtained in relation to the signal particles detected. Thus, providing the detector 405 with multiple portions may be beneficial in obtaining additional information relating to the detected signal particles. This can be used to improve the signal to noise ratio of the detected signal particles. However, there is an additional cost in terms of the complexity of the detector.

In an example, the detector may be divided into two (or more) concentric rings, for example, as depicted in FIG. 13A.

As shown in FIG. 13A, the detector, in which an aperture 406 is defined and configured for the through passage of a charged particle beam, comprises inner detecting portion 405A and outer detecting portion 405B. The inner detecting portion 405A surrounds the aperture 406 of the detector. The outer detecting portion 405B is radially outwards of the inner detecting portion 405A. The shape of the detector may be generally circular. Thus, the inner detecting portion and the outer detecting portion may be concentric rings.

Even without switching the operation state of the detector, providing multiple portions concentrically or otherwise may be beneficial. Specifically, different portions of the detector may be used to detect different signal particles, which may be smaller angle signal particles and/or larger angle signal particles, or secondary charged particles and/or backscatter charged particles. Such a configuration of different signal particles may suit a concentrically zoned detector.

In this case, signal particles with smaller angles (e.g. small angle backscatter charged particles) may contribute mostly to the inner annular portion 405A and signal particles with larger angles (e.g. large angle backscatter charged particles) may contribute mostly to the outer annular portion 405B. In other words, the inner ring may be used for detection of small-angle backscatter charged particles and the outer ring may be used for detection of large-angle backscatter charged particles. As the portions of the detector may result in separate signals, this means that the detection of small and large angle charged particles can be detected separately. The different angled backscattered charged particles may be beneficial in providing different information. For example, for signal electrons emitted from a deep hole, small-angle backscattered charged particles are likely to come more from the hole bottom, and large-angle backscattered charged particles are likely to come more from the surface and material around the hole. In an alternative example, small-angle backscattered charged particles are likely to come more from deeper buried features, and large-angle backscattered charged particles are likely to come more from the sample surface or material above buried features.

The width (e.g. diameter) of the first detecting portion may be approximately 2 μm to 100 μm. The width (e.g. diameter) of the first detecting portion may be less than or equal to approximately 100 μm. The width (e.g. diameter) of the first detecting portion may be greater than or equal to approximately 2 μm. The width (e.g. diameter) of the second detecting portion may be less than or equal to approximately 250 μm. The width (e.g. diameter) of the second detecting portion may be less than or equal to approximately 150 μm. The width (e.g. diameter) of the second detecting portion may be greater than or equal to approximately to 10 μm. The width (e.g. diameter) of the second detecting portion may be approximately 10 μm to 250 μm. Preferably, the width of the second detecting portion may be approximately 10 μm to 150 μm. The size of the corresponding portions, e.g. the width/diameter of the inner annular portion 405A and/or the outer annular portion 405B may be designed or selected in order to detect the particular charged particles of interest at each of the portions of the detector.

For the switching configuration of the device with concentrically zoned detectors in which the zones are used alternately, as depicted in FIG. 13A the diameter of the first detecting portion in such an arrangement is preferably approximately 40-60 μm, and preferably approximately 30-50 μm. The diameter of the second detecting portion in such an arrangement is preferably approximately 150 to 250 μm, and preferably approximately 200 μm. The diameter of the aperture of the detector in such an arrangement may be approximately 5 to 30 μm, and preferably approximately 10 μm.

In the first operation state, the detector 405 uses the inner detecting portion 405A and not the outer detecting portion 405B. This is beneficial as it limits the detection of backscatter charged particles during detection of the secondary charged particles. As most of the secondary charged particles would be detected by the inner detecting portion, this does not result in a too much information being lost from undetected secondary charged particles.

In the second operation state, the detector 405 uses at least the outer detecting portion 405B. When the backscatter charged particles are being detected, the device as described above may be set up so as to repel secondary charged particles which will reduce the number of secondary charged particles detected. Therefore, as other mechanisms may be put into place to reduce or avoid detection of secondary electrons when detecting backscatter charged particles, the whole detector available can be used for detecting backscatter charged particles which is beneficial in capturing information relating to more of the backscattered charged particles.

There may be additional operation states, e.g. in which both the inner detecting portion 405A and the outer detecting portion 405B are used simultaneously (for example, as described further below).

The distance at which the detector is provided relative to a sample 208 and/or the pitch p may affect which of the outer detecting portion and/or the inner detecting portion might be used for detecting backscattered charged particles and/or secondary charged particles. For example, it is generally described above that in the inner detecting portion is used for detecting secondary charged particles and the outer detecting portion (and optionally also the inner detecting portion) are used for detecting backscattered charged particles. This may be the case, for example only, when the detector is provided approximately 50 microns from the sample with a pitch of approximately 300 microns. However, if the distance between the detector and the sample is approximately 10 microns and the pitch p is approximately 70 microns, the detector may only be used to detect backscattered charged particles (as secondary charged particles will likely end up in the aperture) and the inner detecting portion may be used for detecting backscattered charged particles. Either way, it is understood that the separated inner and outer portions can be used to beneficially switch between detecting primarily backscattered charged particles and/or primarily secondary charged particles.

Figure 14:
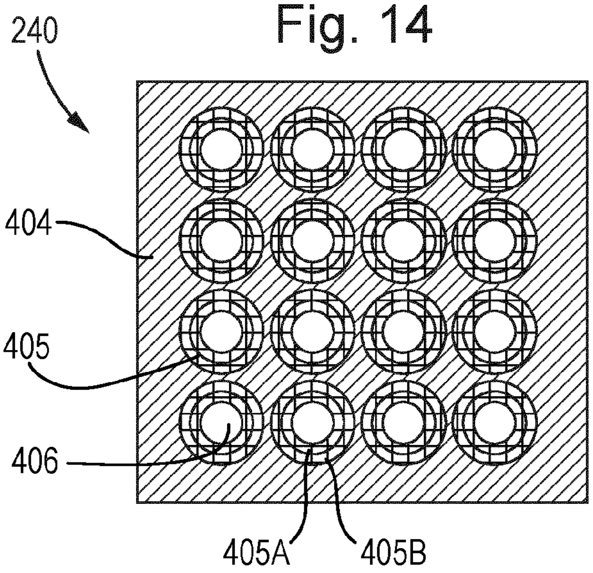
FIG. 14 is bottom view of the objective lens of FIG. 5 or FIG. 6 using a modified detector of FIG. 13A.
Figure 15:
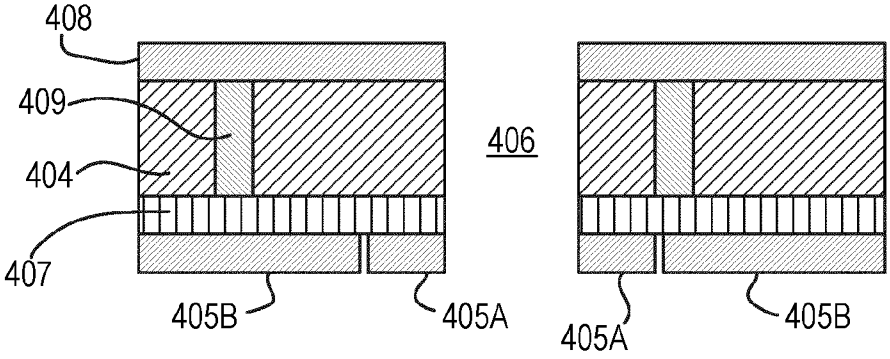
FIG. 15 is an enlarged schematic cross-sectional view of a detector incorporated in the objective lens of FIG. 5 or FIG. 6 using the modified detector of FIG. 13A.

Multiple detectors may be provided. The multiple detectors may be provided as a detector array, as shown in FIG. 14. The detector array is for a charged particle assessment tool configured to operate in a backscatter operational state (i.e. the second state) to detect preferably backscatter charged particles, and a secondary charged particle state (i.e. the first state) to detect preferably secondary charged particles. The detectors of the detector array may be as described with any of the variations of the fourth aspect.

The detector may have features as described in relation to the detector/detector array of the first aspect. For example, although the outer shape of the detector is shown to be a circle, but this can be made a square to maximize the detection area. For example, although FIG. 14 depicts the beam apertures 406 in a rectangular array, the beam apertures 406 can also be differently arranged, e.g. in a hexagonal close packed array as depicted in FIG. 8. For example, cross section of FIG. 15 corresponds to the cross-section of FIG. 9, expect for the detecting portion being provided as an inner portion 405A and an outer portion 405B and thus the detector may comprise the same features as described in relation to FIG. 9 above.

As described, the detector of the fourth aspect, for example, may be used in any of the above aspect and embodiments. In particular, a charged particle-optical device for a for a multi-beam charged particle assessment tool may be provided. The charged particle-optical device comprising an objective lens array and a detector array, the detector array comprising an array of detectors as described in relation to the fourth aspect. The apertures in the electrodes of objective lens array and the detector array are arranged on sub-beam paths of the charged particle multi-beam. Furthermore, if the charged particle optical device of the third aspect, for example, is used with the detector of the fourth aspect, the detector could be used with either variation. However, the detector of the fourth aspect would be particularly useful for the hybrid device, as the detector could be switched between a first operation state and a second operation state in accordance with the hybrid device. For example, in the third aspect and using the detector of the fourth aspect, the device may be configured to use the detector in the appropriate operating state.

It may be beneficial to provide a device which can be used to detect different types of signal particles, for example both backscatter and secondary charged particles, simultaneously (e.g. in which both the inner detecting portion 405A and the outer detecting portion 405B can be used simultaneously). However, a device used to detect different types of signal particles simultaneously, such as both backscatter charged particles and secondary charged particles, may not effectively discriminate between the different types of signal particles, i.e. in the provided example secondary and backscatter charged particles. This may be the case, for example, if the detector detects without distinguishing between the different types of signal particle, e.g. by detecting the net charge arriving on it (i.e. a charge detector) or if the detector acts as a counter or if the detector is an integrating detector (i.e. a detector summing the energies deposited by the particles that fall on it during a certain time). Resulting detection signals and any corresponding images will be built up from a mix of different signal particles, for example secondary and backscatter charged particles. As the secondary charged particles and back-scattered charged particles may have different detection contrast, e.g. image contrast for example on rendering an image, this means that information relating to the contrast between the secondary and backscatter charged particles may not be detected.

The different detecting elements (e.g. the inner detecting portion 405A and the outer detecting portion 405B) may be configured to detect preferentially a different type of signal electron. The inner detecting portion 405A may be configured to detect more secondary charged particles than backscatter charged particles and an outer detecting portion 405B may be configured to detect more backscattered charged particles than secondary charged particles. The two detecting portions can be used simultaneously.

The charged particle optical device is described in the above aspects as being provided as, or as part of, as charged particle system or assessment tool. It is not necessary to include all the features of such larger systems or tools, although they can optionally be included as part of the charged particle optical device.

FIG. 16 is a schematic diagram of an exemplary electron-optical system having the charged particle device as in any of the above described options or aspects. The charged particle device may be provided as an objective lens array assembly. The charged particle device comprises the objective lens array 241. The objective lens array 241 comprises a plurality of objective lenses. The charged particle optical device having at least the objective lens array 241 as described in any of the aspects or embodiments above (e.g. at least the first and second aspects above and any appropriate variations) may be used in the electron-optical system as shown in FIG. 16. The objective lens array 241 may be an exchangeable module as described above. For conciseness, features of the objective lens array 241 that have already been described above may not be repeated here.

The charged particle optical device as described above can be used for the detection of backscatter charged particles in the system of FIG. 16 (as above).

There are some considerations specific to the set up of FIG. 16. In the present example, it is preferable to keep the pitch small so as to avoid negatively impacting throughput. However, when the pitch is too small, this can lead to cross-talk. Therefore, the pitch size is a balance of effective backscatter charged particle detection and throughput. Thus, the pitch is preferably approximately 300 μm, which is 4-5 times larger than it might otherwise be for the example of FIG. 16 when detecting secondary charged particles. When the distance between the detector and the sample 208 is reduced, the pitch size can also be reduced without negatively affecting the cross-talk. Therefore, providing the detector as close as possible to the sample (i.e. with distance L as small as possible, and preferably less than or equal to approximately 50 μm, or less than or equal to approximately 40 μm, or less than or equal to approximately 30 μm, or less than or equal to approximately 20 μm, or equal to approximately 10 μm), is beneficial in allowing the pitch to be as large as possible which improves throughput.

As shown in FIG. 16, the electron-optical system comprises a source 201. The source 201 provides a beam of charged particles (e.g. electrons). The multi-beam focused on the sample 208 is derived from the beam provided by the source 201. Sub-beams 211, 212, 213 may be derived from the beam, for example, using a beam limiter defining an array of beam-limiting apertures. The beam may separate into the sub-beams 211, 212, 213 on meeting the control lens array 250. The sub-beams 211, 212, 213 are substantially parallel on entry to the control lens array 250. The source 201 is desirably a high brightness thermal field emitter with a good compromise between brightness and total emission current. In the example shown, a collimator is provided up-beam of the objective lens array assembly. The collimator may comprise a macro collimator 270. The macro collimator 270 acts on the beam from the source 201 before the beam has been split into a multi-beam. The macro collimator 270 bends respective portions of the beam by an amount effective to ensure that a beam axis of each of the sub-beams derived from the beam is incident on the sample 208 substantially normally (i.e. at substantially 90° to the nominal surface of the sample 208). The macro collimator 270 applies a macroscopic collimation to the beam. The macro collimator 270 may thus act on all of the beam rather than comprising an array of collimator elements that are each configured to act on a different individual portion of the beam. The macro collimator 270 may comprise a magnetic lens or magnetic lens arrangement comprising a plurality of magnetic lens sub-units (e.g. a plurality of electromagnets forming a multi-pole arrangement). Alternatively or additionally, the macro-collimator may be at least partially implemented electrostatically. The macro-collimator may comprise an electrostatic lens or electrostatic lens arrangement comprising a plurality of electrostatic lens sub-units. The macro collimator 270 may use a combination of magnetic and electrostatic lenses.

In another arrangement (not shown), the macro-collimator may be partially or wholly replaced by a collimator element array provided down-beam of the upper beam limiter. Each collimator element collimates a respective sub-beam. The collimator element array may be formed using MEMS manufacturing techniques so as to be spatially compact. The collimator element array may be the first deflecting or focusing electron-optical array element in the beam path down-beam of the source 201. The collimator element array may be up beam of the control lens array 250. The collimator element array may be in the same module as the control lens array 250.

In the example of FIG. 16 a macro scan deflector 265 is provided to cause sub-beams to be scanned over the sample 208. The macro scan deflector 265 deflects respective portions of the beam to cause the sub-beams to be scanned over the sample 208. In some embodiments, the macro scan deflector 265 comprises a macroscopic multi-pole deflector, for example with eight poles or more. The deflection is such as to cause sub-beams derived from the beam to be scanned across the sample 208 in one direction (e.g. parallel to a single axis, such as an X axis) or in two directions (e.g. relative to two non-parallel axes, such as X and Y axes). The macro scan deflector 265 acts macroscopically on all of the beam rather than comprising an array of deflector elements that are each configured to act on a different individual portion of the beam. In the example shown, the macro scan deflector 265 is provided between the macro collimator 270 and the control lens array 250.

In another arrangement (not shown), the macro scan deflector 265 may be partially or wholly replaced by a scan deflector array. The scan-deflector array 260 comprises a plurality of scan deflectors. The scan-deflector array 260 may be formed using MEMS manufacturing techniques. Each scan deflector scans a respective sub-beam over the sample 208. The scan-deflector array 260 may thus comprise a scan deflector for each sub-beam. Each scan deflector may deflect the sub-beam in one direction (e.g. parallel to a single axis, such as an X axis) or in two directions (e.g. relative to two non-parallel axes, such as X and Y axes). The deflection is such as to cause the sub-beam to be scanned across the sample 208 in the one or two directions (i.e. one dimensionally or two dimensionally). The scan deflector array may be up beam of an objective lens array 241. The scan deflector array may be down beam of a control lens array 250. Although reference is made to a single sub-beam associated with a scan deflector, groups of sub-beams may be associated with a scan deflector. In some embodiments, the scanning deflectors described in EP2425444, which document is hereby incorporated by reference in its entirety specifically in relation to scan deflectors, may be used to implement the scan-deflector array. A scan-deflector array (e.g. formed using MEMS manufacturing techniques as mentioned above) may be more spatially compact than a macro scan deflector. The scan deflector array may be in the same module as the objective lens array 241.

In other embodiments both a macro scan deflector 265 and the scan-deflector array are provided. In such an arrangement, the scanning of the sub-beams over the sample surface may be achieved by controlling the macro scan deflector and the scan-deflector array 260 together, preferably in synchronization.

The objective lens array assembly may further comprise a collimator array and/or a scan deflector array.

The embodiments of the present disclosure can be applied to various different tool architectures. For example, the electron beam tool 40 may be a single beam tool or may comprise a plurality of single beam columns or may comprise a plurality of columns of multi-beams. The columns may comprise the charged particle optical device described in any of the above embodiments or aspects. As a plurality of columns (or a multi-column tool), the devices may be arranged in an array which may number two to one hundred columns or more. The charged particle device may take the form of an example as described with respect to and depicted in FIG. 3 or as described with respect to and depicted in FIG. 16, although preferably having an electrostatic scan deflector array and an electrostatic collimator array. The charged particle optical device may be a charged particle optical column. A charged particle column may optionally comprise a source.

In some embodiments, a method is provided of projecting a plurality of charged particle beams (e.g. sub-beams) onto a sample 208 so as to generate a greater proportion of backscatter charged particles in the charged particles emitted from the sample 208. As described above, this is beneficial in obtaining information only available from backscattered signals.

The method comprises projecting the charged particle beams onto a surface of the sample 208 comprising accelerating the charged particle beams in an objective lens array 241. As described above, the accelerating can be carried out by providing electrodes (e.g. the first electrode 242 and the second electrode 243), through which the charged particle beams travel, and which have potentials used to accelerate the charged particle beams. Preferably, the method comprises providing a plurality of objective lenses (such as objective lens array 241); using the plurality of objective lenses to project the charged particle beams onto a surface of the sample 208; using the plurality of objective lenses to accelerate the charged particle beams onto the sample 208 and detecting charged particles emitted from the sample.

Additionally or alternatively, the method comprises repelling secondary charged particles emitted from the sample. Preferably, the method comprises providing a plurality of objective lenses (such as objective lens array 241); using the plurality of objective lenses to project the charged particle beams onto a surface of the sample 208; using the device to repel the secondary charged particles emitted from the sample 208; and detecting charged particles emitted from the sample.

In some embodiments, a method is provided of selectively detecting secondary charged particles and backscatter charged particles emitted from a sample 208. The method comprises selecting a mode of operation of a detector between: a backscatter mode for detecting more backscatter charged particles than secondary charged particles; and a secondary mode for detecting more secondary charged particles than backscatter charged particles. The detection of the backscattered charged particles can be optimized in the backscatter mode and the detection of the secondary charged particles can be optimized in the secondary mode. The method further comprises projecting a plurality of charged particle beams (e.g. sub-beams 211, 212, 213) onto a surface of the sample 208, and detecting charged particles emitted from the sample 208 in the selected mode of operation. Preferably, the method comprises providing a plurality of objective lenses (such as objective lens array 241) and at least one sensor and using the plurality of objective lenses to project the charged particle beams onto a surface of the sample 208. In a first operation state, the method comprises detecting more secondary charged particles than backscatter charged particles, and in a second operation state, the method comprises detecting more backscattered charged particles than secondary charged particles. Optionally, the method further comprises accelerating the charged particle beams in an objective lens array in the backscatter mode and/or decelerating the charged particle beams in an objective lens array in the secondary mode.

In some embodiments, a method is provided of detecting secondary charged particles and backscatter charged particles emitted from the sample 208. The method comprises selecting a mode of operation of a detector between a backscatter mode for detecting more backscatter charged particles than secondary charged particles, and a secondary mode for detecting more secondary charged particles than backscatter charged particles. The method comprises capturing charged particles emitted from the sample 208 so as to detect charged particles in the selected mode. Preferably, the method comprises: providing at least one sensor configured to capture charged particles emitted from the sample 208. The method comprises in a first operation state, detecting more secondary charged particles than backscatter charged particles, and in a second operation state, detecting more backscattered charged particles than secondary charged particles.

Preferably, the previous methods further comprise repelling secondary charged particles emitted from the sample 208. As described above, the repelling may be carried out by controlling potentials of electrodes in the objective lens array 241 and a potential of the sample.

In some embodiments, a method is provided of operating a charged particle assessment tool for detecting backscatter charged particles, the method comprising: projecting a multi-beam of charged particles towards a sample surface; repelling charged particles emitted (i.e. emanating) from the sample in response to the multi-beam that have an energy less than a threshold. The method includes detecting charged particles emanating from the sample and having an energy at least the threshold, using a detector array 240 positioned proximate the sample 208. Preferably, the threshold exceeds an energy of a secondary charged particle emitted from the sample. Preferably, the projecting comprises accelerating the multi-beam of charged particles towards the sample 208, the accelerating preferably in the objective lens array 241. Preferably, the repelling uses an electrode of the objective lens.

Preferably the methods described herein further comprise providing an intermediate focus 236 between respective control lenses and corresponding objective lenses.

In any of the methods, in the detecting, more backscatter charged particles may be detected than secondary charged particles. Thus, the methods can be used to detect primarily backscattered charged particles as described above.

Further to the above, it is noted that some improvement could be made in relation to the detection of secondary charged particles and backscatter charged particles.

For example, detectors used to detect backscatter charged particles may be limited in predominantly detecting backscatter electrons in a certain angle range, e.g. large angle range, relative to the optical axis of the primary beam. However, image contrast for buried features at depth may come especially from small-angle (i.e. small angle with the optical axis) backscatter charged particles. This small-angle backscatter charged particle contrast may be flooded by the larger-angle backscatter charged particles (which typically give more topological contrast), because of the large background these create in the detector signal. The detector signal may comprise a greater proportion of the signal from larger-angle backscatter charged particles than from the small angle backscatter charged particles.

For example, some detectors (e.g. bottom-mounted detectors in particular) detect the net charge arriving on it (i.e. a charge detector), so it may not discriminate between secondary charged particles and back-scattered charged particles. This means that the detection signals and the resulting image will be built up from a mix of secondary charged particles and back-scattered charged particles. As the secondary charged particles and back-scattered charged particles may have different image contrast, this means that information relating to the contrast of the secondary charged particles and back-scattered charged particles may not be detected.

For example, in some instances, a PiN-detector may be used instead of a charge detector. Such a detector may be particularly useful in-lens (e.g. in the objective lens assembly). The PiN detector may be beneficial because the acceleration of secondary charged particles and back-scattered charged particles towards this detector can yield a signal with better signal to noise ratio. However, the acceleration of the secondary charged particles and back-scattered charged particles means that there it may be difficult, if not impossible, to discriminate clearly between secondary charged particles and back-scattered charged particles using this detector. Again an image results that is built up from detection signals from a mix of secondary and backscatter charged particles. This means that information relating to the contrast of the secondary charged particles and back-scattered charged particles may be lost, for example may not be discerned or even detected.

Thus, there is improvement to be made in the detection of secondary charged particles and back-scattered charged particles. The embodiments described below provide some additional/alternative configurations for detection secondary charged particles and back-scattered charged particles These embodiments may be beneficial in improving the detection of secondary charged particles and back-scattered charged particles, for example, by more easily distinguishing between secondary charged particles and back-scattered charged particles, and/or more easily distinguishing between large angle charged particles and small angle charged particles.

The embodiments described below could be combined with any and all variations and embodiments described above.

In some embodiments, a charged particle-optical device for a charged particle system is provided. The charged particle system can correspond to the tool 40 or apparatus 100 described above. The charged particle optical device is configured to project an array of beams of charged particles along primary beam paths towards a sample. The array of primary beams may correspond to the plurality of sub-beams 211, 212, 213 described above. The array of beams may otherwise be referred to as an array of primary beams or an array of sub-beams. These terms are all interchangeable. The array of primary beams may be converted from a single primary beam (e.g. primary electron beam 202). The primary beam paths may be the paths along which the primary beams are directed. Each primary beam path may be the intended path for one of the primary beams. The primary beam paths may be the same as the sub-beam paths 220 described above. The charged particle optical device may be the same as, or at least similar to the charged particle optical device described in any of the above embodiments and variations.

The charged particle-optical device comprises an objective lens array. The objective lens array is configured to project the beams (i.e. the primary beams, corresponding to the sub-beams) onto the sample. The objective lens array comprises at least one electrode. As described above, the objective lens array may comprise additional electrodes as will be described here.

Up-beam and down-beam are defined in relation to the primary beams and are consistently referred to throughout the text in relation to the primary beams Up-beam is along at least one of the primary beams towards the source 201. Down-beam is along at least one of the primary beams towards the sample 208. Up-beam and down-beam are generally used to define the position of components relative to other components. Up-beam and down-beam may be used for describing the position of components in combination with a signal beam, but it will be understood that the up-beam and down-beam terms still apply to the primary beams unless explicitly stated otherwise. Up-beam and down-beam does not relate to an orientation with respect to gravity, or the specific orientation in the figures. References to up beam and down beam are intended to refer to directions in respect of the beam path independently of any present gravitational field. References to upper and lower, up and down, above and below should be understood as referring to directions parallel to the (typically but not always vertical) up-beam and down-beam directions of the electron beam or multi-beam impinging on the sample 208.

The objective lens array may be configured to control acceleration of the charged particle beams through the objective lens array. As described above, the projecting may comprise accelerating the charged particle beams (i.e. the primary beams) along the primary beam paths in the objective lens array. In other words, the objective lens array may speed up the charged particle beams through the objective lens towards the sample 208. The objective lens array may accelerate the charged particle beams using any of the above described embodiments or variations, or any other known techniques.

The objective lens array may be configured to control deceleration of the charged particle beams through the objective lens array. As described above, the projecting may comprise decelerating the charged particle beams (i.e. the primary beams) along the primary beam paths in the objective lens array. In other words, the objective lens array may slow down the charged particle beams through the objective lens towards the sample 208. The objective lens array may decelerate the charged particle beams using any of the above described embodiments or variations, or any other known techniques.

More specifically, potentials of the electrodes of the objective lens array may be controlled to determine the field on the charged particles passing through the electrodes. The primary beams may pass through the objective lens assembly in the general direction from the source 201 to the sample 208. As described, the direction of the primary beams is generally the direction which is used to determine the position of other components, i.e. is used to define up-beam and down-beam unless described otherwise. The field may be generated and controlled by varying the potential on the electrodes as described above. The potentials applied to the electrodes of the objective lens array 241 may be as described above.

Signal beams are formed of signal particles emitted from the sample. The signal particles include secondary charged particles and backscatter charged particles. Thus, the signal particles include the secondary charged particles and/or the secondary electrons described above, and the backscatter charged particles and/or the backscatter electrons described above. It will generally be understood that any signal beams (e.g. secondary charged particle beams and/or backscatter charged particle beams) emitted from the sample 208 will travel in a direction with at least a component substantially opposite to the charged particle beams (i.e. the primary beams) or will have at least a component of direction which is opposite to the direction of the primary beams Signal particles, which are emitted by the sample 208 may also pass through the electrodes of the objective lens and would also be affected by the field. For example, if the objective lens array is used to accelerate the primary beams, this will generally decelerate the signal beams through the objective lens. Similarly, if the objective lens is used to decelerate the primary beams, this will generally accelerate the signal beams through the objective lens.

Figure 17A:
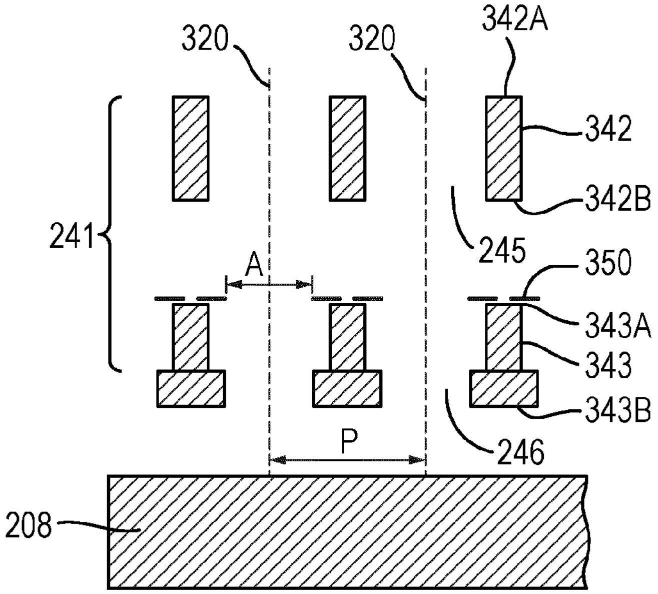
FIG. 17A is a schematic cross-sectional view of an objective lens according to some embodiments and FIG. 17B shows the objective lens of FIG. 17A in use.

FIG. 17A shows an example wherein the device comprises the objective lens array 241. The objective lens array 241 comprises at least one electrode 343. The electrode 343 may be a lower electrode, or down-beam electrode (which is defined in relation to the primary beam). Thus, the electrode 343 is shown as the bottom electrode in FIG. 17A. The electrode 343 may correspond to the second electrode 243 described above. The electrode 343 has an up-beam surface 343A (i.e. an upper surface in FIG. 17A). The electrode 343 has a down-beam surface 343B (i.e. a lower surface in FIG. 17A). The down-beam surface 343B of the electrode 343 may be the surface of the objective lens array 241 which is closest to the sample 208.

It is noted that the electrode 343 may be an electrode common to all apertures defined in the electrode (i.e. one electrode at a common position along the sub-beam paths for all the apertures), or there may be two or more electrodes in the array in which an electrode is common to some of the apertures (i.e. multiple electrodes at a common position along the sub-beam paths). Thus where the electrode 343 is a plate forming at least part of an aperture array through which passes at least some if not all the of the paths of the sub-beam of the sub-beam array, the electrode is common to all apertures in the plate. There may even be embodiments in which an electrode corresponds to and defines an aperture of the aperture array or an aperture in the aperture array in which are multiple electrodes. Although multiple electrodes may be present, the description considers an electrode for an objective lens and a corresponding beam.

The objective lens array 241 may comprise at least two electrodes, as shown in FIG. 17A. The further electrode 342 may be an upper electrode. Thus, the objective lens array 241 may comprise at least an upper electrode 342 and a lower electrode 343. The upper electrode 342 being up-beam of the lower electrode 343 along the primary beam paths 320. The two electrodes will be referred to as the upper electrode 342 and the lower electrode 343 below.

The upper electrode 342 is shown as the top electrode in FIG. 17A. The upper electrode 342 may correspond to the first electrode 242 described above. The upper electrode 342 has an up-beam surface 342A (i.e. an upper surface in FIG. 17A). The upper electrode 342 has a down-beam surface 342B (i.e. a lower surface in FIG. 17A). The up-beam surface 342B of the upper electrode 343 may be the surface of the objective lens array 241 which is furthest from the sample 208. In other words, up-beam surface 342B of the upper electrode 343 may be the surface of the objective lens array 241 which is closest to the source 201.

Preferably, the upper electrode 342 and/or the lower electrode 343 have defined aperture arrays defined therein. In other words, the upper electrode 342 may comprise an aperture array and/or the lower electrode 343 may comprise an aperture array. Corresponding apertures in the electrodes are preferably aligned with and/or arranged along the primary beam paths 320. Arranged along may mean positioned in the path of, e.g. arranged along the primary beam paths 320 may mean positioned in the paths of the primary beams. In other words, the primary beam paths 320 may pass through the electrodes, and preferably through corresponding apertures in the electrodes for the passage therethrough of the primary beams.

In some embodiments, the charged particle-optical device comprises an array of detectors, referred to herein as an array of mirror detectors 350. The array of mirror detectors 350 is arranged along the primary beam paths 320 (e.g. at a common position along the primary beam path). In other words, the detectors of the array of mirror detectors 350 have apertures which align with the sub-beams Thus, the array of mirror detectors 350 may be positioned relative to the sub-beams and is preferably substantially orthogonal to the sub-beams. In some embodiments, a mirror detector 350 surrounds a beam aperture for each sub-beam. In some embodiments, a mirror detector 350 comprises a plurality of detector elements 405 around each aperture.

The array of mirror detectors 350 is configured to detect signal particles (which correspond to the secondary charged particles and/or the backscatter charged particles described above). In other words, the signal particles are the particles emitted from the sample 208 when a primary beam is incident on the sample. The detectors of the array of mirror detectors 350 have an aperture defined therein through which the charged particle beams can pass. An aperture may be defined in at least one detector, and preferably each detector, which is aligned with, and arranged along, the primary beam path. The width A of the aperture is shown in FIG. 17A.

The array of mirror detectors 350 is configured to face up-beam of the primary beam paths 320. In other words, the array of mirror detectors 350 is configured to face along the primary beam path 320 towards a source of the primary beam (described above as source 201). This is shown in FIG. 17A in that the array of mirror detectors 350 is facing upwards in the image. The array of mirror detectors 350 is configured to face away from the sample 208. In other words, the array of mirror detectors 350 is configured to face in the same direction as the sample 208. The array of detectors 350 is preferably configured to be substantially parallel with the sample 208 and/or substantially orthogonal at least one of the sub-beams 211, 212, 213. The array of mirror detectors 350 may otherwise be referred to as an upwards array of detectors.

In some embodiments, a charged particle-optical device for a charged particle assessment tool is provided. The device being configured to project a multi-beam of charged particles along sub-beam paths towards a sample, the multi-beam comprising sub-beams. The device comprises an objective lens array configured to project an array of charged particle sub-beams onto the sample and comprising at least one electrode; and an array of detectors arranged along the sub-beam paths and configured to detect signal charged particles and to face upbeam of the sub-beam paths away from the sample. The array of detectors may correspond to the array of mirror detectors 350 described above.

Figure 17B:
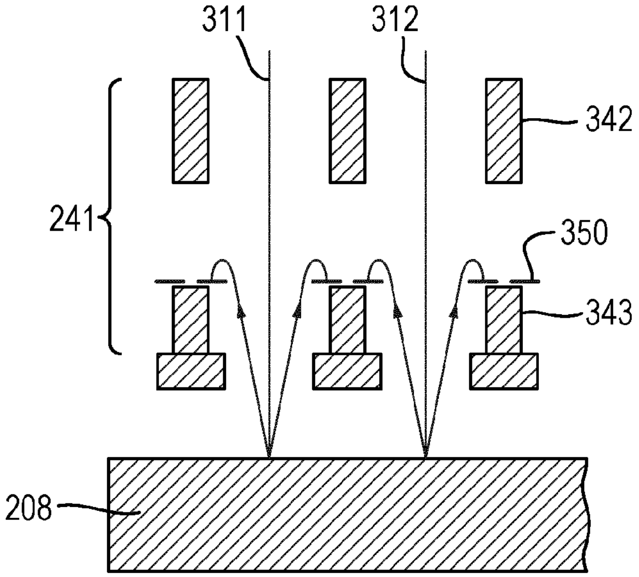

FIG. 17B shows the example depicted in FIG. 17A in use. In other words, FIG. 17B shows the example of FIG. 17A, when the primary beams 311 and 312 are provided. Specifically, primary beams 311 and 312 are provided along primary beam paths 320 in use. As shown, the primary beams 311 and 312 are incident on the sample 208. FIG. 17B shows the signal beams emitted from the sample 208. The signal beams include arrows to show the direction from the sample 208 to the array of mirror detectors 350.

The array of mirror detectors 350 may be associated with a corresponding array of objective lenses. The array of mirror detectors 350 may be associated with the at least one electrode of the objective lens array 241 (e.g. either the upper electrode 342 or the lower electrode 343). For example, the array of mirror detectors 350 may be in or on at least one electrode of the objective lens array 241. For example, the array of mirror detectors 350 may be positioned adjacent to one of the electrodes. In other words, the array of mirror detectors 350 may be positioned in close proximity and next to one of the electrodes. For example, the array of mirror detectors 350 may be connected (e.g. mechanically connected) to one of the electrodes. In other words, the array of mirror detectors 350 may be attached to one of the electrodes, e.g. by adhesive or welding or some other attachment method. For example, the array of mirror detectors 350 may be integrated with the one of the electrodes. In other words, the array of mirror detectors 350 may be formed as part of one of the electrodes.

Preferably, the array of mirror detectors 350 may be associated with the lower electrode 343, e.g. the array of mirror detectors 350 may be in or on the lower electrode 343 or may be associated in any of the other ways described above. This may be beneficial as the signal particles may be more likely to be detected if the array of mirror detectors 350 are provided relatively close to the sample 208, e.g. just above or on the lower electrode 343. When the array of mirror detectors 350 is positioned within the objective lens array 241 (i.e. between electrodes of the objective lens array 241) it may be referred to as an in-lens detector.

The array of mirror detectors 350 may be associated with an up-beam surface of one of the at least two electrodes of the objective lens array 241, e.g. the array of mirror detectors 350 may be in or on an up-beam surface of one of the electrodes of the objective lens array or may be associated in any of the other ways described above. More specifically, the array of mirror detectors 350 may be on, positioned adjacent to, connected to, or integrated with an up-beam surface of one of the at least two electrodes of the objective lens array 241. As the array of mirror detectors 350 are facing away from the sample, this means that the array of mirror detectors 350 can be positioned near to the relevant electrode, without the electrode getting in the way of, or obstructing, detection of signal particles.

More specifically, the array of mirror detectors 350 may be associated with (e.g. in, on, positioned adjacent to, connected to, or integrated with) an up-beam surface of the lower electrode 343 of the objective lens array 241. As described above, this may be beneficial in that the array of mirror detectors 350 can be positioned relatively close to the sample 208.

The array of mirror detectors 350 is generally used when the objective lens 241 is accelerating the primary beams 311 and 312 through the objective lens 241. This will have a decelerating effect on signal particles which are travelling in the opposite direction to the primary beams 311 and 312. As shown in FIG. 17B, the signal particles which are travelling substantially upwards in the image, will be affected by the field which will decelerate the signal particles which ultimately results in at least some signal particles falling back down to the array of mirror detectors 350. Signal particles which are decelerated within the objective lens 241 may not be able to reach an upper downward facing detector array (should it be provided) due to the decelerating effect. In particular, the deceleration of the signal particles causes the signal particles which do not have too much kinetic energy to be mirrored back in the direction of the sample 208, i.e. towards the array of mirror detectors 350. The kinetic energy of the signal electrons may be insufficient to reach the upper electrode 342; so the kinetic energy of the signal particles may be below a threshold needed to travel further up beam the primary beam path than a certain point, for example, to an electrode up-beam along the primary beam path from the mirror detector 350. Thus, signal particles which may otherwise go undetected, for example because they pass through an aperture of the aperture array 246, can be detected using the array of mirror detectors 350 as depicted in FIG. 17B.

The array of mirror detectors 350 as shown in FIGS. 17A and 17B may be particularly useful for detecting small-angle backscatter charged particles. In particular, small angle particles may be detected as they will travel through the aperture in the lower electrode, whereas wider angled particles may hit a lower detector or surface of the lower electrode. Additionally, the array of mirror detectors 350 is likely to detect backscattered charged particles rather than secondary charged particles, as the field generally accelerates particles towards the sample and the secondary charged particles will likely not have enough kinetic energy to overcome the deceleration field. The array of mirror detectors 350 can thus be used for detection of the small-angle backscatter charged particles with insufficient initial kinetic energy to overcome the deceleration field and that are pushed back towards the array of mirror detectors 350. In other words, relatively low kinetic energy small angled backscatter charged particles are likely to be detected by the array of mirror detectors 350. Therefore, the array of mirror detectors 350 may be particularly useful at detecting small-angle backscatter charged particles with sufficient initial kinetic energy to overcome the deceleration field, but without enough kinetic energy to avoid being deflected backwards towards the array of mirror detectors 350. Detecting such small-angle backscatter charged particles is beneficial in that it can enhance the image contrast of buried features for specific applications, thereby possibly increasing application range and usefulness of such a system. Thus, overall, detection using the array of mirror detectors 350 may lead to an improvement in the information that can be obtained from detecting the signal particles.

It will be noted that some small angled backscattered charged particles may have a high enough kinetic energy that they continue despite the deceleration field. Such particles may be detected by up-beam (with respect to the primary beams 311 and 312) detectors arrays (if provided), which are described below.

As the signal particles may be accelerated again after being mirrored, most of these signal particles will have considerable energy when impinging on array of mirror detectors 350. For example, the kinetic energy of the signal particle (which may be a backscatter charged particle) may be similar to the kinetic energy of a backscatter charged particle when emitted by the sample 208. Therefore, there may be design freedom in terms of the type of detector used for the array of mirror detectors 350. For example, the detectors of the array of mirror detectors 350 may be charge-based. Also, as described above, as the signal particles may have a certain amount of energy (e.g. above a predetermined threshold), then a PiN or scintillator detector can be used.

A potential may be applied to the array of mirror detectors 350. The array of mirror detectors 350 may be connected to a potential source. The potential applied to the array of mirror detectors 350 may be the same or similar as the potential applied to a nearby electrode of the objective lens array 241. The potential is described in further detail below.

The array of mirror detectors 350 may be provided with other detector arrays, as described below.

Additionally or alternatively, in some embodiments, the charged particle-optical device may be provided with an up-beam array of detectors positioned up-beam along the primary beam paths of at least one electrode and a down-beam array of detectors positioned down-beam along the primary beam paths of the electrode. In other words, the charged particle-optical device may be provided with two detector arrays positioned at different locations along the primary beam paths 320. More specifically, one of the detector arrays is up-beam of at least one electrode of the objective lens array and one of the detector arrays is down-beam of the at least one electrode of the objective lens array. Multiple electrodes of the objective lens array may be positioned between the detector arrays. The up-beam array of detectors and the down-beam array of detectors are configured simultaneously to detect signal particles.

A charged particle-optical device for a charged particle assessment tool can be provided, the device being configured to project a multi-beam of charged particles along sub-beam paths towards a sample, the multi-beam comprising sub-beams. In this example, the device comprises: an objective lens array configured to project an array of charged particle sub-beams onto the sample, the objective lens array comprising at least one electrode; an up-beam array of detectors positioned up-beam of at least one electrode along the sub-beam paths; and a down-beam array of detectors positioned down-beam of the at least one electrode along the primary beam paths, wherein the up-beam array of detectors and the down-beam array of detectors are configured simultaneously to detect signal particles. The down-beam array of detectors may be referred to as a proximate array.

Providing two detector arrays positioned at different locations along the primary beam paths 320 may be beneficial in allowing different signal particles to be detected at each detector array. For example, predominantly secondary charged particles may be detected at one of the arrays whilst backscattered charged particles are predominantly detected at the other of the arrays. Additionally or alternatively, smaller angle backscatter charged particles may be predominantly detected at one of the arrays whilst larger angle backscatter charged particles are detected at the other of the arrays.

Figure 18A:
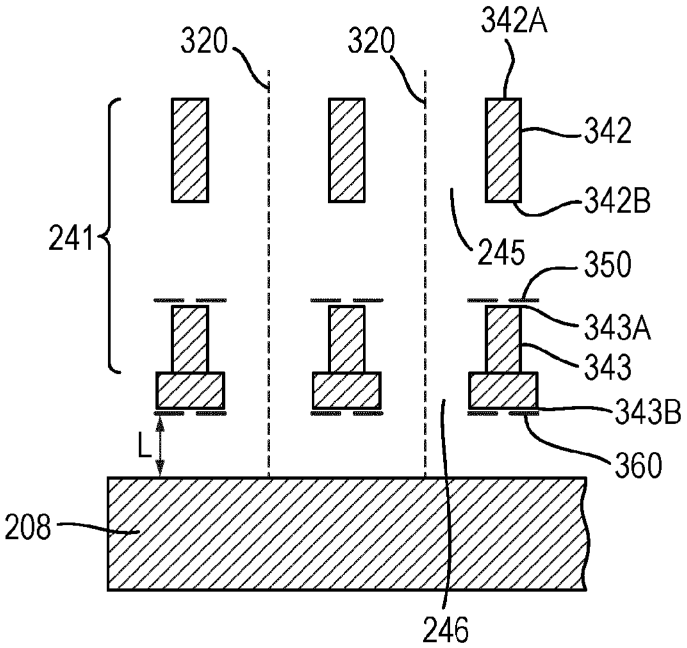
FIG. 18A is a schematic cross-sectional view of an objective lens according to some embodiments and FIG. 18B shows the objective lens of FIG. 18A in use.

The up-beam array of detectors may correspond to the array of mirror detectors 350 described above. In other words, the up-beam array of detectors may be arranged along the primary beam paths 320 and configured to face up-beam of the primary beam paths 320 away from the sample 208. In this instance, the array of mirror detectors 350 are provided in combination with the down-beam array of detectors as described herein. This is shown in FIG. 18A, in which the array of mirror detectors 350 are provided on an up-beam surface 343A of the lower electrode 343. More generally, the array of mirror detectors 350 may be positioned up-beam of the lower electrode 343. As would be understood from the description above, the array of mirror detectors 350 could be associated with (e.g. in, on, positioned adjacent to, connected to, or integrated with) other electrodes of the objective lens array 241.

As described above, the down-beam array of detectors 360 is positioned down-beam of at least one electrode of the objective lens array 241. The down-beam array of detectors 360 is positioned down-beam of the up-beam array of detectors. The down-beam array of detectors 360 may be the most down-beam detector array provided, i.e. the detector array which is furthest from source 201 and/or the closest to sample 208.

The down-beam array of detectors 360 may be associated with a corresponding array of objective lenses. The down-beam array of detectors 360 may be associated with (e.g. in, on, positioned adjacent to, connected to, or integrated with) at least one electrode of the objective lens array 241. For example, the down-beam array of detectors 360 may be positioned adjacent to an electrode of the objective lens array 241. In other words, the down-beam array of detectors 360 may be positioned in close proximity and next to an electrode of the objective lens array 241. For example, the down-beam array of detectors 360 may be connected to an electrode of the objective lens array 241. In other words, the down-beam array of detectors 360 may be attached to an electrode of the objective lens array 241, e.g. by adhesive or welding or some other attachment method. For example, the down-beam array of detectors 360 may be integrated with an electrode of the objective lens array 241. In other words, the down-beam array of detectors 360 may be formed as part of one of the electrodes of the objective lens array 241.

Preferably, the down-beam array of detectors 360 is associated with (e.g. in, on, positioned adjacent to, connected to, or integrated with) the lower electrode 343. Therefore, preferably, the down-beam array of detectors 360 is positioned adjacent to, connected to or integrated with the lower electrode 343 as described in any of the above examples. This may be beneficial as the signal particles may be more likely to be detected if the down-beam array of detectors 360 is provided close to the sample, e.g. just below or on the lower electrode 343.

The down-beam array of detectors 360 may positioned down-beam of the objective lens array 241 along the primary beam paths 320. In other words, the down-beam array of detectors 360 may be positioned down-beam of the lower electrode 343 along the primary beam paths 320 towards the sample and not be in contact with the lower electrode 343. Alternatively, the down-beam array of detectors 360 may be on, or positioned adjacent to, connected to, or integrated with the down-beam surface 343B of the lower electrode 343. Either way, the down-beam array of detectors 360 may be proximate the sample 208 in use. This is depicted in FIG. 18A. Either way, the down-beam array of detectors 360 may be adjacent and/or proximate to the sample 208. The down-beam array of detectors 360 may be otherwise referred to as a proximate array of detectors, i.e. an array of detectors proximate to the sample 208, and/or a bottom detector array.

Preferably, the down-beam array of detectors 360 faces the sample 208 in use, i.e. when the sample is present. This means that the detecting surface of the down-beam array of detectors 360 may directly face the surface of the sample 208 (on which the primary beams 311 and 312 are incident). There may be no other components between the down-beam array of detectors 360 and the sample 208. In an arrangement the down-beam array of detectors 360 may be actuatable relative to the objective lens array 241 for example to substantially maintain a distance between the sample and the down-beam array of detectors 360. Thus, the distance L between the down-beam array of detectors 360 and the sample 208 can be varied.

Although it is preferred that the down-beam array of detectors 360 is proximate and/or adjacent to the sample 208, it is not a necessity. The down-beam array of detectors 360 may simply be down-beam of the up-beam array of detectors and/or down-beam of at least one of the electrodes of the objective lens array.

Figure 18B:
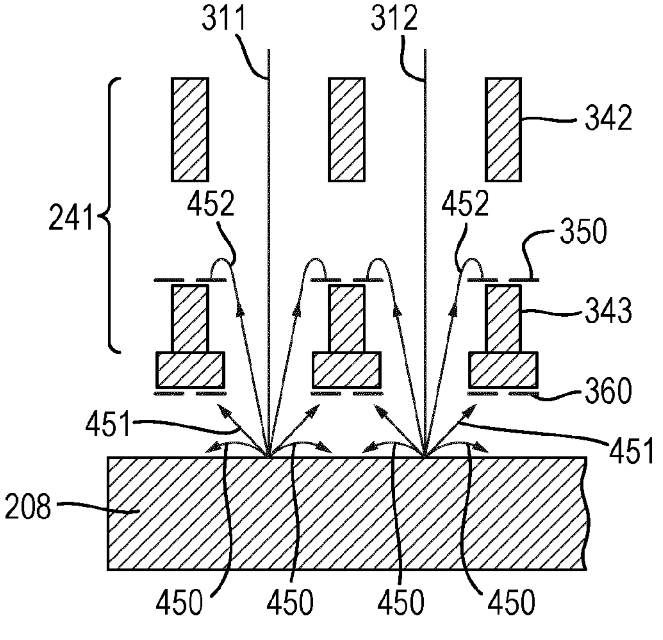

As shown in FIG. 18B, the up-beam array of detectors may be an in-lens detector array (in this case corresponding to the array of mirror detectors 350 described above). The up-beam array of detectors (e.g. the array of mirror detectors 350) and the down-beam array of detectors 360 (which is shown here as a bottom detector array) may be combined to simultaneously detect signal particles. The signal particles detected at each of the detector arrays may have different characteristics, e.g. related to particle energy and/or angle.

As described above, the primary beam (e.g. 311, 312) may be accelerated through the objective lens array 241 due to the potential of the electrodes of the objective lens array 241. This may have a decelerating effect on the signal particles emitted from the sample 208 (as they are travelling in the other direction, i.e. towards the objective lens array 241). This is shown in FIG. 18B. The electric field will have a different effect on the signal particles depending on how much energy they have and their angle when emitted by the sample 208.

Secondary charged particles may have relatively low energy and may be repelled by the objective lens array 241. In other words, the objective lens array 241 may be configured to have potential differences applied so as to achieve the repelling of the secondary charged particles. For example, the device may further comprise a potential application arrangement (e.g. the voltage sources described below) configured to apply the potential differences to the array of objective lenses.

The repelled charged particles are represented by the lowest, outwards arrows 450 going back towards the sample 208. Generally backscatter charged particles have greater energy than secondary charged particles and so will be less affected by the electric field of the objective lens array 241. In other words, the backscatter charged particles may not be easily repelled, especially by a small potential which may be used to repel the secondary charged particles as described below. For example, large angle backscatter charged particles (represented by arrows 451) may be incident on the further detector array 360. Small angle backscatter charged particles (represented by arrows 452) may pass through the aperture in the lower electrode 343. Lower energy small angle backscatter charged particles may be mirrored as described above. These charged particles (represented by arrows 452) are shown as being detected by the array of mirror detectors 350. Thus, the use of multiple detector arrays is beneficial in allowing signal particles of different types to be detected. It will be noted that in this configuration, higher energy small angle backscatter charged particles may not be detected (unless an additional detector array is provided). Higher energy backscatter charged particles might be detected by another detector array which might be provided instead of, or in addition to, the array of mirror detectors 350. One such alternative is described in relation to FIG. 19B below.

In any of the detectors of the detector arrays described above, an aperture may be defined. This may apply to the detectors of the up-beam detector array (and more specifically, it could apply to the mirror detector array 350), and/or the down-beam array 360, and/or any additional detectors arrays described below. Thus, an aperture may be defined in at least one detector, and preferably each detector, which is aligned with, and arranged along, the primary beam path 320. In other words, when the relevant detector array is in place, one of the primary beams may pass through the aperture provided in each detector. This allows the primary beam to travel along the primary beam path 320 to the sample 208.

The aperture may be of any appropriate shape. Although the apertures are generally shown as circular, they could be another shape. The width of the aperture of the detector (which is shown as A for a detector of the mirror array in FIG. 17A) may be less than or equal to approximately 250 μm. The width of the aperture of the detector may be less than or equal to approximately 100 μm. The width of the aperture of the detector may be less than or equal to approximately 40 μm. The width of the aperture of the detector may be greater than or equal to approximately 10 μm. The width of the aperture of the detector may be greater than or equal to approximately 30 μm. The width of the aperture of the detector may be between approximately 10 μm to 250 μm. The width of the aperture of the detector may be between approximately 10 μm to 100 μm. Preferably, the width of the aperture of the detector may be between approximately 30 μm to 40 μm. The width of the apertures of the detectors may all be the same in one given array. The width of the apertures of the detectors may be the same in multiple detector arrays. The width of the apertures of the detectors may be substantially the same in all of the detector arrays.

The down-beam array of detectors 360 may be positioned close to the sample 208. Preferably, the down-beam array of detectors 360 is positioned at a distance (L) of greater than or equal to approximately 10 μm from the sample. Preferably, the down-beam array of detectors 360 is positioned at a distance (L) of less than or equal to approximately 1 mm from the sample. Preferably, the down-beam array of detectors 360 is positioned between approximately 10 μm to 1 mm of the sample.

The distance from the down-beam array of detectors 360 can be selected to control detection of the signal particles. In other words, the position of the down-beam array of detectors 360 relative to the sample 208 is selected to control detection of secondary signal particles by the down-beam array of detectors 360 and/or by the array of mirror detectors 350. For example, the distance (L) between the down-beam array of detectors 360 and the sample 208 can be selected to control the amount of signal particles that will be detected by the down-beam array of detectors 360. For secondary charged particles the solid angle in which they travel becomes wider with a larger distance L to the sample: so at a shorter distance L more secondary charged particles will pass the detector hole. Therefore, for example, if the distance L is smaller, e.g. closer to 10 μm, then a smaller number of secondary charged particles may be detected at the down-beam array of detectors 360 as more charged particles may pass through the aperture of the detector, rather than hitting the detector. However, when the distance L is relatively large, e.g. close to 1 mm, then a larger number of charged particles overall may be detected by the down-beam array of detectors 360. However, in this case, some signal particles with lower energy may not make it to the detector and/or some larger angle charged particles would not be detected by the down-beam array of detectors 360. It will be noted that for backscattered charge particles the number of detected particles may be more or less proportional to the solid angle of the detector, so at a shorter distance L, more backscattered charged particles will be detected because of the larger solid angle. This also means that the distance L can be used in some way to influence the ratio between secondary and backscattered charge particles detected.

Additionally, it will be understood that varying the distance L between the down-beam array of detectors 360 and the sample 208 will alter the signal particles which pass through the detector aperture and can thus be detected by detector arrays up-beam along the primary beam paths 320. Thus, selection of the distance L will affect not only the amount and/or type of signal particles detected by the down-beam array of detectors 360, but will also affect the amount and/or type of signal particles affected by any up-beam (with respect to the primary beams 311 and 312) detector arrays, such as the array of mirror detectors 350.

Additionally or alternatively, a width of an aperture of the detectors used in the down-beam array of detectors 360 may be selected to control detection of secondary signal particles by the down-beam array of detectors 360 and/or the array of mirror detectors 350. For example, a larger aperture will reduce the amount of signal particles detected by the down-beam array of detectors 360. Additionally, a larger aperture array will likely lead to larger angle signal particles being detected at the down-beam array of detectors 360. It will be noted that signal particles travel through the apertures of the down-beam array of detectors 360 to arrive at any other up-beam detector arrays, such as the array of mirror detectors 350. Thus, a smaller aperture in the detectors of the down-beam array of detectors 360 will likely reduce the amount of signal particles detected by the array of mirror detectors 350 and will mean that smaller angle signal particles will be detected by the array of mirror detectors 350. This is described in further detail below in relation to the difference in charged particles detected in FIG. 19D and FIG. 19E.

The charged particle-optical device may be configured to repel certain signal particles from at least one of the arrays of detectors. For example, the device may be configured to repel secondary signal particles emitted from the sample away from the down-beam array of detectors 360. More specifically, the down-beam array of detectors 360 may be configured in use to have a potential and the sample 208 is configured in use to have a potential. In order to repel certain signal particles from the down-beam array of detectors, the sample potential may be more positive than the potential of the down-beam array of detectors. In this instance, the difference in potential between the sample 208 and the down-beam array of detectors 360 may be greater than a certain threshold, e.g. a secondary signal particle threshold. This will mean that signal particles that have an energy less than the threshold will be repelled from the down-beam array of detectors 360. This may be beneficial in controlling the signal particles which are detected, e.g. by reducing or avoiding detection of secondary signal particles (which tend to have a lower energy than backscatter charged particles, or at least most backscattered charged particles).

In some embodiments, the up-beam array of detectors may correspond to the array of mirror detectors 350 as described above. In some embodiments, the up-beam array of detectors may comprise an array of detectors facing towards the sample, i.e. in the direction of the sample 208. In other words, the up-beam array of detectors may be facing in a direction along the primary beam path 320 towards the sample 208. Thus, the device may comprise two detector arrays facing towards the sample, i.e. the up-beam array of detectors and the down-beam array of detectors. This is shown in relation to FIG. 19A, FIG. 19B, FIG. 19C, FIG. 19D, FIGS. 19E, 20A, and 20B.

The up-beam array of detectors may be upper array of detectors 370. The upper array of detectors 370 may be associated with (e.g. in, on, positioned adjacent to, connected to, or integrated with) the down-beam surface 342B of the upper electrode 342 of the objective lens array 241. More specifically, the upper array of detectors 370 may be on, positioned adjacent to, connected to, or integrated with the down-beam surface 342B of the upper electrode 342 of the objective lens array 241, which is shown in FIG. 19A, FIG. 19B, FIG. 19C, FIG. 19D, and FIG. 19E. More generally, the upper array of detectors 370 could be on, positioned adjacent to, connected to, or integrated with a down-beam surface of any appropriate electrode if more electrodes are provided in the objective lens array. More generally, the upper array of detectors 370 may be positioned between the upper electrode 342 and the lower electrode 343, or between any other electrodes above the lowest electrode of the objective lens array. As described above, the upper array of detectors 370 is provided up-beam (in relation to the primary beams 311 and 312) of at least one electrode, which is the lower electrode 343 in relation to these figures. As mentioned, the upper array of detectors 370 may be facing towards the sample 208. In some embodiments, a single detector elements of the upper array of detectors 370 surrounds each beam aperture 245. In another embodiment, a plurality of detector elements of the upper array of detectors 370 are around each beam aperture 245.

Figure 19A:
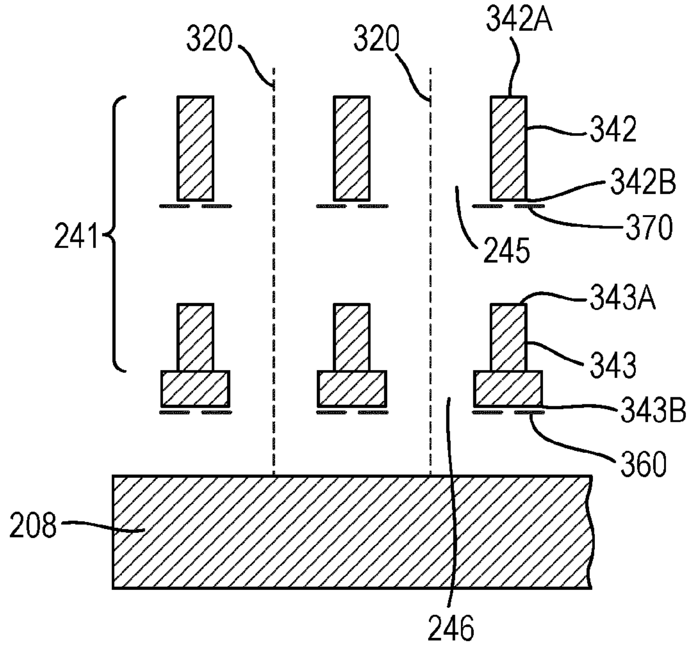
FIG. 19A is a schematic cross-sectional view of an objective lens according to some embodiments and FIG. 19B, FIG. 19C, FIG. 19D and FIG. 19E show the objective lens of FIG. 19A in use.

The configuration show in FIG. 19A is described below in relation to FIG. 19B to 19E to indicate how the signal particles can be detected by the different detector arrays provided. The positioning of the upper array of detectors 370 and/or the down-beam array of detectors 360 may be varied as described above.

Figure 19B:
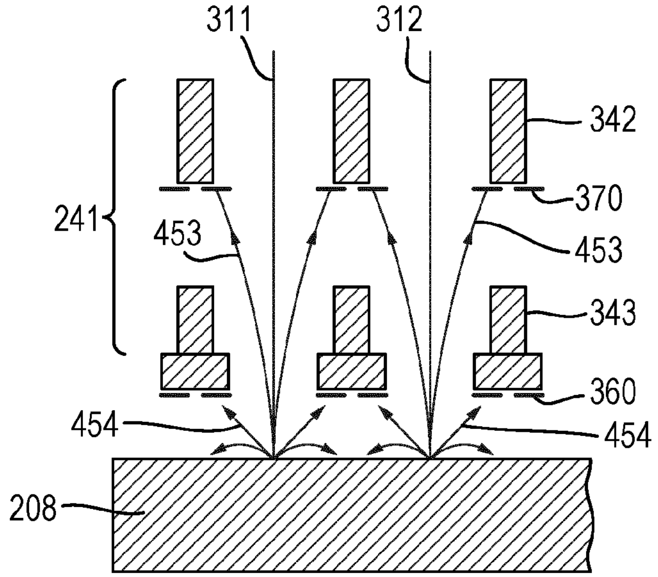

In FIG. 19B, the primary beams 311 and 312 may be accelerated by the objective lens array 241. As described above, this results in a decelerating effect on the signal particles as they are travelling in generally the opposite direction to the primary beams 311 and 312 (i.e. they are travelling away from the sample 208). In general in this configuration, the upper array of detectors 370 can be used for detection of the small-angle backscatter charged particles with sufficient initial kinetic energy to overcome the deceleration field. As shown in the figure, this may result in the curved path of the charged particles from the sample 208 to the upper array of detectors 370 (see arrows 453). The down-beam array of detectors 360 (i.e. the bottom detector array) can be used to detect larger angle back scatter charged particles (see arrows 454).

In further detail, due to the fact that backscatter charged particles generated at the sample 208 are decelerated in the objective lens array 241, only backscatter charged particles that have more kinetic energy than the potential energy from the voltage difference between the upper electrode 342 and the lower electrode 343 will be able to reach the upper array of detectors 370. Thus, only higher energy backscatter charged particles (see arrows 453) may be detected by the upper array of detectors 370 (i.e. those with sufficient kinetic energy to overcome the deceleration, i.e. above a certain threshold for example a high energy backscatter threshold). As these signal particles travel to the upper array of detectors 370 through an aperture of an electrode (see arrows 453), this means that the signal particles are generally small-angle (as larger angle charged particles will hit the lower detector array(s) and/or lower electrode as shown by arrows 454). Thus, the upper array of detectors 370 may detect small-angle high-energy backscatter charged particles. Thus, the upper array of detectors 370 may detect the small-angle charged particles with energy higher than the charged particles which would have been detected by the array of mirror detectors 350 as described above.

The kinetic energy of the backscatter charged particles will generally be reduced before arriving at the upper array of detectors 370. Some of the signal particles incident on the upper array of detectors 370 may have almost zero kinetic energy left when arriving. In this instance, the upper array of detectors 370 may generally comprise charge-based detectors. However, if a certain threshold energy, such as a particle detection threshold, (for example, several 100s of eV or even more) can be accepted for the signal particles arriving at the detector, then also a PiN or scintillator detector can be used. In this case, the PiN or scintillator detector will detect signal particles of at least the particle detection threshold; such detectors may not detect signal particles with lower energy. This may be useful in some instances if these lower energy signal particles are of little interest. In other instances, this may result in useful information being lost. Therefore, it is beneficial to select the type of detector depending on the information needed in relation to the signal particles.

It will be noted that the upper array of detectors 370 shown in FIG. 19B and the array of mirror detectors 350 shown in FIG. 18B can be used to detect signal particles, and particularly backscatter charged particles with different energy ranges. The upper array of detectors 370 can be used to detect the higher energy backscatter charged particles (arrows 453), whereas the array of mirror detectors 350 can be used to detect the lower energy backscatter charged particles (452). The boundary energy between the high energy and low energy particles is determined by the acceleration voltage difference of the objective lens 241. For example only, if the upper electrode 343 is at 5 keV and the landing energy at 30 keV, then the boundary energy is 25 keV. If the acceleration voltage difference can be tuned, then this can be used for varying the boundary energy and thus the range of backscatter charged particle energies detected by either of the upper array of detectors 370 and/or the array of mirror detectors 350. Although not shown, the upper array of detectors 370 could be provided in combination with the array of mirror detectors 350 (optionally in addition to other detector arrays). In an arrangement the arrangement may feature just the mirror detectors 350 and the upper array of detectors 370.

Selecting small-angle signal charged particles for imaging also means that the cross-talk with neighboring detectors in an array can be strongly reduced. This is because detectors of the array other than the detector associated with a specific sub-beam of the beam array, especially neighboring detectors, intersect a smaller solid angle of the likely beam path of such signal particles from the sample compared to other signal particles, e.g. backscatter charged particles. The chance or likelihood of a backscatter charged particle interacting with a neighboring detector is lower. This may provide the perception that backscatter charged particles travel less in the direction of neighboring detectors. This can lead to an improvement in image contrast. Furthermore, if it could be advantageous for certain specific applications to use only small-angle signal particles, and particularly the backscatter charged particles, for imaging, then the pitch P between adjacent primary beams such as 311 and 312 in such a system can be decreased. This can beneficially increase the number of primary beams 311 and 312 used in a system/apparatus/tool.

The pitch P may be as described above. Particularly, the pitch P can be defined as the distance from the middle of one aperture to the middle of an adjacent aperture. The pitch between adjacent apertures in at least one electrode may be less than approximately 1 mm Preferably, the pitch between adjacent apertures in at least one electrode is between approximately 50 μm and 1 mm Preferably, the pitch between adjacent apertures on each electrode is substantially uniform.

Figure 19C:
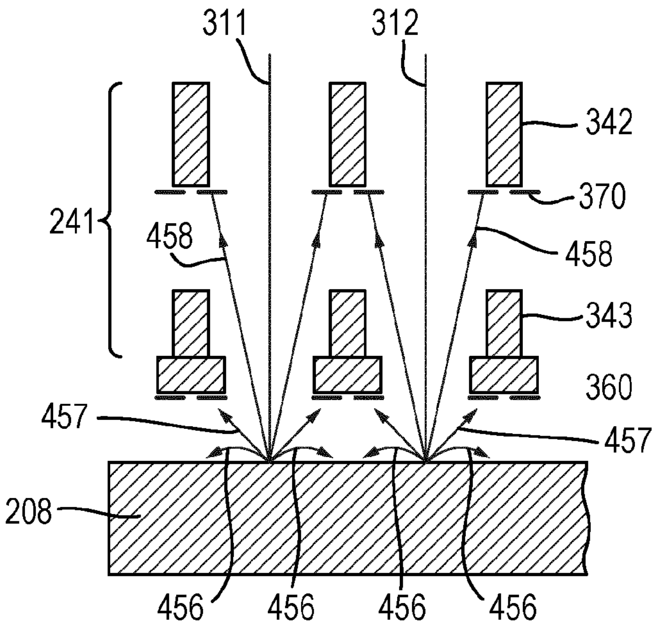
Figure 19D:
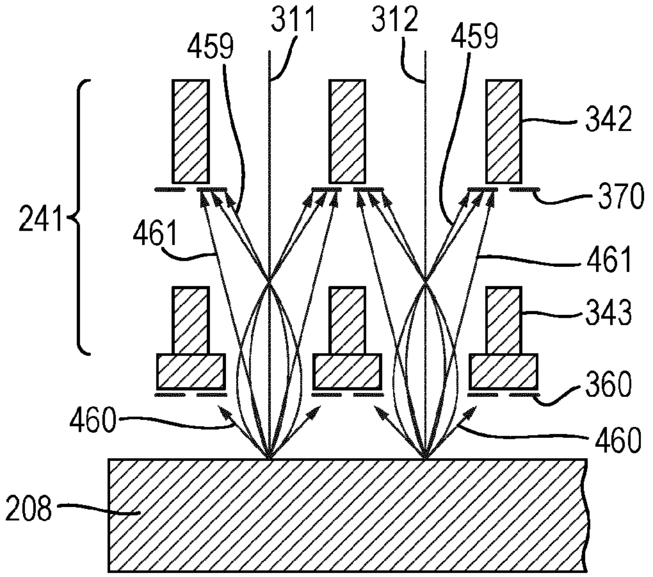
Figure 19E:
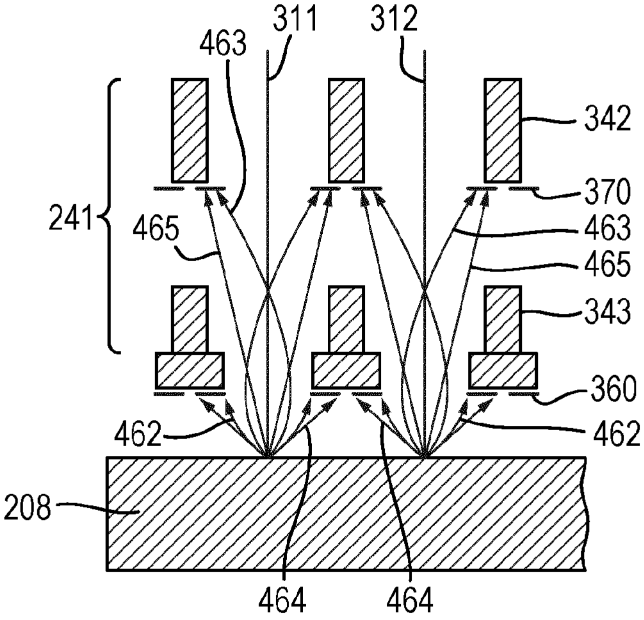

Although the primary beams 311 and 312 described in relation to FIG. 19B are accelerated, the primary beams could instead be decelerated. This is shown in FIG. 19C, FIG. 19D and FIG. 19E. In general, each of these figures, which are described in further detail below, are provided with the objective lens array 241 being used to decelerate the primary beams 311 and 312. The positioning of the detector arrays is the same as described in relation to FIG. 19A and/or FIG. 19B.

Small-angle backscatter charged particles typically show more material contrast (and more contrast from features at depth). Large-angle backscatter charged particles typically show more topographic contrast (surface topology). Small-angle signal particles (i.e. backscatter charged particles with a small angle to the optical axis of the primary beam) that travel through the aperture in the lower electrode 343 and down-beam array of detectors 360 can be detected with the upper array of detectors 370. Larger-angle signal particles, which are likely to be backscatter charged particles, can be detected with the down-beam array of detectors 360 (i.e. the bottom detector array).

As shown in relation to FIG. 19C, at least some signal particles can be repelled, and specifically, secondary charged particles (see arrows 456). In this configuration, the secondary charged particles can be repelled such that only backscatter charged particles are detected. The secondary charged particles may be returned to the sample 208 (indicated by the lowest arrow beam 456 in FIG. 19C) by the down-beam array of detectors 360 having a potential which is more negative than the sample 208. The negative voltage creates a deceleration field at the sample 208, and thus sending the secondary charged particles back to the sample 208.

In further detail, a potential of the sample 208 may be more positive than a potential of the down-beam array of detectors 360. The difference in potential between the down-beam array of detectors 360 and the sample 208 repels charged particles emitted from the sample 208 from travelling, e.g. heading, towards the down-beam array of detectors 360. Preferably, the potential of the down-beam array of detectors 360 may be the same as a potential of the lower electrode 343. The potential difference between the sample 208 and the down-beam array of detectors 360 is preferably relatively small so that primary beams 311 and 312 are projected through or past the down-beam array of detectors 360 to the sample 208 without being significantly affected. The potential difference between the sample 208 and the down-beam array of detectors 360 is preferably greater than a secondary charged particle threshold. The secondary charged particle threshold is the potential difference equivalent to the likely energy of a secondary charged particle emanating from the sample 208. In other words, the secondary charged particle threshold may be a threshold which is approximately 50 eV, i.e. equivalent to the energy difference used to distinguish between secondary charged particles and backscatter charged particles. The potential difference between the sample 208 and the down-beam array of detectors 360 can be varied to alter the lower limit of particles which are not repelled, and thus, will vary the lower limit of charged particles arriving at the detector. In other words, the potential of the down-beam array of detectors 360 can be varied to control the detection of signal particles at the down-beam array of detectors 360. The potentials of the down-beam array of detectors 360, the sample 208 and any other relevant potentials may be controlled as described below in relation to FIG. 21.

The backscatter charged particles will be detected as described above (see arrows 457 and 458). Thus, this configuration can be used in a backscatter only mode in which only backscatter charged particles are detected to discriminate between backscatter charged particles with different angles. Backscattered charged particles have a different contrast mechanism than secondary charged particles so they can be used in cases where the secondary charged particle contrast is insufficient or absent, or where it is more useful to have some material instead of topology contrast. Additionally, it is noted that (unwanted) charging of the sample may occur which may decrease or remove the contrast detectable with the secondary charged particles. However, the contrast between backscatter charged particles may suffer less from charging because their kinetic energy is higher than secondary charged particles and therefore, the backscattered charged particles are less affected by the level of charging which may occur on the sample (which is typically a few Volts). Thus, this configuration could be useful for applications when charging effects in the image are large, or when features both at the surface and at depth have to be imaged or even measured (e.g. in overlay applications).

FIGS. 19D and 19E show versions of the configuration of FIG. 19A in which the primary beams 311 and 312 are decelerated by the objective lens array 241. In these configurations, the secondary charged particles are not repelled (see arrows 459, 462 463), contrary to the version described above in relation to FIG. 19C. However, it is noted that the option of repelling secondary charged particles in deceleration mode is possible by applying repelling potentials (e.g. to the lowest detector array) as described above.

The main idea of these configurations is that the down-beam array of detectors 360 is used for detecting backscatter charged particles (see arrows 460), and that the aperture (or hole) in this down-beam array of detectors 360 enables secondary charged particles (see arrows 459 and 463) to reach the upper array of detectors 370. In this way, signals for secondary charged particles and backscatter charged particles can be collected separately and simultaneously. Depending on the sample topography and composition and the primary beam landing energy, secondary charged particles and backscatter charged particles may give different image contrast which means it could be beneficial to be able to make separate images of samples with different kinds of materials or defects or which suffer from charging effects, extending the application range of a system with such a detection system.

As shown in FIG. 19D, the secondary charged particles (shown by the curved arrows 459) are accelerated upwards from the sample 208 to go through the aperture in the lower electrode 343 and reach the upper array of detectors 370 at the bottom of the upper electrode 342. The backscatter charged particles (shown by the straight arrows 461 and 460) travel towards the upper array of detectors 370 and the down-beam array of detectors 360. The objective lens array 241 geometry is used to decelerate the primary beams 311 and 312 and the sample field are chosen such that no (or very few) secondary charged particles reach (i.e. impact and/or hit) the down-beam array of detectors 360. This is beneficial in that the down-beam array of detectors 360 can be a pure backscatter charged particle detector. Thus, the detectors used in the down-beam array of detectors 360 may be charge-based detectors.

In further detail, the maximum radial distance r from the optical axis (i.e. of the primary beam) of a secondary charged particle emitted from the sample (assuming in a uniform sample field) can be written as:

$$r \approx 2\sqrt{WD}\sqrt{\left(\frac{T_{SE,0}}{E_{sample}}\right)}$$

wherein WD is the working distance between the sample 208 and the detector bottom (e.g. the down-beam array of detectors 360) which corresponds to distance (L), $T_{SE,0}$ is the starting kinetic energy of a secondary charged particle when emitted from the sample (e.g. between 0 and 50 eV) and $E_{sample}$ is the electric field on the sample 208.

The aperture in the detectors of the down-beam array of detectors 360 is generally large enough, together with the electric field applied to the sample, to ensure that the secondary charged particles impinging on the down-beam array of detectors 360 is reduced, or preferably prevented. In other words, the majority of the secondary charged particles generated (see arrows 459) will travel into the detector aperture and not impinge on the down-beam array of detectors 360. This is shown in FIG. 19D. It is beneficial to avoid secondary charged particles from impinging (i.e. hitting) the down-beam array of detectors 360 because the number of secondary charged particles generated with landing energies below a few keV is much larger than the number of backscattered charged particles with the same range of landing energies. Thus, it is particularly beneficial to avoid secondary charged particles hitting the down-beam array of detectors 360 so that a charge-based detector can be used on the down-beam array of detectors 360 whilst still predominantly detecting backscattered charged particles. For example, an aperture in the detectors of the down-beam array of detectors 360 with a diameter of approximately 50 μm should allow most of the secondary charged particles (arrows 459) to pass through to upper detector arrays. In practice a larger aperture may be beneficial, in order to reduce or prevent secondary charged particles impinging on the inside of the detector aperture (which may still be detected) of the down-beam array of detectors 360. Thus, the selection of the detector aperture may depend on a number of factors, such as pitch P between primary beams, electrode thicknesses, sample field, etc. and the desired detection performance. It is noted that any appropriate value may be used for the distance L (i.e. working distance WD), for example, the distance L may have any of the values described above.

The down-beam array of detectors 360 may also use PiN detectors. With a PiN detector being used in the down-beam array of detectors 360, secondary charged particles are typically not detected because the maximum kinetic energy (~50 eV) of the secondary electrons is too small to overcome the surface dead layer in such a detector. (Although, if the secondary electrons are accelerated, they may also be detected with a PIN detector, noting that such a detector would need to be located above the bottom most electrode of an objective lens arrangement.) The use of a PiN detector may be beneficial in that the surface layer thickness may be tuned to obtain the wanted performance, e.g. to filter out the secondary charged particles. Thus, such a detector may predominantly or only detect backscatter charged particles. Backscatter charged particles can be detected with such a detector when they have a minimum energy of a few 100 eV, which is generally sufficient. The PIN detector may have a thin metal layer on their detecting surface to get a uniform potential (voltage) distribution over the detector, and thus better performance.

In particular, the down-beam array of detectors (positioned down-beam along the primary beam paths of the at least one electrode) may comprise an array of semiconductor detectors (e.g. PIN detectors) preferably configured to detect backscatter signal particles. The down-beam array of detectors may comprise a detector surface that is down-beam along the primary beam path of the semiconductor detectors that is configured to filter secondary signal particles from incidental charged particles from the sample, preferably the detector surface is positioned so as to face the sample.

The down-beam array of detectors 360 may also be scintillator detectors preferably having a small conductive coating layer which may act as absorbing layer for the secondary charged particles. Thus, such a detector array only detects backscatter charged particles. Scintillators do not need a coating layer in principle but can have it to be able to apply a voltage to them, or to optimize the internal light reflection towards the sensor. If they do not have a coating, secondary electrons entering the scintillator may give some (small) signal (if the detectors are located above the bottom most electrode of an objective lens arrangement and if the secondary electrons are accelerated).

As secondary charged particles will not generally be detected by PiN detectors or scintillator detectors due to their surface layer, when these types of detector are used for the down-beam array of detectors 360, the aperture size may be less important. As such, it may be more feasible to use a smaller detector aperture and thus enabling smaller pitch P between the primary beams. This could come, however, at the cost of reduced secondary charged particle detection efficiency with the upper array of detectors 370. This is shown in FIG. 19E.

As described above, the diameter of the aperture in the detectors of the down-beam array of detectors 360 and/or the distance (L) between the down-beam array of detectors 360 and the sample 208 may be selected to control the charged particles which reach the different detector arrays. This is described further in relation to the difference between the signal particles shown in FIG. 19D and FIG. 19E. FIG. 19E shows a similar layout to FIG. 19D wherein the aperture size of the detectors of the down-beam array of detectors 360 and/or the distance (L) between the down-beam array of detectors 360 and the sample 208 (i.e. the working distance WD) is reduced compared to FIG. 19D.

As shown in FIG. 19E, the secondary charged particles (with curved arrows 462 and 463) are accelerated upwards from the sample 208. However, because of the limited aperture and/or proximity of the down-beam array of detectors 360 to the sample 208, some of the secondary charged particles (see arrows 462) impinge on the down-beam array of detectors 360. When the detectors of the down-beam array of detectors 360 are PiN or scintillator detectors (e.g. with some surface layer that the secondary charged particles cannot penetrate for example that may absorb the secondary charged particles), then the secondary charged particles are not detected by the down-beam array of detectors 360. Such a detector may predominantly or only detect backscatter charged particles. As shown in FIG. 19E, some of the secondary charged particles (see arrows 462) will hit the down-beam array of detectors 360 and will not be detected (depending on the detector type), which means that a smaller number of secondary charged particles (see arrows 463) may reach the upper array of detectors 370. Thus, although the configuration in FIG. 19E may beneficially reduce the primary beam pitch P, it may lead to reduces secondary charged particle detection efficiency.

The detectors used for the upper array of detectors 370 (in at least the configurations in either of FIG. 19D or FIG. 19E), can be a standard PiN or scintillator detector. Because of the acceleration of the secondary charged particles in the objective lens array 241 (due to the deceleration of the primary beam in these instances) the kinetic energy of the secondary charged particles, when impinging on the upper array of detectors 370, will be sufficient to overcome the layer and generate sufficient detector signal. Generally, for the detectors of the upper array of detectors 370, a charge based detector is not preferred as the signal-to-noise ratio may be lower, and so worse in terms of performance, than with the other types of detector.

It will be understood that backscatter charged particles represented by arrows 465 (as well as secondary charged particles) will be able to pass through the apertures in the detectors of the down-beam array of detectors 360 and thus reach the upper array of detectors 370. Therefore, the image from the upper array of detectors 370 might still comprise, or be built up, from a mix of secondary and backscatter charged particles.

As typically more secondary charged particles than backscatter charged particles are generated at landing energies below a few keV, the fraction of backscatter charged particles in the detector signal from the upper array of detectors 370 may be low. This depends on the ratio of the detection probability of secondary charged particles by the upper array of detectors 370 to the detection probability of backscatter charged particles by the upper array of detectors 370. The probabilities depend on the objective lens array geometry and the size of the aperture of the detectors in the down-beam array of detectors 360. It is expected that the ratio can be similar or better than the ratio obtained with a charge-based bottom detector with a small aperture. It has been found that the ratio can be improved (so relatively less backscatter charged particle signal in the in-lens detector image) by increasing the distance L to the sample 208 (i.e. the working distance WD), if preferable, in a given design. The change in distance L to the sample 208 (i.e. the working distance WD) could come at the cost of reduced detection efficiency: the user can thus decide how to optimize the ratio and thus the detection performance of the down-beam array of detectors 360 depending on what is more important for a specific application.

The use of PiN or scintillator detectors for both the upper array of detectors 370 and the down-beam array of detectors 360 may enable higher scanning rates than with the charge-based detector because PiN and scintillator detectors may have higher, so better, signal-to-noise ratio. This enables faster scanning than for other types of detector, such that the scanning rate per beam of the multi-beam array is at least similar to a current single beam tool; thus, higher throughput, for example, may be achieved for a multi-beam tool according to the disclosed embodiments compared to current single beam tools.

As described above, the detectors of the upper array of detectors 370 and the down-beam array of detectors 360 can be divided, e.g. in multiple portions (e.g. 4 quadrants), in rings, or both multiple portions and rings, as described in further detail below with reference to FIG. 13A and FIG. 13B. In this way, directional information on the emission of the secondary charged particles and/or backscatter charged particles can be obtained. It will be noted that because there is preferably no magnetic field in the proposed objective lens array 241 used to decelerate the primary beams, there is no mixing of angles due to rotation effects in the magnetic field during travelling to the detectors.

Figure 20A:
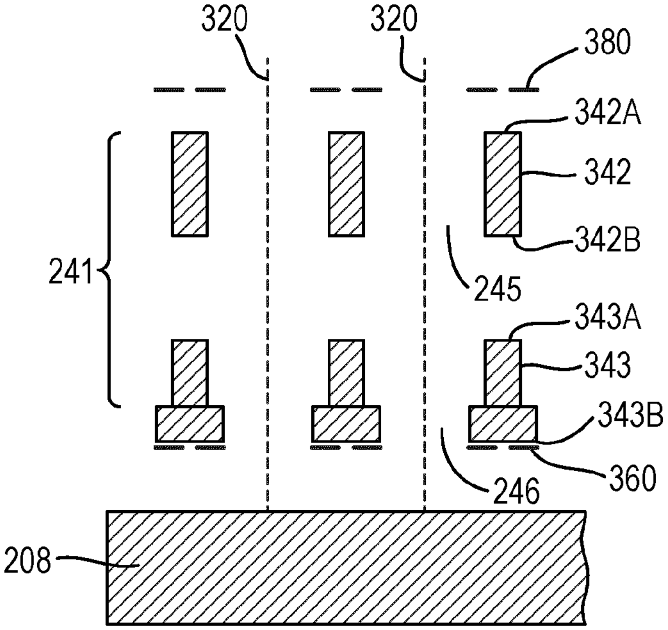
FIG. 20A is a schematic cross-sectional view of an objective lens according to some embodiments and FIG. 20B shows the objective lens of FIG. 20A in use.
Figure 20B:
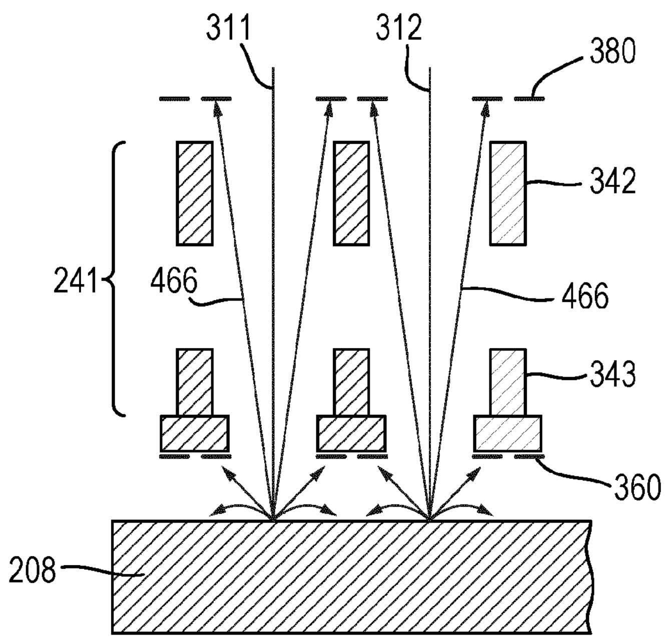

In some embodiments, the up-beam array of detectors may be up-beam (in relation to the primary beams 311 and 312) of the objective lens array 241, which is shown in FIGS. 20A and 20B and may be referred to as the above-lens array of detectors 380. In other words, the up-beam array of detectors may be above the objective lens array 241 (and in an arrangement may replace or be additional to the upper array of detectors 370 shown in FIG. 19A-19E). Therefore, the above-lens array of detectors 380 may be up-beam of all the electrodes forming the objective lens array 241. As mentioned, the above-lens array of detectors 380 may be facing towards the sample 208. In this instance, the above-lens array of detectors 380 may detect small-angle high energy charged particles (see arrows 466), for example, as described in relation to FIG. 19B. However, a smaller number of particles may reach the above-lens array of detectors 380 compared to the upper array of detectors 370 in FIG. 19B due to the greater effect of the deceleration on the signal particles as they have to travel further to the detector array. The above-lens array of detectors 380 could be provided in addition to any of the above described embodiments. Like the detectors of the other embodiments, in some embodiments, a single detector elements of above-lens array of detectors 380 surrounds each sub beam path. In some embodiments, a plurality of detector elements of above-lens array of detectors 380 are around each sub-beam path.

Combinations of the detector arrays may be provided, some of which are described above and shown in the figures. For example, the down-beam array of detectors 360 and/or the array of mirror detectors 350 and/or the upper array of detectors 370 and/or the above-lens array of detectors 380 may be provided.

The device may comprise an additional array of detectors which may be provided with any combination of the down-beam array of detectors 360 and/or the array of mirror detectors 350 and/or the upper array of detectors 370 and/or the above-lens array of detectors 380. It will be noted that the additional detector array may correspond to any of the detector arrays described above (i.e. the down-beam array of detectors 360 and/or the array of mirror detectors 350 and/or the upper array of detectors 370 and/or the above-lens array of detectors 380) or another different detector array. For example, the additional array of detectors may be the upper array of detectors 370 described above and shown in FIG. 19A-19E, and/or the additional array of detectors may be the array of mirror detectors 350 described above and shown in FIG. 17A-18B, and/or the additional array of detectors may be the down-beam array of detectors 360, and/or the additional array of detectors may be the above-lens array of detectors 380 as shown in FIG. 20A-20B. The additional array of detectors may be a detector array which differs from the above-described detectors arrays.

The objective lens array 241 may comprise the additional array of detectors. In other words, the additional array of detectors may be associated with the objective lens array 241. Thus, the additional array of detectors may be in, on, positioned adjacent to, connected to, or integrated with at least one of the electrodes of the objective lens array 241. The additional array of detectors may be associated with a down-beam (with respect to the primary beam paths 320) surface of one of the electrodes of the objective lens array 241.

As will be clear from the above described combinations of arrays, there could be any appropriate number of detector arrays. For example, there could be two, or three, or four, or five, or more arrays of detectors which are positioned at any appropriate place, for example, as described above in relation to the up-beam array of detectors and/or the down-beam array of detectors. Whichever detector arrays are provided may be used simultaneously.

As mentioned above, a detector of any of the mentioned detector arrays may be provided with multiple portions, i.e. separated into multiple zones, as described in relation to FIG. 13A and/or 13B. The portions of the zoned detector may be separated in a variety of different ways, e.g. radially, annular, or any other appropriate way. The detector may be used as part of any of the detector arrays described above, e.g. the up-beam array of detectors (e.g. the array of mirror detectors 350 and/or the upper array of detectors 370 and/or the above-lens array of detectors 380), the down-beam array of detectors 360 and/or any additional array of detectors. A detector associated with the lower electrode 343 having two annular portions is shown in FIG. 22, however, it will be understood that one or more other arrays of detectors may be provided with detectors having separate, multiple portions additionally or alternatively.

As described above, if the zoned detector is a PiN detector, it can be used to detect backscatter charged particles. However if a PiN detector being used as a zoned detector in the down-beam array of detectors 360, secondary charged particles are generally not detected because the maximum kinetic energy (~50 eV) of the secondary electrons is too small to overcome the surface dead layer in such a detector. (Although, if the secondary electrons are accelerated, they may also be detected with a zoned PIN detector, noting that such a detector would need to be located above the bottom most electrode of an objective lens arrangement.)

Some of the advantages will be described in relation to FIG. 22, in which the paths of signal particles) are shown to be incident on both the inner annular portion 605A and the outer annular portion 605B (see arrows 467 and 468 respectively). Having the detectors being separated into portions, e.g. annular portions or sector portions, is beneficial in that it allows more types of information to be obtained in relation to the signal particles detected. For example, signal particles with a smaller angle (see arrows 467) can be detected at the inner annular portion 605A and signal particles with larger angle (see arrows 468) can be detected at the outer annular portion 605B. Thus, providing detectors with multiple portions may be beneficial in obtaining additional information relating to the detected signal particles. However, there is an additional cost in terms of the complexity of the detector.

As described above, the width of the first detecting portion may be approximately 2 μm to 100 μm and/or the width of the second detecting portion may be approximately 10 μm to 250 μm. Further preferable values relating to the size of the portions is described in relation to FIG. 13A and FIG. 13B. The size of the portions may be selected based on the desired detection of signal particles.

Any of the above described detector arrays can be combined, i.e. any of the above described detector arrays can be used simultaneously.

A potential of the down-beam array of detectors 360 relative to a potential of the sample 208 can be selected to control detection of the charged particles by the down-beam array of detectors 360. Preferably the control in detection of the charged particles (i.e. the way in which the detection is controlled by the potential selection) is in an energy range of the charged particles detected and/or the angular trajectory of the detected charged particles emitted from the sample 208. The angular trajectory is described herein with respect to the respective primary beam which is incident on the sample 208 resulting in the detected charged particle. Although the angles of the signal particles are generally described with reference to the primary beam paths 320, the angles could be described with reference to the sample surface 208. It will be understood that the sample 208 may generally be provided such that it is orthogonal (i.e. at substantially 90° to the primary beam paths 320).

More generally, a potential of any of the detector arrays (e.g. the array of mirror detectors 350 and/or the upper array of detectors 370 and/or the above-lens array of detectors 380 and/or the down-beam array of detectors 360 and/or any additional array of detectors) relative to a potential of the sample 208 may be selected to control detection of the charged particles at least that detector array.

It will be noted that controlling the potential of any of the detector arrays may have limited use depending on the position of the particular detector array. For example, it may be useful to select a potential of a detector array positioned above at least one of the electrodes of the objective lens array 241 to control detection of signal particles when the objective lens array 241 is configured to accelerate the primary beams. However, there may be limitations in varying the potential of the detector because any detector array positioned proximate the sample 208 (e.g. the down-beam array of detectors 360) may have a potential similar to the sample in order to reduce or avoid possible damage to the sample 208.

Figure 21:
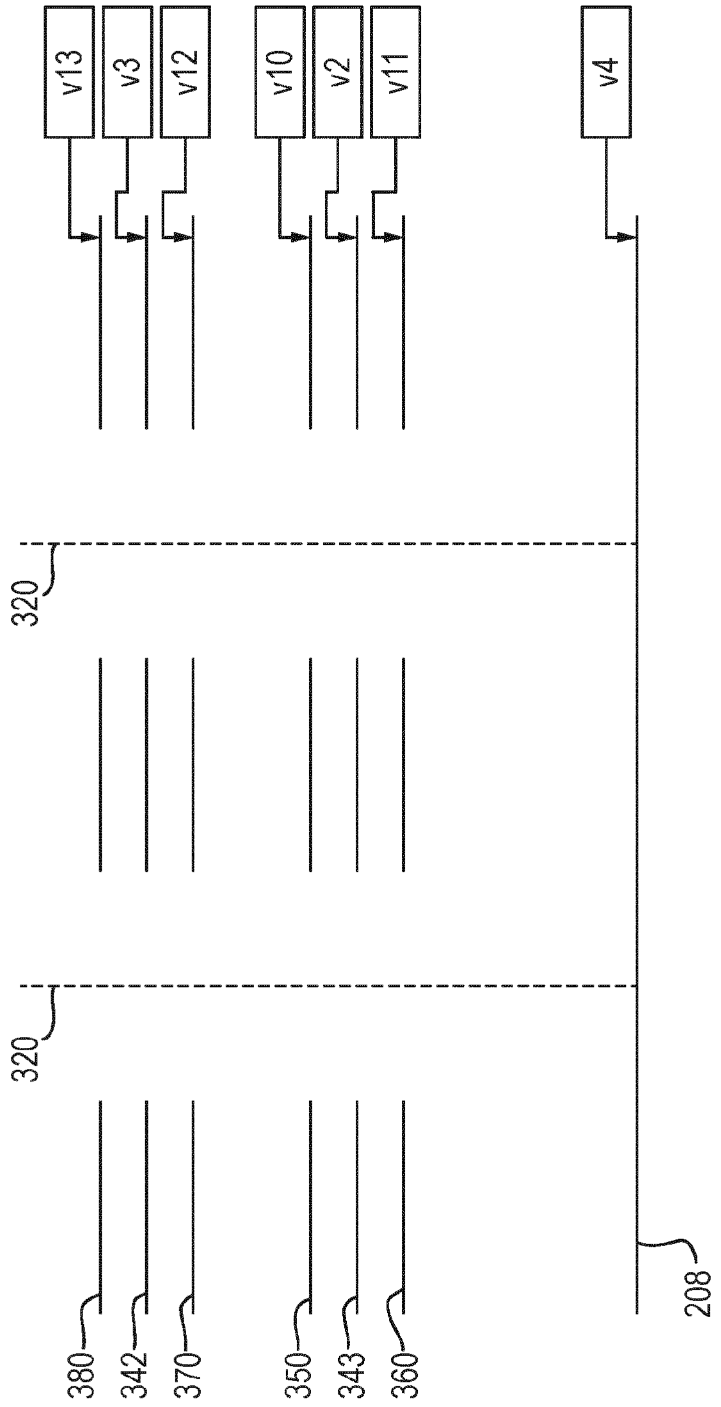
FIG. 21 is a schematic diagram of an exemplary charged particle optical device according to some embodiments.

FIG. 21 shows that voltage sources may be provided to each of the detector arrays, the electrodes of the objective lens array 241 and the sample 208 (for example as one or more voltages sources controlled to apply respective (e.g. different) potentials to one or more of the: detector arrays, the electrodes of the objective lens array 241 and the sample 208). As described above, voltage sources V2 and V3 may provide potential to the lower electrode 343 and the upper electrode 342 respectively. As described above, the voltage source V4 may supply potential to the sample 208.

The array of mirror detectors 350 is provided with voltage source V10 to provide a potential to the array of mirror detectors 350. The down-beam array of detectors 360 is provided with voltage source V11 to provide a potential to the down-beam array of detectors 360. The upper array of detectors 370 (positioned between the upper electrode 242 and the lower electrode 243) is provided with voltage source V12 to provide a potential to the upper array of detectors 370. The above-lens array of detectors 380 above the objective lens array 241 is provided with voltage source V13 to provide a potential to the above-lens array of detectors 380 above the objective lens array 241.

Although FIG. 21 shows multiple voltage sources (or indeed at least one voltage source) and detector arrays, only one of some of the detector arrays may be provided as described in the above embodiments. (Note such a voltage source or voltage sources may be under the control of one or more controllers as disclosed herein below). Furthermore, only the corresponding voltage source for the supplied detector array may be provided. For example if only the array of mirror detectors 350 is provided without any of the other detector arrays, then, only V10 (the voltage source for the array of mirror detectors 350) may be provided i.e. out of the voltage sources shown for the detector arrays in FIG. 21 (that is: without V13, V12, or V11). Further voltage sources may be provided for any additional and/or alternative detector arrays, and then any additional or alternative voltage source would correspond to the additional and/or alternative detector array present.

The potentials applied to the detector arrays may be substantially the same as the potential applied to an associated electrode of the objective lens array. For example, the potential applied to the down-beam array of detectors 360 by voltage source V11 may be substantially the same as the potential applied to the lower electrode 343 by voltage source V2.

In the above embodiments, the objective lens array 241 generally comprises at least two electrodes. The objective lens array 241 may comprise comprises a further electrode. The further electrode may be positioned up-beam of the upper electrode. In this instance, the upper electrode described above may be a mid-electrode. Alternatively, the further electrode may be positioned between the lower electrode and the upper electrode. In this instance, the further electrode may be a mid-electrode.

Some preferable types of detector are mentioned above. However, it will be noted that the detectors used in any of the described arrays may be any appropriate type of detector, for example, a charge detector, PIN detector or scintillator detector. Different types of detector may be used for different arrays. The same type of detector may be used for multiple detector arrays, or even all the detector arrays.

The array of primary beams may correspond with any/all detector arrays provided. Thus, the array of primary beams may correspond with the array of mirror detectors 350, and/or the down-beam array of detectors 360, and/or the upper array of detectors 370 and/or above-lens array of detectors 380. Thus, any/all of the detector arrays may be aligned with the primary beams.

Any/all of the detector arrays may correspond with each other. For example, the array of mirror detectors 350 may correspond with the down-beam array of detectors 360 and/or the upper array of detectors 370 and/or above-lens array of detectors 380. The down-beam array of detectors 360 may correspond with the array of mirror detectors 350 and/or the upper array of detectors 370 and/or the above-lens array of detectors 380. In other words, any/all of the detector arrays may be aligned with each other.

Any of the detector arrays described above may be arranged along the primary beam paths 320. In other words, the primary beam paths 320 may pass through any/all detector array, and preferably through corresponding apertures in the respective detector array for the passage therethrough of the primary beams. Each of the detectors in a single detector array may be at a common position along the sub-beam paths. Any of the detector arrays may be substantially orthogonal to the sub-beams.

In any of the above embodiments, the objective lens array 241 may be provided without a bottom detector array positioned between the objective lens array 241 and the sample 208. In this case, the objective lens array 241 may be configured to repel secondary charged particles emitted from the sample 208, for example at least the electrode of the objective lens array 241 most proximate to the sample or most down-beam the path of the multi-beam. Such an arrangement can be used with a detector module in which detector elements are above the most down-beam electrode of the objective lens array 241. The array of objective lenses may be configured to have potential differences applied so as to achieve the repelling of the secondary charged particles.

In some embodiments, a method is provided projecting an array of beams of charged particles onto a sample so as to detect signal particles emitted from the sample. The method may use the objective lens array and/or any of the detector arrays described above. The method comprise projecting the beams 311 and 312 along primary beam paths 320 onto a surface of the sample 208, and detecting the signal particles emitted from the sample 208 simultaneously at an up-beam array of detectors up-beam along the primary beam paths of at least one electrode of an objective lens array 241 (e.g. the array of mirror detectors 350, or the upper array of detectors 370, or the above-lens array of detectors 380) and at a down-beam array of detectors 360 down-beam along the primary beam paths of at least one electrode of an objective lens array 241.

In the present example, the up-beam array of detectors may be the array of mirror detectors 350. In other words, the array of mirror detectors may be arranged along the primary beam paths 311 and 312 and configured to face up-beam of the primary beam path 320 away from the sample 208.

In some embodiments, a method is provided of projecting an array of beams of charged particles onto a sample 208 so as to detect signal particles emitted from the sample 208. The method comprises projecting the beams along primary beam paths onto a surface of the sample and detecting the signal particles emitted from the sample 208 at an up-beam array of detectors arranged along the primary beam paths 320 and facing up-beam of the primary beam paths 320 away from the sample 208. In this instance, the up-beam array of detectors corresponds to the array of mirror detectors 350 described above.

In the present example, the method may comprise detecting signal particles emitted from the sample simultaneously at the array of mirror detectors and at a down-beam array of detectors 360. The array of mirror detectors 350 is positioned up-beam along the primary beam paths 320 of an electrode of an objective lens array 241 and the down-beam array of detectors 360 is positioned down-beam along the primary beam paths 320 of the at least one electrode.

These methods may comprise repelling signal particles emitted from the sample 208 that have an energy less than a threshold and wherein the repelling uses at the least the down-beam array of detectors 360. These methods may comprise repelling signal particles emitted from the sample 208 that have an energy less than a threshold. The threshold may determine the minimum initial energy of signal particles that can still reach the detector. The threshold may exceed an energy of a secondary signal particle emanating from the sample 208. In these methods, the projecting may comprise accelerating the charged particle beams in the objective lens array 241. In these methods, the projecting may comprise decelerating the charged particle beams in the objective lens array 241. In these methods, the detecting may comprise detecting signal particles of different energies and/or different angular trajectories using different detector arrays, preferably at least two of the array of mirror detectors 350, the down-beam array of detectors 360, and/or the upper array of detectors 370 and/or the above-lens array of detectors 380 and/or any additional array of detectors. In these methods, any of the detector arrays may comprise detectors each having a plurality of portions.

In some embodiments, a method is provided of detecting charged particles emitted from a sample 208 using a multi-beam charged particle assessment tool comprising the charged particle-optical device as described above in any of the embodiments or variations described. The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector. References to elements being aligned along a beam path or sub-beam path are understood to mean that the respective elements are positioned along the beam path or sub-beam path. References to optics are understood to mean electron-optics.

The charged-particle optical device may be a negative charged particle device. The charged-particle optical device may otherwise be referred to as an electron-optical device. It will be understood that an electron is a specific charged particle and can replace all instances of charged particle referred to throughout the application as appropriate. For example, the source may specifically provide electrons. The charged particle referred to throughout the specification may be specifically a negatively charged particle.

The charged particle-optical device may more specifically be defined as a charged particle-optical column. In other words, the device may be provided as a column. The column may thus comprise an objective lens array assembly as described above. The column may thus comprise a charged particle optical system as described above, for example comprising an objective lens array and optionally a detector array and/or optionally a condenser lens array.

The charged particle optical device described above comprises at least the objective lens array 240. The charged particle optical device may comprise the detector array 241. The charged particle optical device may comprise the control lens array 250. The charged particle optical device comprising the objective lens array and the detector array may thus be interchangeable with, and referred to as, the objective lens array assembly, which may optionally comprise the control lens array 250. The charged particle optical device may comprise additional components described in relation to either of FIG. 3 and/or FIG. 16. Thus, the charged particle optical device may be interchangeable with, and referred to as, a charged particle assessment tool 40 and/or an electron optical system if comprising the additional components in these figures.

An assessment tool according to some embodiments may be a tool which makes a qualitative assessment of a sample (e.g. pass/fail), one which makes a quantitative measurement (e.g. the size of a feature) of a sample or one which generates an image of map of a sample. Examples of assessment tools are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools). The electron beam tool 40 (which may be an electron-optical column) may be a component of an assessment tool; such as an inspection tool or a metro-inspection tool, or part of an e-beam lithography tool. Any reference to a tool herein is intended to encompass a device, apparatus or system, the tool comprising various components which may or may not be collocated, and which may even be located in separate rooms, especially for example for data processing elements.

Reference to a component or system of components or elements being controllable to manipulate a charged particle beam in a certain manner includes configuring a controller or control system or control unit (e.g. controller 50) to control the component to manipulate the charged particle beam in the manner described, as well as optionally using other controllers or devices (e.g. voltage supplies and/or current supplies) to control the component to manipulate the charged particle beam in this manner. For example, a voltage supply may be electrically connected to one or more components to apply potentials to the components, such as in a non-limited list including the control lens array 250, the objective lens array 241, the condenser lens 231, correctors, collimator element array 271, the sample 208 and scan deflector array 260, under the control of the controller or control system or control unit. An actuatable component, such as a stage, may be controllable to actuate and thus move relative to another components such as the beam path using one or more controllers, control systems, or control units to control the actuation of the component.

The embodiments herein described may take the form of a series of aperture arrays or electron-optical elements arranged in arrays along a beam or a multi-beam path. Such electron-optical elements may be electrostatic. In some embodiments, all the electron-optical elements, for example from a beam limiting aperture array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e. using MEMS manufacturing techniques).

The system or device of such architectures as depicted in at least FIGS. 3 and 16 and as described above may comprise components such as an upper beam limiter, a collimator element array 271, a control lens array 250, a scan deflector array 260, an objective lens array 241, a beam shaping limiter and/or a detector array 240; one or more of these elements that are present may be connected to one more adjacent elements with an isolating element such as a ceramic or glass spacer.

Some embodiments of the present disclosure may be embodied as a computer program. For example, a computer program may comprise instructions to instruct the controller 50 to perform the following steps. The controller 50 controls the electron beam apparatus to project an electron beam towards the sample 208. In some embodiments, the controller 50 controls at least one electron-optical element (e.g. an array of multiple deflectors or scan deflectors 260, 265) to operate on the electron beam in the electron beam path. Additionally or alternatively, in some embodiments, the controller 50 controls at least one electron-optical element (e.g. the detector array 240) to operate on the electron beam emitted from the sample 208 in response to the electron beam.

While the present invention has been described in connection with various embodiments, other embodiments of the invention will be apparent to those skilled in the art from consideration of the specification and practice of the technology disclosed herein.

An insulating structure is described in relation to adjacent electrodes above. In some instances, the insulating structure is described in relation to a first and/or second electrode specifically. The insulating structure may be applied to any adjacent electrodes and reference to the first and second electrode may be replaced with other electrodes. If more than two electrodes are provided, multiple insulating structures may be provided. For example, there may be a sequence of insulating structures.

Any element or collection of elements may be replaceable or field replaceable within the electron beam tool 40. The one or more electron-optical components in the electron beam tool 40, especially those that operate on sub-beams or generate sub-beams, such as aperture arrays and manipulator arrays may comprise one or more MEMS.

It is intended that the specification and examples be considered as exemplary only, with a true scope and spirit of the invention being indicated by the following claims, clauses and further clauses.

In an arrangement there is provided:

Clause 1: A charged particle-optical device for a charged particle assessment tool, the device being configured to project a multi-beam of charged particles along sub-beam paths towards a sample, the multi-beam comprising sub-beams, the device comprising: an objective lens array configured to project an array of charged particle sub-beams onto the sample; and a detector array configured to be proximate the sample and configured to capture charged particles emitted from the sample, wherein the charged particle-optical device is configured to repel secondary charged particles emitted from the sample away from the detector.

Clause 2: The charged particle-optical device of clause 1, wherein the objective lenses are configured to accelerate the charged particle sub-beams along the sub-beam paths.

Clause 3: A charged particle-optical device for a charged particle assessment tool, the device being configured to project a multi-beam of charged particles along sub-beam paths towards a sample, the multi-beam comprising sub-beams, the device comprising: an objective lens array configured to project an array of charged particle sub-beams onto the sample; and a detector array configured to be proximate a sample and configured to capture charged particles emitted from the sample, wherein the objective lenses are configured to accelerate the charged particle sub-beams along the sub-beam paths.

Clause 4: The charged particle-optical device of clause 3, wherein the charged-particle optical device is configured to repel secondary charged particles emitted from the sample away from the detector.

Clause 5: The charged particle-optical device of any preceding clause, wherein the detector array is configured in use to have a potential and the sample is configured in use to have a potential, wherein the sample potential is more positive than the detector array potential.

Clause 6: The charged particle-optical device of clause 5, wherein the potential difference between the sample potential and the detector array potential is greater than a secondary electron threshold.

Clause 7: The charged particle-optical device of any preceding clause, wherein the objective lens array comprises at least two electrodes in which are defined aperture arrays, corresponding apertures in the at least two electrodes are aligned with and arranged along a sub-beam path.

Clause 8: The charged particle-optical device of clause 7, wherein a first electrode of the at least two electrodes is up-beam of a second electrode of the at least two electrodes, the first electrode being configured in use to have a first electrode potential and the second electrode being configured in use to have a second electrode potential, wherein the second electrode potential is more positive than the first electrode potential.

Clause 9: The charged particle-optical device of clause 8, wherein the sample is configured to be at a potential in use, wherein the sample potential is more positive than the second electrode potential.

Clause 10: The charged particle-optical device of clause 9, wherein the sample potential is approximately +20 kV to +100 kV relative to a source of the charged particle beam, and preferably, the sample potential is approximately +20 kV to +70 kV.

Clause 11: The charged particle-optical device of any one of clauses 8 to 10, wherein the first electrode potential is between approximately +3 kV to +8 kV relative to a source of the charged particle beam, and preferably, the first electrode potential is approximately +5 kV.

Clause 12: The charged particle-optical device of any one of clauses 8 to 11, wherein the second electrode potential is approximately +20 kV to +100 kV relative to a source of the charged particle beam, and preferably, the second electrode potential is approximately +20 kV to +70 kV.

Clause 13: The charged particle-optical device of any one of clauses 7 to 12, wherein the diameter of the apertures in at least one electrode is between approximately 30 to 300 μm.

Clause 14: The charged particle-optical device of any one of clauses 7 to 13, wherein the pitch between adjacent apertures in at least one electrode is between approximately 50 μm and 500 μm.

Clause 15: The charged particle-optical device of any one clauses 7 to 14, further comprises an insulating structure separating adjacent electrodes, the insulating structure comprising of a main body and a protrusion radially inwards of the main body, the main body having a first side and a second side, the second side opposing the first side, wherein one of the electrodes contacts the main body and the protrusion on the first side of the insulating structure, and the main body contacts an other of the electrodes on the second side of the insulating structure and a gap is defined between the protrusion and the other of the electrodes.

Clause 16: The charged particle-optical device of any of the preceding clauses, further comprising a control lens array positioned up-beam of the objective lens array, wherein each control lens is associated with a respective objective lens.

Clause 17: The charged particle-optical device of clause 16, wherein the control lens array is configured to provide an intermediate focus between respective control lenses and corresponding objective lenses.

Clause 18: The charged particle-optical device of either or clauses 16 or 17, wherein the control lens array is configured to decelerate the charged particle sub-beams along the sub-beam paths.

Clause 19: The charged particle-optical device of any preceding clause, wherein the detector array is configured to detect more backscattered charged particles than secondary charged particles.

Clause 20: The charged particle-optical device of any preceding clause, wherein the detector array is positioned between approximately 10 μm to 50 μm of the sample.

Clause 21: The charged particle-optical device of any one of the preceding clauses, further comprising an electric power source which is configured to apply potentials to the at least one electrode of the objective lens array and/or the sample in use.

Clause 22: An objective lens assembly for projecting a multi-beam of charged particles towards a sample surface, the objective lens assembly comprising: an objective lens array comprising at least two electrodes arranged along the path of the multi-beam and in which are defined a plurality of apertures, and a detector array configured to detect charged particles emanating from the sample in response to the multi-beam, wherein: the detector array is configured to be positionable proximate to the sample and is configured to repel secondary electrons emanating from the sample away from the detector.

Clause 23: The objective lens assembly of clause 22, wherein the sample is set to a sample potential and the detector array is set to a detector array potential, and the potential difference between the sample potential and the detector array potential is greater than a secondary electron threshold.

Clause 24: The objective lens assembly of clause 23, wherein the secondary electron threshold is the potential difference equivalent to the likely electron energy of a secondary electron emanating from the sample.

Clause 25: The objective lens assembly of any one of clauses 22 to 24, wherein the detector array is configured to detect more backscatter electrons than secondary electrons.

Clause 26: A charged particle-optical device for a multi-beam charged particle assessment tool, the device being configured to project a multi-beam of charged particles along sub-beam paths towards a sample, the multi-beam comprising sub-beams, the device comprising: an objective lens array configured to project an array of charged-particle sub-beams onto the sample; and a detector array configured to capture charged particles emitted from the sample, wherein the device is configured to switch between two operation states, wherein in a first operation state, the detector array is configured to detect more secondary charged particles than backscatter charged particles, and in a second operation state, the detector array is configured to detect more backscattered charged particles than secondary charged particles.

Clause 27: The charged particle-optical device of clause 26, wherein in the first operation state, the objective lenses are configured to decelerate the charged particle beam onto the sample, and in the second operation state, the objective lenses are configured to accelerate the charged particle beam onto the sample.

Clause 28: The charged particle-optical device of either of clauses 26 or 27, wherein the objective lens array is configured to maintain a focus of the charged-particle sub-beams on the sample in the first and second operation states.

Clause 29: The charged particle-optical device of any one of clauses 26 to 28, wherein the objective lens array comprises a first electrode configured to have a first electrode potential and a second electrode configured to have a second electrode potential, the first electrode being up-beam of the second electrode.

Clause 30: The charged particle-optical device of clause 29, wherein in the first operation state, the first electrode potential is more positive than the second electrode potential.

Clause 31: The charged particle-optical device of either of clauses 29 or 30, wherein in the second operation state, the second electrode potential is more positive than the first electrode potential.

Clause 32: The charged particle-optical device of any one of clauses 29 to 31, wherein at least the first electrode potential is adjusted between the first and second operation states to maintain a focus of the primary beam on the sample in the first and second operation states.

Clause 33: The charged particle-optical device of any one clauses 29 to 32, wherein adjacent electrodes are separated by an insulating structure which is configured for use in the first operation state and the second operation state, preferably wherein the objective lens array comprises the insulating structure.

Clause 34: The charged particle-optical device of clause 33, wherein the insulating structure is formed of a main body and a protrusion radially inwards of the main body, the main body featuring a first and second side, the first side opposing the second side, wherein: on the first side of the insulating structure the main body contacts one of the electrodes and a first gap is formed between the protrusion and the one of the electrodes, and on the second side of the insulating structure, the main body contacts an other one of the electrodes and a second gap is formed between the protrusion and the other of the electrodes.

Clause 35: The charged particle-optical device of any one of clauses 29 to 34, further comprising an electric power source which is configured to apply the first electrode potential to the first electrode and/or the second electrode potential to the second electrode.

Clause 36: The charged particle-optical device of any one of clauses 26 to 35, wherein the detector array is configured to be proximate the sample.

Clause 37: The charged particle-optical device of any one of clauses 26 to 36, wherein the device is configured to maintain a distance between the detector array and the sample between the first and second operation states and vice versa.

Clause 38: The charged particle-optical device of any one of clauses 26 to 37, wherein the device is configured to alter the distance between the detector array 240 and the sample 208 so that the secondary charged particles are focused on the detector array 240 when in the first operation state and the backscattered charged particles are focused on the detector array 240 when in the second operation state.

Clause 39: The charged particle-optical device of any one of clauses 26 to 38, wherein the device is configured in use to alter a distance between the objective lens array and the sample when switching between the first and second operation states and vice versa.

Clause 40: The charged particle-optical device of clause 39, wherein the device is configured to reduce the distance between the objective lens array and the sample when switching to the second operation state.

Clause 41: The charged particle-optical device of either of clause 39 or clause 40, wherein the device is configured to increase a distance between the objective lens array and the sample when switching to the first operation state.

Clause 42: The charged particle-optical device of any one of clauses 39 to 41, wherein the device is configured to move the objective lens array and/or the sample with respect to each other along the sub-beam paths so as to switch between the first and second operation states.

Clause 43: The charged particle-optical device of any one of clauses 39 to 42, further comprising an actuator configured to move the objective lens array so as to alter the distance between the objective lens array and the sample.

Clause 44: The charged particle-optical device of any one clauses 39 to 43, wherein the device is configured to move the sample so as to alter the distance between the objective lens array and the sample.

Clause 45: The charged particle-optical device of any one of clauses 39 to 44, wherein the objective lens array is configured to be part of a switchable module, different modules having an objective lens array at different distances from the sample along the sub-beam path.

Clause 46: A detector for a charged particle assessment tool, wherein the detector is configured to capture charged particles emitted from a sample, and wherein the detector is configured to switch between two operation states, wherein in a first operation state, the at least one detector is configured to detect more secondary charged particles than backscatter charged particles, and in a second operation state, the at least one detector is configured to detect more backscattered charged particles than secondary charged particles.

Clause 47: The detector of clause 46, in which an aperture is defined and configured for the through passage of a charged particle beam, the detector comprising: an inner detecting portion surrounding the aperture; and an outer detecting portion, radially outwards of the inner detecting portion.

Clause 48: The detector of clause 47, wherein in the first operation state, the detector uses the inner detecting portion and not the outer detecting portion.

Clause 49: The detector of either of clauses 47 or 48, wherein in the second operation state, the detector uses at least the outer detecting portion.

Clause 50: The detector of any one of clauses 46 to 49, wherein the diameter of the first detecting portion is approximately 40-60 μm and/or the diameter of the second detecting portion is approximately 150 to 250 μm.

Clause 51: A detector array for a charged particle assessment tool configured to operate: in a backscatter operational state to detect preferably backscatter charged particles; and in a secondary charged particle state to detect preferably secondary charged particles, the detector array comprising an array of detectors as claimed in any one of clauses 46 to 50.

Clause 52: A charged particle-optical device for a for a multi-beam charged particle assessment tool comprising: an objective lens array; and a detector array, the detector array comprising an array of detectors as claimed in any one of clauses 46 to 50, wherein the apertures in the electrodes of objective lens array and the detector array are arranged on sub-beam paths of the charged particle multi-beam.

Clause 53: The charged particle-optical device of any one of clauses 1 to 21 or 26 to 45, wherein the detector array comprises the detector of any of clauses 46 to 50.

Clause 54: The objective lens assembly of any one of clauses 22 to 25, wherein the detector array comprises the detector of any one of clauses 46 to 50.

Clause 55: A method of projecting a plurality of charged particle beams onto a sample so as to detect a greater proportion of backscatter charged particles in the charged particles emitted from the sample, the method comprising: a) projecting the charged particle beams onto a surface of the sample; and b) repelling secondary charged particles emitted from the sample.

Clause 56: A method of projecting a plurality of charged particle beams onto a sample so at to detect a greater proportion of backscatter charged particles in the charged particles emitted from the sample, the method comprising: a) projecting the charged particle beams onto a surface of the sample comprising accelerating the charged particle beams in an objective lens array.

Clause 57: A method of selectively detecting secondary charged particles and backscatter charged particles emitted from a sample, the method comprising: a) selecting a mode of operation of a detector between: a backscatter mode for detecting more backscatter charged particles than secondary charged particles; and a secondary mode for detecting more secondary charged particles than backscatter charged particles; b) projecting a plurality of charged particle beams onto a surface of the sample; and c) detecting charged particles emitted from the sample in the selected mode of operation.

Clause 58: The method of clause 57, further comprising accelerating the charged particle beams in an objective lens array in the backscatter mode and/or decelerating the charged particle beams in an objective lens array in the secondary mode.

Clause 59: A method of detecting secondary charged particles and backscatter charged particles emitted from a sample, the method comprising: a) selecting a mode of operation of a detector between: a backscatter mode for detecting more backscatter charged particles than secondary charged particles; and a secondary mode for detecting more secondary charged particles than backscatter charged particles; b) capturing charged particles emitted from the sample so as to detect charged particles in the selected mode.

Clause 60: The method of any one of clause 56 to 59, further comprising repelling secondary charged particles emitted from the sample.

Clause 61: A method of operating a charged particle assessment tool for detecting backscatter charged particles, the method comprising: a) projecting a multi-beam of charged particles towards a sample surface; b) repelling charged particles emanating from the sample in response to the multi-beam that have an energy less than a threshold; and c) detecting charged particles emitted from the sample and having an energy at least the threshold, using a detector array positioned proximate the sample.

Clause 62: The method of clause 61, wherein the threshold exceeds an energy of a secondary charged particle emanating from the sample.

Clause 63: The method of either of clauses 61 or 62, wherein the projecting comprises accelerating the multi-beam of charged particles towards the sample, the accelerating preferably in the objective lens array.

Clause 64: The method of any one of clauses 61 to 63, wherein the repelling uses at least the detector array.

Clause 65: The method of any one of clauses 55 to 64, further comprising providing an intermediate focus between respective control lenses and corresponding objective lenses.

Clause 66: The method of any one of clauses 55 to 65, wherein in the detecting, more backscatter charged particles are detected than secondary charged particles.

Clause 67: A method of detecting backscatter charged particles, the method comprising using a multi-beam charged particle assessment tool comprising the charged particle-optical device of any one of clauses 1 to 21, 26 to 45, 52 and 53 or the objective lens assembly of any one of clauses 22 to 25 and 54.

Clause 68: A charged particle-optical device for a charged particle assessment tool, the device being configured to project a multi-beam of charged particles along sub-beam paths towards a sample, the multi-beam comprising sub-beams, the device comprising: an objective lens array configured to project an array of charged particle sub-beams onto the sample, the objective lens array comprising at least one electrode; an up-beam array of detectors positioned up-beam of at least one electrode along the sub-beam paths; and a down-beam array of detectors positioned down-beam of the at least one electrode along the primary beam paths, wherein the up-beam array of detectors and the down-beam array of detectors are configured simultaneously to detect signal particles.

Clause 69: A charged particle-optical device for a charged particle assessment tool, the device being configured to project a multi-beam of charged particles along sub-beam paths towards a sample, the multi-beam comprising sub-beams, the device comprising: an objective lens array configured to project an array of charged particle sub-beams onto the sample and comprising at least one electrode; and an array of detectors arranged along the sub-beam paths and configured to detect signal charged particles and to face upbeam of the sub-beam paths away from the sample.

In an arrangement there is provided the following further clauses.

Further clause 1: A charged particle-optical device for a charged particle system, the device being configured to project an array of beams of charged particles along primary beam paths towards a sample, the device comprising: an objective lens array configured to project the beams onto the sample and comprising at least one electrode; an up-beam array of detectors positioned up-beam along the primary beam paths of the at least one electrode (or positioned up-beam of the at least one electrode along the primary beam paths); and a down-beam array of detectors positioned down-beam along the primary beam paths of the at least one electrode (or positioned down-beam of the at least one electrode along the primary beam paths), desirably wherein the up-beam array of detectors and the down-beam array of detectors are configured simultaneously to detect signal particles.

Further Clause 2: The charged particle-optical device of further clause 1, wherein the up-beam array of detectors is arranged along the primary beam paths and is configured to face up-beam of the primary beam paths away from the sample.

Further Clause 3: A charged particle-optical device for a charged particle system, the device being configured to project an array of beams of charged particles along primary beam paths towards a sample, the device comprising: an objective lens array configured to project the beams onto the sample and comprising at least one electrode; and an array of detectors arranged (e.g. at a common position) along the primary beam paths and configured to detect signal particles and to face up-beam of the primary beam paths away from the sample.

Further Clause 4: The charged particle-optical device of further clause 3, comprising a down-beam array of detectors positioned down-beam along the primary beam paths of the at least one electrode, wherein: the array of detectors is an up-beam array of detectors positioned up-beam along the primary beam paths of the at least one electrode; and the up-beam array of detectors and the down-beam array of detectors are configured simultaneously to detect signal particles.

Further Clause 5: The charged particle-optical device of any one of further clauses 1, 2, and 4, wherein the down-beam array of detectors is positioned down-beam of the objective lens array along the primary beam paths and facing the sample in use.

Further Clause 6: The charged particle-optical device of any one of further clauses 1, 2, 4 and 5, wherein a potential of the down-beam array of detectors relative to a potential of the sample is selected to control detection of the signal particles by the down-beam array of detectors, preferably the control in detection of the signal particles is in an energy range of the signal particles and/or an angular trajectory of the signal particles from the sample preferably with respect to the respective primary beam paths.

Further Clause 7: The charged particle-optical device of any one of further clauses 1-2 and 4-6, wherein the charged particle-optical device is configured to repel secondary signal particles emitted from the sample away from the down-beam array of detectors.

Further Clause 8: The charged particle-optical device of further clause 7, wherein the down-beam array of detectors is configured in use to have a potential and the sample is configured in use to have a potential, wherein the sample potential is more positive than the down-beam array of detectors potential.

Further Clause 9: The charged particle-optical device of further clause 8, wherein the potential difference between the sample potential and the down-beam array of detectors potential is greater than a secondary signal particle threshold.

Further Clause 10: The charged particle-optical device of any one of further clauses 1-2 and 4-9, wherein the down-beam array of detectors is positioned between approximately 10 μm to 1 mm of the sample.

Further Clause 11: The charged particle-optical device of any one of further clauses 1, 2 and 4-10, wherein the position of the down-beam array of detectors relative to the sample is selected to control detection of secondary signal particles by the down-beam array of detectors and/or the up-beam array of detectors.

Further Clause 12: The charged particle-optical device of any one of further clauses 1, 2 and 4-11, wherein an aperture is defined in each detector of the down-beam array of detectors, wherein the aperture is aligned with and arranged along a primary beam path, wherein a width of the aperture is selected to control detection of secondary signal particles by the down-beam array of detectors and/or the up-beam array of detectors.

Further Clause 13: The charged particle-optical device of any one of further clauses 1-2 and 4-12, wherein the objective lens array comprises at least two electrodes in which are defined aperture arrays, corresponding apertures in the at least two electrodes are aligned with and arranged along a primary beam path, the at least two electrodes comprising an upper electrode and a lower electrode, the upper electrode being up-beam of the lower electrode along the primary beam path.

Further Clause 14: The charged particle-optical device of further clause 13 wherein the down-beam array of detectors is associated with the lower electrode.

Further Clause 15: The charged particle-optical device of either of further clauses 13 or 14, wherein the down-beam array of detectors is associated with a down-beam surface of the lower electrode.

Further Clause 16: The charged particle-optical device of any one of further clauses 1 to 13, wherein the objective lens array comprises at least two electrodes in which are defined aperture arrays, corresponding apertures in the at least two electrodes are aligned with and arranged along a primary beam path, the at least two electrodes comprising an upper electrode and a lower electrode, the upper electrode being up-beam of the lower electrode along the primary beam path.

Further Clause 17: The charged particle-optical device of any one of further clauses 13 to 16, wherein the up-beam array of detectors is associated with one of the at least two electrodes of the objective lens array.

Further Clause 18: The charged particle-optical device of any one of further clauses 13 to 17, wherein the up-beam array of detectors is associated with an up-beam surface of one of the at least two electrodes of the objective lens array.

Further Clause 19: The charged particle-optical device of further clause 18, wherein the up-beam array of detectors is associated with an up-beam surface of the lower electrode of the objective lens array.

Further Clause 20: The charged particle-optical device of any one of further clauses 13 to 17, wherein the up-beam array of detectors is associated with a downbeam surface of one of the at least two electrodes of the objective lens array.

Further Clause 21: The charged particle-optical device of further clause 20, wherein the up-beam array of detectors is associated with a down-beam surface of the upper electrode of the objective lens array.

Further Clause 22: The charged particle-optical device of any one of further clauses 13 to 21, wherein the objective lens array comprises a further electrode.

Further Clause 23: The charged particle-optical device of further clause 22, wherein the further electrode is positioned up-beam of the upper electrode.

Further Clause 24: The charged particle-optical device of further clause 22, wherein the further electrode is positioned between the lower electrode and the upper electrode.

Further Clause 25: The charged particle-optical device of any one of further clauses 13 to 24, wherein the up-beam array of detectors is up-beam of the objective lens array.

Further Clause 26: The charged particle-optical device of any one of further clauses 1 to 25, wherein the objective lens array comprises an additional array of detectors.

Further Clause 27: The charged particle-optical device of either one of further clauses 18 or 19, further comprising an additional array of detectors on a down-beam surface of one of the at least two electrodes.

Further Clause 28: The charged particle-optical device of further clause 27, wherein the additional array of detectors is on a down-beam surface of the upper electrode.

Further Clause 29: The charged particle-optical device of any one of further clauses 26 to 28, wherein the additional array of detectors and the up-beam array of detectors are positioned to face each other.

Further Clause 30: The charged particle-optical device of any one of further clauses 26 to 29, wherein a potential of the additional array of detectors relative to a potential of the sample is selected to control detection of the signal particles by the additional array of detectors.

Further Clause 31: The charged particle-optical device of any preceding further clause, wherein a potential of the up-beam array of detectors relative to a potential of the sample is selected to control detection of the signal particles by the up-beam array of detectors.

Further Clause 32: The charged particle-optical device of any preceding further clause, wherein each detector has an aperture defined therein which is aligned with and arranged along primary beam path.

Further Clause 33: The charged particle-optical device of further clause 32, wherein a width of the aperture of the detector is between approximately 10 μm to 100 μm, or preferably between approximately 30 μm to 40 μm.

Further Clause 34: The charged particle-optical device of any preceding further clause, wherein at least one detector is provided as sector portions comprising 2, 3, 4, or more portions.

Further Clause 35: The charged particle-optical device of any preceding further clause, wherein at least one detector is provided as annular portions comprising 2, 3, 4, or more portions.

Further Clause 36: The charged particle-optical device of further clause 35, wherein the detector comprises an inner annular portion surrounding the aperture and an outer annular portion, radially outwards of the inner annular portion.

Further Clause 37: The charge particle-optical device of further clause 36, wherein the width of the first detecting portion is approximately 2 μm to 100 μm and/or the width of the second detecting portion is approximately 10 μm to 150 μm.

Further Clause 38: The charged particle-optical device of any one of the preceding further clauses, wherein the detector is a charge detector, PIN detector or scintillator detector.

Further Clause 39: The charged particle-optical device of any one of further clauses 1-37, wherein the detector is a semiconductor detectors (e.g. PIN detectors) preferably configured to detect backscatter signal particles, wherein detector comprises a detector surface that is down-beam along the primary beam path of the semiconductor detectors that is configured to filter secondary signal particles from incidental charged particles from the sample, preferably the defector surface is positioned so as to face the sample.

Further Clause 40: The charged particle-optical device of any preceding further clause, wherein the objective lens array is configured to accelerate the charged particles along the primary beam paths.

Further Clause 41: The charged particle-optical device of any preceding further clause, wherein the objective lens array is configured to decelerate the charged particles beams along the primary beam paths.

Further Clause 42: The charged particle-optical device of any preceding further clause, wherein defined in each electrode are defined aperture arrays, desirably the objective lens array comprises at least two electrodes in which are defined aperture arrays.

Further Clause 43: The charged particle-optical device of any preceding further clause, wherein each array of detectors comprises a plurality of detector elements around each beam aperture.

Further Clause 44: The charged particle-optical device of any preceding further clause, wherein a voltage supply, or at least one voltage supply, is configured to be electrically connected to one or more of, optionally all of: at least one of the electrodes objective lens array, the up-beam array of detectors and the down-beam array of detectors; and a controller configured to control a potential applied by the voltage supply (or at least one voltage supply) to at least one of the: the at least one electrode of the objective lens array, the up-beam array of detectors and the down-beam array of detectors.

Further Clause 45: A charged particle-optical device for a charged particle system, the device being configured to project an array of beams of charged particles along primary beam paths towards a sample, the device comprising: an objective lens array configured to project the beams onto the sample and comprising at least one electrode; and a down-beam array of detectors positioned down-beam along the primary beam paths of the at least one electrode, the detector array comprising an array of semiconductor detectors (e.g. PIN detectors) preferably configured to detect backscatter signal particles, wherein the down-beam array of detectors comprises a detector surface that is down-beam along the primary beam path of the semiconductor detectors that is configured to filter secondary signal particles from incidental charged particles from the sample, preferably the detector surface is positioned so as to face the sample.

Further Clause 46: A method of projecting an array of beams of charged particles onto a sample so as to detect signal particles emitted from the sample, the method comprising: a) projecting the beams along primary beam paths onto a surface of the sample; and b) detecting the signal particles emitted from the sample simultaneously at an up-beam array of detectors up-beam along the primary beam paths of at least one electrode of an objective lens array and at a down-beam array of detectors down-beam along the primary beam paths of at least one electrode of an objective lens array.

Further Clause 47: The method of further clause 46, wherein the up-beam array of detectors is arranged along the primary beam paths and is configured to face up-beam of the primary beam path away from the sample.

Further Clause 48: A method of projecting an array of beams of charged particles onto a sample so as to detect signal particles emitted from the sample, the method comprising: a) projecting the beams along primary beam paths onto a surface of the sample; and b) detecting the signal particles emitted from the sample at an array of detectors arranged along the primary beam paths and facing up-beam of the primary beam paths away from the sample.

Further Clause 49: The method of further clause 48, further comprising detecting signal particles emitted from the sample simultaneously at the array of detectors and at a down-beam array of detectors, wherein the array of detectors is an up-beam array of detectors positioned up-beam along the primary beam paths of an electrode of an objective lens array and the down-beam array of detectors is positioned down-beam along the primary beam paths of the at least one electrode.

Further Clause 50: The method of any one of further clauses 46, 47 and 49, further comprising repelling signal particles emitted from the sample that have an energy less than a threshold and wherein the repelling uses at the least the down-beam array of detectors.

Further Clause 51: The method of any one of further clauses 46 to 49, further comprising repelling signal particles emitted from the sample that have an energy less than a threshold.

Further Clause 52: The method of either one of further clauses 47 or 48, wherein the threshold exceeds an energy of a secondary signal particle emanating from the sample.

Further Clause 53: The method of any one of further clauses 46 to 52, wherein the projecting comprises accelerating the charged particle beams in the objective lens array.

Further Clause 54: The method of any one of further clauses 46 to 52, wherein the projecting comprises decelerating the charged particle beams in the objective lens array.

Further Clause 55: The method of any one of further clauses 46 to 54, wherein the detecting comprises detecting signal particles of different energies and/or different angular trajectories using different detector arrays, preferably at least two of the up-beam array of detectors, the down-beam array of detectors and/or an additional array of detectors.

Further Clause 56: The method of further clause 55, wherein at least one of the detector arrays comprising detectors each having a plurality of portions.

Further Clause 57: A method of detecting charged particles emitted from a sample using a multi-beam charged particle assessment tool comprising the charged particle-optical device of any one of further clauses 1 to 44 or 45.

The invention claimed is:

1. A charged particle-optical device for a charged particle system, the device being configured to project an array of beams of charged particles along primary beam paths towards a sample, the device comprising:

an objective lens array configured to project the beams onto a sample and comprising at least two electrodes along primary beam paths of an array of beams of charged particles;

an up-beam array of detectors positioned up-beam of at least one electrode along the primary beam paths of the at least two electrodes;

a down-beam array of detectors positioned down-beam of the at least one electrode along the primary beam paths;

at least one voltage supply configured to be electrically connected to one or more of the objective lens array, the up-beam array of detectors and the down-beam array of detectors; and a controller configured to control a potential applied by the at least one voltage supply to the at least one electrode of the objective lens array, the up-beam array of detectors and the down-beam array of detectors, wherein the up-beam array of detectors and the down-beam array of detectors are configured simultaneously to detect signal particles.

2. The charged particle-optical device of claim 1, wherein the up-beam array of detectors is configured to face up-beam of the primary beam paths away from the sample.

3. The charged particle-optical device of claim 1, wherein the down-beam array of detectors is positioned down-beam of the objective lens array and facing the sample in use.

4. The charged particle-optical device of claim 1, wherein a potential of the down-beam array of detectors relative to a potential of the sample is selected to control detection of the signal particles by the down-beam array of detectors.

5. The charged particle-optical device of claim 4, wherein controlling detection of the signal particles is based on at least one of an energy range of the signal particles or an angular trajectory of the signal particles from the sample with respect to the respective primary beam paths.

6. The charged particle-optical device of claim 1, wherein the controller is configured to control the potential to repel secondary signal particles emitted from the sample away from the down-beam array of detectors.

7. The charged particle-optical device of claim 1, wherein the position of the down-beam array of detectors relative to the sample is selected to control detection of secondary signal particles by at least one of the down-beam array of detectors or the up-beam array of detectors.

8. The charged particle-optical device of claim 1, wherein the at least two electrodes include aperture arrays comprising a plurality of apertures, corresponding apertures in the at least two electrodes are aligned with and arranged along a primary beam path, the at least two electrodes comprise an upper electrode and a lower electrode, and the upper electrode is up-beam of the lower electrode along the primary beam path.

9. The charged particle-optical device of claim 8 wherein the down-beam array of detectors is associated with the lower electrode.

10. The charged particle-optical device of claim 8, wherein the down-beam array of detectors is associated with a down-beam surface of the lower electrode.

11. The charged particle-optical device of claim 8, wherein the up-beam array of detectors is associated with an up-beam surface of the lower electrode of the objective lens array.

12. The charged particle-optical device of claim 8, wherein the up-beam array of detectors is associated with a down beam surface of one of the at least two electrodes of the objective lens array.

13. The charged particle-optical device of claim 1, wherein each array of detectors comprises a plurality of detector elements around each beam aperture.

14. The charged particle-optical device of claim 1, wherein the up-beam array of detectors includes mirror detectors.

15. The charged particle-optical device of claim 1, wherein the up-beam array of detectors include one of PiN detectors or scintillator detectors.

16. A method of detecting charged particles emitted from a sample using a multi-beam charged particle assessment tool, the method comprising:

projecting, using an objective lens array comprising at least two electrodes, an array of beams of charged particles along primary beam paths towards a sample;

positioning an up-beam array of detectors up-beam of at least one electrode of the objective lens array along the primary beam paths of the at least two electrodes;

positioning a down-beam array of detectors down-beam of the at least one electrode along the primary beam paths;

electrically connecting at least one voltage supply to one or more of the objective lens array, the up-beam array of detectors and the down-beam array of detectors;

controlling, using a controller, a potential applied by the at least one voltage supply to the at least one electrode of the objective lens array, the up-beam array of detectors and the down-beam array of detectors; and detecting signal particles simultaneously by the up-beam array of detectors and the down-beam array of detectors.

17. The method of claim 16, further comprising selecting a potential of the down-beam array of detectors relative to a potential of the sample to control detection of the signal particles by the down-beam array of detectors.

18. The method of claim 16, further comprising repelling secondary signal particles emitted from the sample away from the down-beam array of detectors, the secondary signal particles having an energy level less than a threshold energy level.

19. The method of claim 18, wherein the threshold energy level exceeds an energy level of a secondary charged particle emanating from the sample.

20. The method of claim 18, further comprising selecting one of a backscatter mode for detecting more backscatter charged particles than secondary charged particles or a secondary mode for detecting more secondary charged particles than backscatter charged particles.

* * * * *